United States Patent [19]

Hayashi et al.

[11] Patent Number: 5,485,246
[45] Date of Patent: Jan. 16, 1996

[54] CONTROL DEVICE FOR COLLECTIVELY SUPERVISING A PLURALITY OF IMAGE FORMING APPARATUSES

[75] Inventors: Masayuki Hayashi; Yoshihiro Mitekura; Koichi Kanaya, all of Yokohama; Masato Terao, Tokyo; Toshiya Tagawa, Ichikawa; Nobuaki Tomidokoro, Sagamihara; Masahiro Kitayama, Kawasaki; Osamu Kizaki, Asaka; Yasuo Kawada, Kawasaki; Kazuyuki Nakahara, Tokyo; Tomofumi Harada, Yokohama; Yasunari Hashimoto, Tokyo, all of Japan

[73] Assignee: Ricoh Company, Ltd., Tokyo, Japan

[21] Appl. No.: 345,796

[22] Filed: Nov. 22, 1994

Related U.S. Application Data

[63] Continuation of Ser. No. 69,350, May 28, 1993, abandoned.

[30] Foreign Application Priority Data

| | | | |
|---|---|---|---|
| May 28, 1992 | [JP] | Japan | 4-137128 |
| May 28, 1992 | [JP] | Japan | 4-137130 |
| Nov. 30, 1992 | [JP] | Japan | 4-321045 |
| Dec. 18, 1992 | [JP] | Japan | 4-339147 |
| Mar. 15, 1993 | [JP] | Japan | 5-053542 |

[51] Int. Cl.$^6$ .................................................. G03G 21/00
[52] U.S. Cl. .............. 355/202; 340/825.06; 340/825.15; 355/204; 379/106
[58] Field of Search ............................ 355/202–206, 355/208; 364/550; 340/825.06–825.08, 825.15; 379/92, 102, 106; 371/16.4

[56] References Cited

U.S. PATENT DOCUMENTS

| | | | |
|---|---|---|---|
| 4,497,037 | 1/1985 | Kato et al. ......................... 355/202 X |
| 4,583,834 | 4/1986 | Seko et al. ............................ 355/206 |
| 4,893,248 | 1/1990 | Pitts et al. ........................... 364/550 X |
| 5,084,875 | 1/1992 | Weinberger et al. .............. 371/16.4 X |
| 5,193,111 | 3/1993 | Matty et al. .......................... 379/106 |
| 5,359,391 | 10/1994 | Kuroyanagi et al. .................. 355/204 |

FOREIGN PATENT DOCUMENTS

| | | | |
|---|---|---|---|
| 59-142559 | 8/1984 | Japan . | |
| 2-265396 | 10/1990 | Japan . | |
| 3-226768 | 10/1991 | Japan . | |
| 4-70768 | 3/1992 | Japan . | |
| 4-102868 | 4/1992 | Japan . | |
| 4-318731 | 11/1992 | Japan . | |
| 4-318858 | 11/1992 | Japan | 355/202 |
| 4-318863 | 11/1992 | Japan | 355/202 |
| 4-318864 | 11/1992 | Japan | 355/202 |
| 4-318866 | 11/1992 | Japan | 355/202 |
| 4-318867 | 11/1992 | Japan | 355/202 |

*Primary Examiner*—William J. Royer
*Attorney, Agent, or Firm*—Oblon, Spivak, McClelland, Maier & Neustadt

[57] ABSTRACT

A control system for collectively supervising a plurality of copiers or similar image forming apparatuses connected to a control device by communication lines with or without the intermediary of communication control units. To down-load data relating to image formation, the control device determines whether or not a copier of interest is an inoperative state and, if it is in an inoperative state, automatically sends the the copier via a telephone line, an exchange, and a communication control unit. This data is written to a storing device built in the copier. To up-load data relating to image formation, the control device causes each copier automatically send the data stored in the storing device thereof and stores the data in a memory thereof. Up-loading is effected at an optimal time other than the time when the copier is performing an automatic adjustment, in use, or quite likely to be used.

48 Claims, 74 Drawing Sheets

Fig. 1
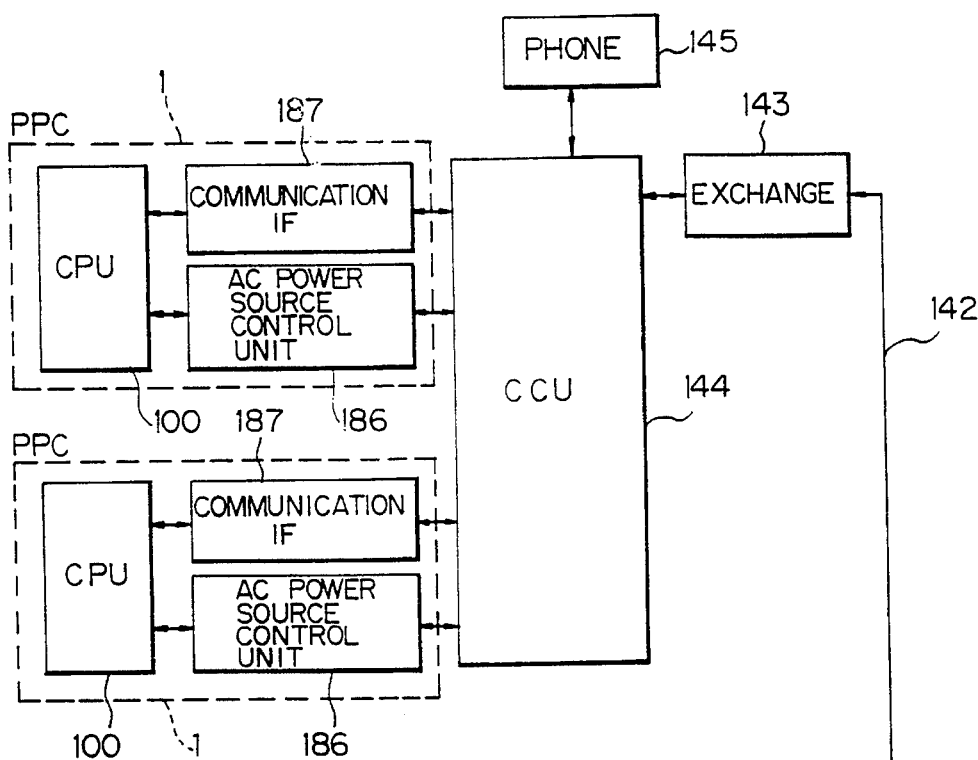
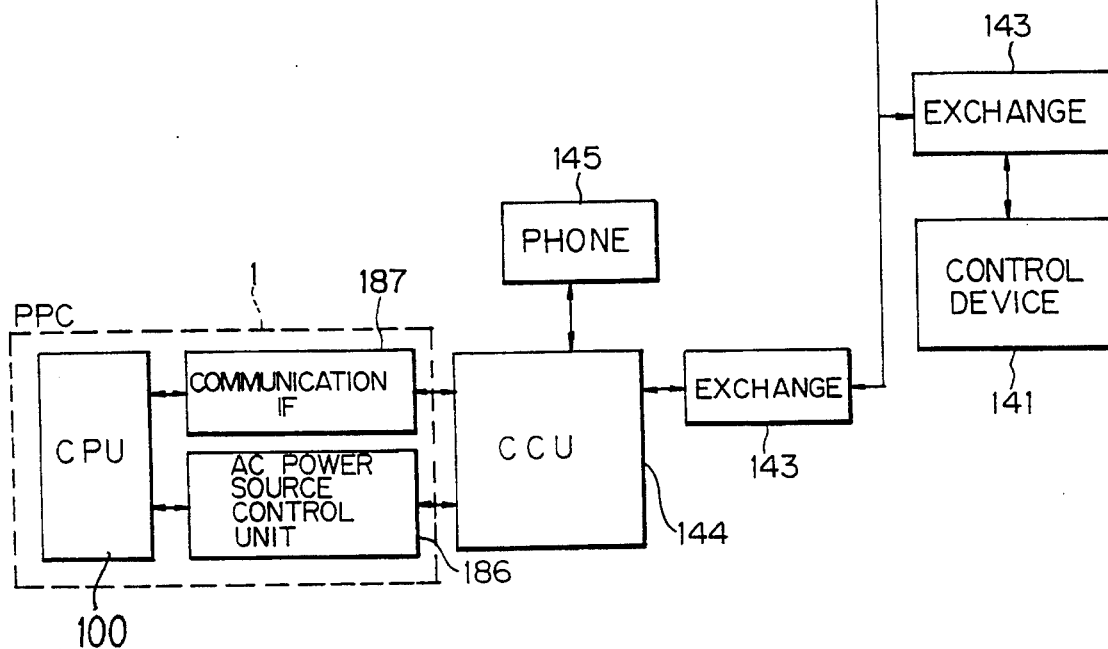

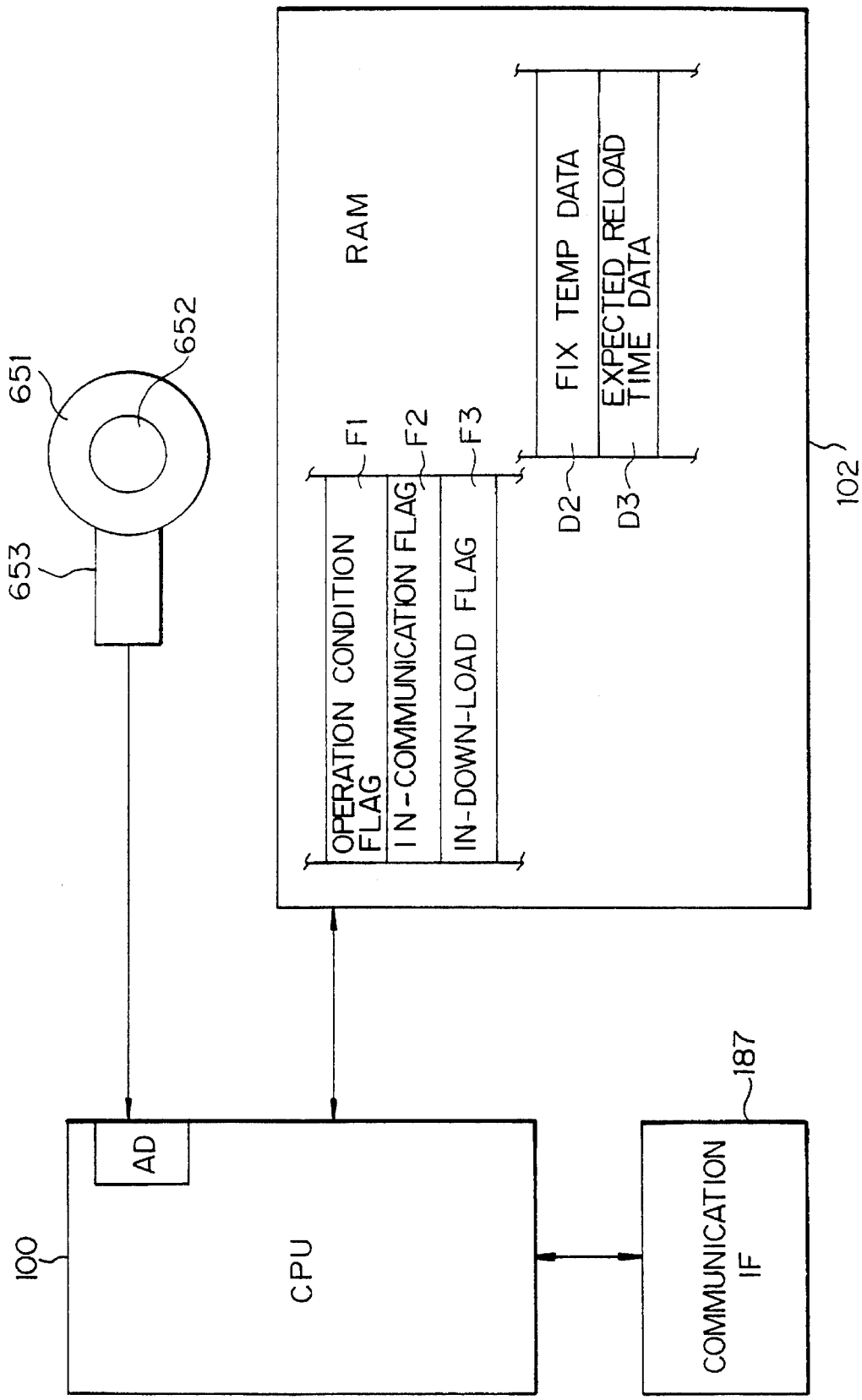

Fig. 20

| INFORMATION CODE | CONTENT | NUMBER OF DATA |
|---|---|---|
| 1100 0001 0000 | TRANSMITTED INITIAL DATA | 1 |
| 1407 0001 0101 | OPERATION TIME | 4 |
| 5105 0008 0101 | MUTE BUZZER | 1 |
| 5101 0013 0101 | DECREMENT COPY COUNTER | 1 |
| 5105 3020 0101 | SET WEEKLY TIMER : YEAR | 2 |
| 0201 | : MONTH | 2 |
| 0301 | : DAY | 2 |
| 0401 | : HOUR | 2 |
| 0501 | : MINUTE | 2 |
| 3100 0007 0101 | DELIVERY ALARM | 12 |
| 3100 0008 0101 | MEMORY CLEAR ALARM | 12 |
| 3100 0009 0101 | COPY END ALARM | 12 |

Fig. 21A

| LEVEL | 1 | 2 | 3 | | 4 | | | 5 | | 6 | |
|---|---|---|---|---|---|---|---|---|---|---|---|
| BYTE | 1 | 2 | 3 | 4 | 5 | 6 | 7 | 8 | 9 | 10 | 11 |

Fig. 21B

| 1ST | 2ND | CONTENT |
|---|---|---|
| 1 | 1 | STATUS DATA |
| | 2 | HISTORY DATA (JAM) |
| | 3 | HISTORY DATA (NUMBER OF COPIES) |
| | 4 | HISTORY DATA (OPERATION TIME) |
| | 5 | HISTORY DATA (ERROR) |
| | 6 | FUNCTION DATA |
| | 7 | DIVISION-BASED COPY |
| | 8 | OTHERS |
| 3 | 1 | ALARM |
| | 2 | ERROR |
| 5 | 1 | WRITE AND READ (DATA) |
| | 2 | WRITE ALL DATA (DATA) |
| | 3 | READ ALL DATA (DATA) |
| 7 | 1 | EXECUTE |
| 8 | 1 | READ & WRITE OPTICS CONTROL PROGRAM |
| 9 | 1 | READ & WRITE PROGRAM |

Fig. 22A

| 3RD | CONTENT |
|---|---|
| 00 | CLASS |
| 01 | FEED, TRANSPORT & FIX |
| 02 | DRUM |
| 03 | PROCESS CONTROL |
| 04 | OPTICS, READ |
| 05 | OPERATION MODE SYSTEM |
| 06 | PERIPHERAL UNITS |
| 07 | LOGGING DATA |
| 08 | PAST LOGGING DATA |

Fig. 22B

SUBCLASSES OF 3RD LEVEL

E.G. 4TH LEVEL WHEN 3RD LEVEL IS 02
- 001~099 CHARGE
- 101~199 LATENT IMAGE WRITE SYSTEM
- 201~299 DEVELOP
- 301~399 TRANSFER
- 401~499 SEPARATE
- 501~599 CLEAN
- 601~699 DISCHARGE

Fig. 22C

FURTHER SUBCLASSES OF 3RD LEVEL AND USING SERIAL NUMBERS 01~99

Fig. 22D

INDICATIVE OF TYPES 01~99
00  UNABLE TO USE
01  FT4060
02

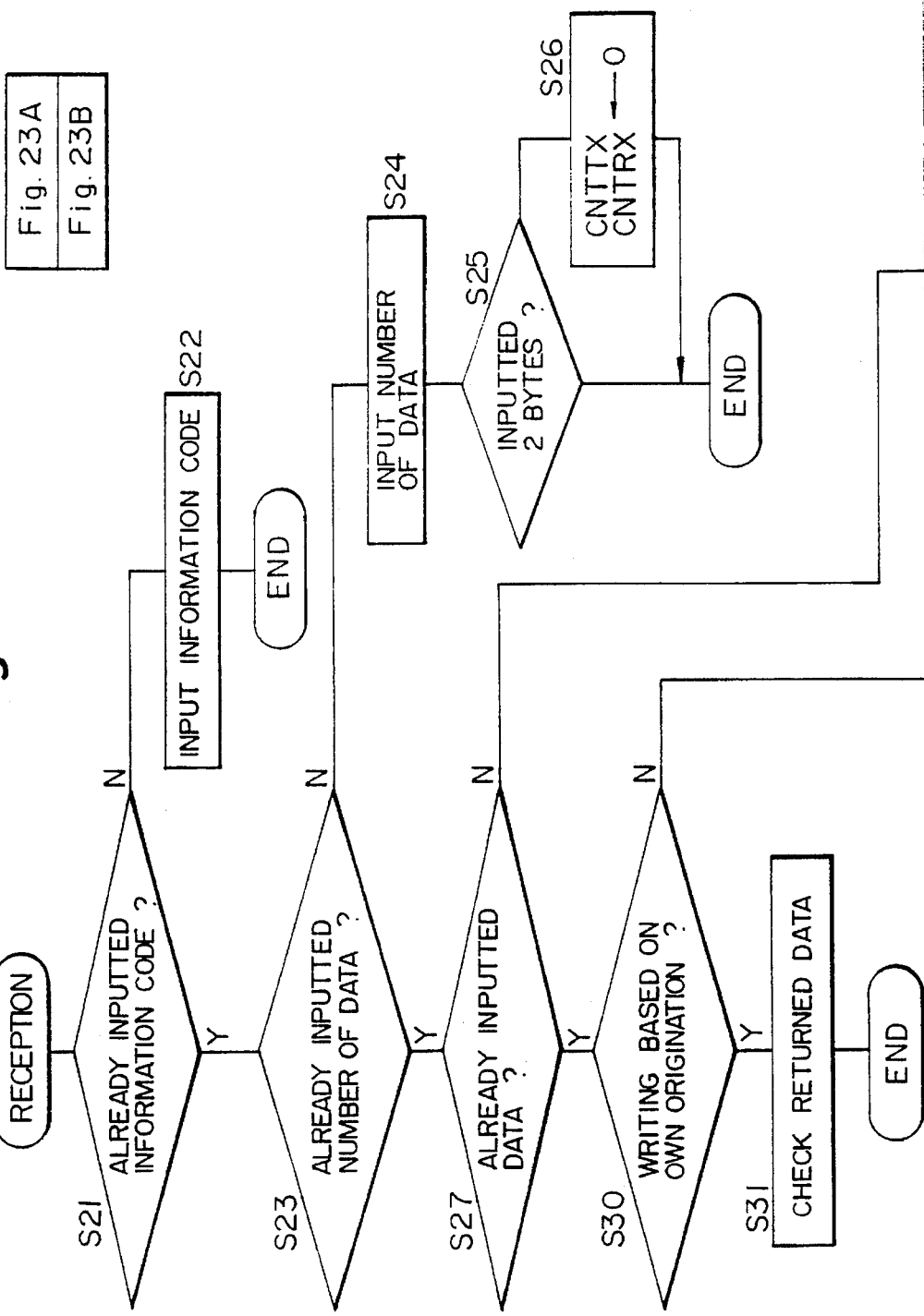

Fig. 26

```
COPIER CONTROL MENU

1. USER REGISTRATION
2. CONTROL DATA REGISTRATION
3. INITIAL CODE REGISTRATION
```

Fig. 27

```
REGISTERED USERS

1. A COPY SERVICE ;37771234;FT4060;123456
2. B KOGYO          ;37771235;FT4060;123457
```

Fig. 28

```
USER REGISTRATION

INPUT REGISTER NUMBER

CONTROL DATA REGISTRATION

END REGISTRATION ? (Y/N)

INITIAL MODE REGISTRATION

INPUT USER'S NAME

INITIAL MODE REGISTRATION

INPUT INFORMATION CODE

```
TBDFDT:  DW   DBBIAS        ; BIAS DATA ADDRESS

DB   80H           ; BIAS DATA

DW   DBCAHG        ; MAIN CHARGE DATA ADDRESS

DB   81H           ; MAIN CHARGE DATA

. . .

. . .

TBDFFD:
```

Fig. 45

|              | SET/DETECTED VALUE |
|--------------|--------------------|
| BUZZER       | OFF                |
| COPY COUNTER | DECREMENT          |
| Vsp          | 0.3V               |
| Vsg          | 3.9V               |
| VL           | 200V               |
| VD           | 450V               |
| VR           | 30V                |
| VDE          | 3.5V               |

Fig. 46

```
TBJCD:  DB   31H,31H,30H,30H,30H,30H,31H,30H,30H,30H,30H    ;INFORMATION CODE
        DB   30H,31H              ;NUMBER OF DATA
        DW   DCSSDF               ;DATA ADDRESS (INITIAL DATA SENT)
        DB   31H,34H,30H,30H,37H,30H,30H,31H,30H,30H,31H    ;
        DB   30H,34H              ;NUMBER OF DATA
        DW   DONTM1               ;DATA ADDRESS (OPERATION TIME)
         .    .
         .    .
         .    .
TBJCED:
```

Fig. 66A

| | CONTENT OF PARAMETER | | DATA LENGTH |
|---|---|---|---|
| COPIER OF ADDRESS 1 | TYPE NO. | | 6 |
| | SERIAL NO. | | 10 |
| | CHECK SUM OF ABOVE | | 4 |
| COPIER OF ADDRESS 2 | TYPE NO. | | 6 |
| | SERIAL NO. | | 10 |
| | CHECK SUM OF ABOVE | | 4 |
| COPIER OF ADDRESS 3 | TYPE NO. | | 6 |
| | SERIAL NO. | | 10 |
| | CHECK SUM OF ABOVE | | 4 |
| COPIER OF ADDRESS 4 | TYPE NO. | | 6 |
| | SERIAL NO | | 10 |
| | CHECK SUM OF ABOVE | | 4 |
| COPIER OF ADDRESS 5 | TYPE NO. | | 6 |
| | SERIAL NO. | | 10 |
| | CHECK SUM OF ABOVE | | 4 |
| | PHONE NO. OF DESTINATION | | 32 |
| | FREQUENCY OF REDIALLING | | 2 |
| | INTERVAL OF REDIALLING | | 3 |
| REMOTE INFORM DUE TO REMOTE INFORM KEY | PERMISSION/INHIBITION OF DATA TRANSMISSION N DURING REPORT TO CONTROL DEVICE | FREQUENCY OF JAM | 1 |
| | | FREQUENCY OF SELF-DIAGNOSIS | 1 |
| | | NUMBER OF COPIES | 1 |
| | | COPIER CONDITION | 1 |
| | CHECK SUM OF ABOVE | | 4 |

Fig. 66B

| | | | |
|---|---|---|---|
| REMOTE INFORM DUE TO SELF-DIAGNOSISS | PHONE NO. OF DESTINATION | | 32 |
| | FREQUENCY OF REDIALLING | | 2 |
| | INTERVAL OF REDIALLING | | 3 |
| | PERMISSION/INHIBITION OF DATA TRANSMISSION N DURING REPORT TO CONTROL DEVICE | FREQUENCY OF JAM | 1 |
| | | FREQUENCY OF SELF-DIAGNOSIS | 1 |
| | | NUMBER OF COPIES | 1 |
| | | COPIER CONDITION | 1 |
| | CHECK SUM OF ABOVE | | 4 |
| REMOTE INFORM DUE TO PRECAUTION | PHONE NO. OF DESTINATION | | 32 |
| | FREQUENCY OF REDIALLING | | 2 |
| | INTERVAL OF REDIALLING | | 3 |
| | PERMISSION/INHIBITION OF DATA TRANSMISSION N DURING REPORT TO CONTROL DEVICE | FREQUENCY OF JAM | 1 |
| | | FREQUENCY OF SELF-DIAGNOSIS | 1 |
| | | NUMBER OF COPIES | 1 |
| | | COPIER CONDITION | 1 |
| | DATA OF REPORT (DAY,HOUR,MINUTE) | | 4 |
| | CHECK SUM OF ABOVE | | 4 |
| AUTO TOTAL COUNTER COMMUNICATION | TOTAL COPY COUNT COLLECTION TIME | | 4 |
| | PHONE NUMBER OF DESTINATION | | 32 |
| | DATA OF REPORT (DAY,HOUR,MINUTE) | | 6 |
| | CHECK SUM OF ABOVE | | 4 |
| TELEPHONE SETTING | DIAL MODE SETTING (PULSE OR TONE) | | 1 |
| | DIAL PULSE INTERVAL SETTING | | 1 |
| | CHECK SUM OF ABOVE | | 4 |

Fig. 67A

| CAUSE CODE | FREQUENCY OF JAM | | | FREQUENCY OF ERROR DETECTED BY SELF-DIAGNOSIS | | | NUMBER OF COPIES | | | CONDITION OF COPIER | | |
|---|---|---|---|---|---|---|---|---|---|---|---|---|
| | TOTAL | POSITION A | POSITION B ... | TOTAL | KIND A | KIND B ... | TOTAL | SIZE A | SIZE B ... | CONDITION A | CONDITION B | CONDITION C ... |

Fig. 67B

| TYPE NO. | SERIAL NO. | CAUSE CODE | FREQUENCY OF ERROR DETECTED BY SELF-DIAGNOSIS | | | CONDITION OF COPIES | | | TIME OCCURRED |
|---|---|---|---|---|---|---|---|---|---|
| | | | TOTAL | KIND A | KIND B ... | CONDITION A | CONDITION B | CONDITION C ... | |

Fig. 67C

| COMMUNICATION RESULT CODE | CONTENT OF RESULT |
|---|---|

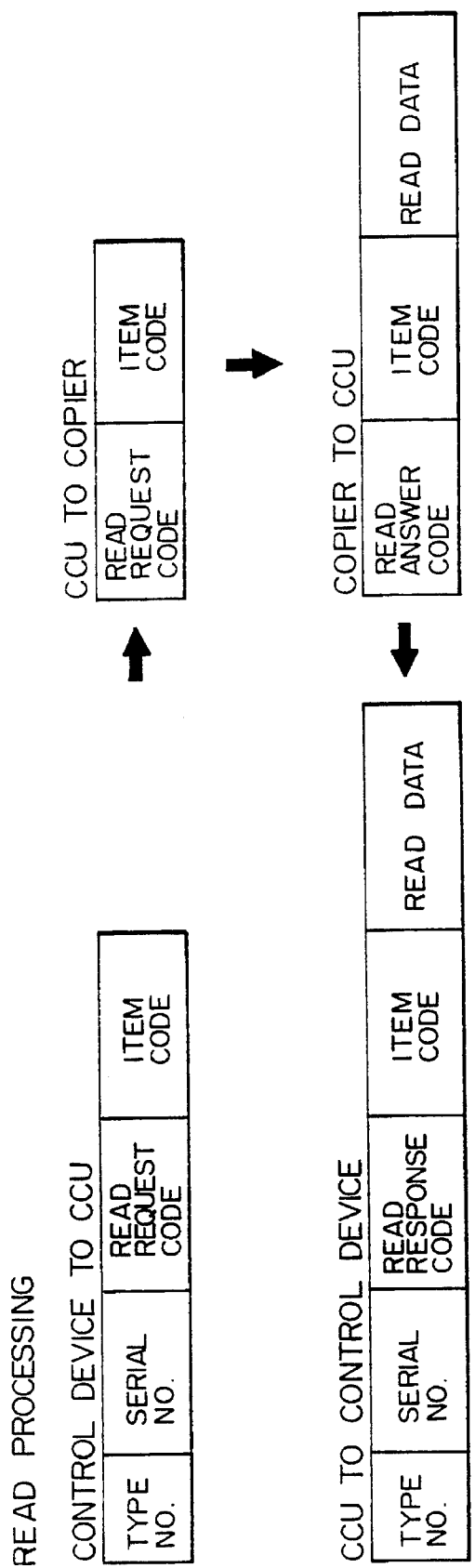

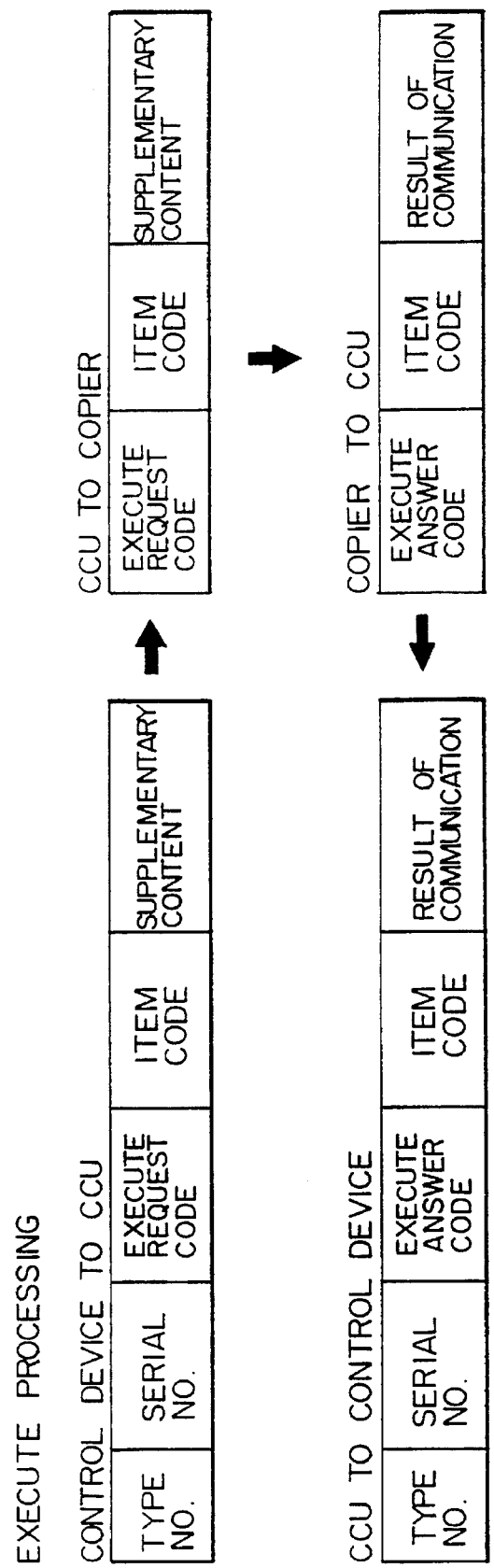

Fig. 71A

READ PROCESSING

ACCESS TO CCU

| CCU CODE | READ REQUEST CODE | ITEM CODE |
|---|---|---|

ANSWER FROM CCU

| CCU CODE | READ ANSWER CODE | ITEM CODE | READ DATA |
|---|---|---|---|

Fig. 71B

WRITING PROCESSING

ACCESS TO CCU

| CCU CODE | WRITE REQUEST CODE | ITEM CODE | DATA TO WRITE |
|---|---|---|---|

ANSWER FROM CCU

| CCU CODE | WRITE ANSWER CODE | ITEM CODE | WRITTEN DATA |
|---|---|---|---|

Fig. 71C

EXECUTE PROCESSING

ACCESS TO CCU

| CCU CODE | EXECUTE REQUEST CODE | ITEM CODE | SUPPLEMENTARY CONTENT |
|---|---|---|---|

ANSWER FROM CCU

| CCU CODE | EXECUTE ANSWER CODE | ITEM CODE | RESULT OF COMMUNICATION |
|---|---|---|---|

ACCESS FROM CCU TO COPIER

| READ REQUEST CODE | ITEM CODE |
|---|---|

ANSWER FROM COPIER TO CCU

| READ ANSWER CODE | ITEM CODE | READ DATA |
|---|---|---|

CONTROL DEVICE FOR COLLECTIVELY SUPERVISING A PLURALITY OF IMAGE FORMING APPARATUSES

This application is a Continuation of application Ser. No. 08/069,350, filed on May 28, 1993, now abandoned.

BACKGROUND OF THE INVENTION

The present invention relates to a control system for collectively supervising a plurality of copiers or similar image forming apparatuses connected to a control device by communication lines with or without the intermediary of communication control units.

In a control system for the above application, copiers or similar image forming apparatuses are connected to a control device located at a service station by telephone lines or similar communication lines, as disclosed in, for example, Japanese Patent Laid-Open Publication Nos. 257155/1990, 259666/1990, and 196053/1991. By collectively controlling the remote image forming apparatuses by the single control device or host machine, it is possible to totalize the conditions in which each apparatus is used and to use the supervisory data for the maintenance of the apparatus. The conditions in which the image forming apparatus is used include the number of copies produced. On the other hand, the contents of maintenance include an automatic call origination to the control device resulted from the self-diagnosis of the image forming apparatus, and the adjustment of various sections of the apparatus executed by an access from the control device. These data can even be sent to, for example, the service station as image data implemented by a facsimile function. In the event of addition or version-up of a program, each image forming apparatus may receive the program from the control device or host machine and writes it therein, or at the time of maintenance the host may send guide data indicative of an operation procedure to the image forming apparatus in matching relation to the operating condition of the apparatus, as also proposed in the past.

Japanese Patent Laid-Open Publication No. 64770/1991, for example, teaches a control system in which a transmitting device is interposed between the communication line and the control device and selectively operable in a communication mode or in another mode. When the control device sends a data send request to a copier, the transmitting device operates in the communication mode only if the copier is not reproducing a document.

Further, assume that the line is busy when an error, for example, is to be sent from the copier to the control device. Then, data representative of the error is held until the line being monitored becomes ready. In case of emergency, a communication under way is forcibly ended by a relay circuit so as to send the emergency to the control device. Moreover, a particular time zone is allocated to each of the checking of the copier and the transmission of data to the host; the latter is effected in a time zone in which the line is not frequently occupied.

It is a common practice with modern copiers to accurately adjust data for image formation copier by copier at the time of shipment, so that each copier may produce attractive images from the beginning when installed at the user's station. Since the data generated at the time of shipment are stored copier by copier, a serviceman can readily readjust the copier by referencing the data in the event of an error or defective image, when data stored in the copier are destroyed, or at the time of replacement of a developer or a photoconductive element. This reduces the load on the serviceman and allows the copier to recover in a short period of time.

When the developer or the photoconductive element is replaced, it is sometimes desirable to restore all the data of the copier to their initial conditions, rather than to readjust the data one by one. In the light of this, a copier having a memory clearing function has also been proposed.

However, the problem with the conventional control sysem is that the serviceman has to down-load the data of the copier from the control device or up-load the data of the copier to the control device. The up-loading and down-loading operations still pose a substantial load on the serviceman. Moreover, since the data cannot be supervised without resorting to manual operations, it is likely that the up-loading procedure is omitted by accident.

A copier with multiple functions available today allows various initial modes to be selectively set up to the user's taste when the power source of the copier is turned on. For example, an arrangement may be made such that while in the standard specifications the first sheet cassette is automatically selected out of a plurality of cassettes on the turn-on of the power source, the second sheet cassette can be selected on an operation panel. Also, a buzzer may be muted, as desired by the user. However, in the conventional control system, a serviceman has to set such conditions by manipulating the operation panel at the time of delivery. This increases the load on the serviceman as the number of functions increases.

The drawback with the copier of the type having a memory clearing function is that since the initial data stored in all the copiers are identical, the serviceman has to readjust necessary data at the cost of time. The serviceman may inquire the service station the initial data generated at the time of delivery or may operate the operation panel to read them out of the control device. Although this may reduce the adjustment time, the load on the serviceman is still heavy. Moreover, since the data cannot be supervised without resorting to manual operations, it is likely that the up-loading procedure is omitted by accident.

Assume the control system of the type setting up a communication mode only when the image forming apparatus is not forming an image, as mentioned earlier. Even with this type of system, it is likely that the data representative of adjusted image forming conditions are destroyed since the system allows the image forming apparatus to communicate with the control device by an interruption when the apparatus automatically adjusting the image forming conditions. The automatic adjustment includes the adjustment of a lamp voltage for reducing the contamination of the background, i.e., automatic VL correction.

When a communication is held between the image forming apparatus and the control device in parallel with the automatic adjustment of image forming conditions, a CPU (Central Processing Unit) built in the apparatus is driven hard, lowering the processing speed. Although such a problem may be eliminated if the control method is complicated, this cannot be done unless the software is changed, resulting in an increase cost.

Assume that the control device generates a communication request while the automatic adjustment of image forming conditions is under way, and priority is given to communication by interrupting the adjustment. Then, after the communication, the adjustment interrupted halfway has to be executed all over again. This forces the operator to await the end of the automatic adjustment, wasting additional several minutes. Further, if the image forming apparatus begins to communicate with the control device when a person intends to use the apparatus, the person has to wait until the communication ends.

Assume that the image forming apparatus communicates with the control device when user-oriented special modes are being set on the apparatus. Then, when data is rewritten by communication processing, the modes being set are sometimes invalidated. For example, when a data rewrite communication for cancelling an automatic sheet select mode is effected while a program mode (special mode) including an automatic sheet select mode is being entered, the mode being entered is invalidated due to the difference in sheet select mode. In such a case, the mode has to be set all over again after the communication, preventing the apparatus from being used just after the communication.

In the control system wherein a number of copiers or similar image forming apparatuses are connected to a control device located at, for example, a service station by communication control units or data terminals and telephone lines or similar communication lines, the communication control units usually associated with the image forming apparatuses each controls the communication with the control device. When the communicable condition of the image forming apparatus and communication control unit changes, e.g., when a change from a connected state to a disconnected state occurs, the apparatus detects an error, generates a serviceman call, and stops the operation. Although a change from the disconnected state to the connected state may occur while the operation of the apparatus is stopped, the apparatus does not become usable unless manipulated by a serviceman. This type of system, therefore, cannot adopt an expedient in response to a change in the connection condition of the apparatus and communication control unit, so that the operation efficiency available with the system is limited.

SUMMARY OF THE INVENTION

It is therefore an object of the present invention to provide a control system for an image forming apparatus which reduces the load on a serviceman and eliminates erroneous operations in the event of down-loading data relating to image formation from a control device to the image forming apparatus or up-loading data from the latter to the former.

It is another object of the present invention to provide a control system for an image forming apparatus which a allows person to use the apparatus without waiting a long time.

It is another object of the present invention to provide a control device for an image forming apparatus which is efficiently operable in response to a change in the connection condition of the apparatus and a communication control unit.

In accordance with the present invention, in a control system for controlling at least one image forming apparatus connected to a control device by a communication line, the image forming apparatus comprises first communicating means for communicating with the control device, storing means for storing data relating to image formation, and a timepiece for setting an operative state or an inoperative state of at least part of the image forming apparatus in terms of time. The control device comprises second communicating means communicating with the image forming apparatus, and rewriting means for reading the state of the timepiece and rewriting data stored in the storing means when the part of the image forming apparatus is in the inoperative state.

Also, in accordance with the present invention, in a control system for controlling at least one image forming apparatus connected to a control device by a communication line, the image forming apparatus comprises first communicating means for communicating with the control device, storing means for storing data relating to image formation, and waiting means for setting a waiting the image forming apparatus is unable to operate. The control device comprises second communicating means for communicating with the image forming apparatus, and rewriting means for reading the state of the image forming apparatus and, if the image forming apparatus is in the waiting state, rewriting the data stored in the storing means.

Also, in accordance with the present invention, in a control system for controlling at least one image forming apparatus connected to a control device by a communication line, the image forming apparatus comprises first communicating means for communicating with the control device, first storing means for storing data relating to image formation, and deciding means for determining the state of the image forming apparatus. The control device comprises second communicating means for communicating with the image forming apparatus, second storing means for storing data relating to image formation, and transmitting means for sending the data stored in the second storing means to the image forming apparatus via the second communicating means on the basis of the result of decision made by the deciding means.

Also, in accordance with the present invention, in a control system for controlling at least one image forming apparatus connected to a control device by a communication line, the image forming apparatus comprises first communicating means for communicating with the control device, first storing means for storing data relating to formation, and object sensing means for sensing an object present at a side where the image forming apparatus is to be manipulated. The control device comprises second communicating means for communicating with the image forming apparatus, second storing means for storing data relating to image formation, transmitting means for transmitting the data stored in the second storing image forming apparatus via the second communicating means, and inhibiting means for inhibiting the transmitting means from operating when the object sensing means senses an object.

Also, in accordance with the present invention, in a control system for controlling at least one image forming apparatus connected to a control device by a communication line, the image forming apparatus comprising first communicating means for communicating with the control device, and first storing means for storing data relating to image formation. The control device comprises second communicating means for communicating with the image forming apparatus, second storing means for storing data relating to image formation of the apparatus, and control means for reading the data out of the first storing means apparatus to determine whether or not the apparatus has just been delivered to the user's station and causing, when the apparatus has just been delivered, the second storing means to store the data read out of the first storing means.

Also, in accordance with the present invention, in a control system for controlling at least one image forming apparatus connected to a control device by a communication line the image forming apparatus comprises first communicating means for communicating with the control device, first storing means for storing data relating to formation, and means for reading the data out of the first storing means to determine whether or not the apparatus has just been delivered to the user's station and, if the apparatus has just been delivered, sending a delivery signal to the control device. The control device comprises second communicating means for communicating with the image forming apparatus, second storing means for storing data relating to image formation of the apparatus, and control means for reading, on receiving the delivery signal, the data out of said first storing means of the apparatus and storing the data in the second storing means.

Also, in accordance with the present invention, in a control system for controlling at least one image forming apparatus connected to a control device by a communication line, the image forming apparatus comprises first communicating means for communicating with the control device, first storing means for storing data relating to formation, and means for storing data relating to image storing means to determine whether or not the apparatus has just been delivered to the user's station and, if the apparatus has just been delivered, sending a delivery signal and the data read out of the first storing means to the control device. The control device comprises second communicating means for communicating with the image forming apparatus, second storing means for storing data relating to image formation, and control means for storing, on receiving the delivery signal, the data relating to image formation and sent from the apparatus in the second storing means.

Also, in accordance with the present invention, in a control system for controlling at least one image forming apparatus connected to a control device by a communication line, the image forming apparatus comprising first communicating means for communicating with the control device, and first storing means for storing data relating to image formation. The control device comprises second communicating means for communicating with the image forming apparatus, second storing means for storing data relating to image formation of the apparatus, and means for reading the data out of the first storing means of the apparatus to determine whether or not the image forming apparatus has just been delivered to the user's station and, if the apparatus has just been delivered, reading the the data out of the second storing means to thereby rewrite the data of the first storing means.

Also, in accordance with the present invention, in a control system for controlling at least one image forming apparatus connected to a control device by a communication line, the image forming apparatus comprises first communicating means for communicating with the control device, first storing means for storing data relating to image formation, and means for clearing the data of the first storing means and sending clear data to the control device. The control device comprises second communicating means for communicating with the image forming apparatus, second storing means for storing data relating to image forming apparatus, the apparatus, and means for reading, on receiving the clear data, the data out of the second storing means and storing the data in the first storing means.

Also, in accordance with the present invention, in a control system for controlling at least one image forming apparatus connected to a control device by a communication line, the image forming apparatus comprises automatic adjusting means for automatically adjusting image forming conditions, and inhibiting means for inhibiting, if the apparatus is forming an image or the automatic adjusting means is adjusting image forming conditions when a communication request is received from the control device, the apparatus from communicating with the control device.

Also, in accordance with the present invention, in a control system for controlling at least one image forming apparatus connected to a control device by a communication line, the image forming apparatus comprises a human body sensor for sensing a human body approaching the apparatus, and inhibiting means for inhibiting the apparatus from communicating with the control device when the human body sensor senses a human body.

Further, in accordance with the present invention, in a control system for controlling at least one image forming apparatus connected to a control device by a communication line, the image forming apparatus comprises mode selecting mode registering means for selecting an image forming mode, for registering the image forming mode, and inhibiting means for inhibiting the apparatus from communicating with means the control device when the mode registering means is registering the image forming mode.

Furthermore, in accordance with the present invention, in a control system for controlling at least one image forming apparatus connected to a control device by a communication control unit and a communication line, the image forming apparatus comprises determining means for determining whether or not the image forming apparatus is communicable with the communication control unit.

Moreover, in accordance with the present invention, in a control system for controlling at least one image forming apparatus connected to a control device by a communication control unit and a communication line, the image forming apparatus comprises a communication permit switch for allowing the apparatus to communicate with the communication control unit.

In addition, in accordance with the present invention, in a control system for controlling at least one image forming apparatus connected to a control device by a communication control unit and a communication line, the image forming apparatus comprises determining means for determining whether or not the apparatus is communicable with the communication control unit, a communication permit switch for allowing a communication of the image forming apparatus with the communication control unit, first control means for selectively validating or invalidating a communication of the apparatus and communication control unit in response to data from the determining means and data from the communication permit switch, and second control means for determining whether or not to cause the determining means to determine communication control unit in response to data from the determining means and data from the communication permit switch.

BRIEF DESCRIPTION OF THE DRAWINGS

The above and other objects, features and advantages of the present invention will become more apparent from the following detailed description taken with the accompanging drawings in which:

FIG. 1 is a block diagram schematically showing a control system embodying invention and applicable to an image forming apparatus;

FIG. 18 is a schematic block diagram for describing a down-load interruption preventing operation to occur in the operative condition of the copier;

FIG. 20 is a table listing control codes and data;

FIGS. 21A and 21B show respectively the format of information codes of FIG. 20 and the contents of numerals of first and second levels;

FIGS. 22A and 22D show respectively the contents of numerals of third to sixth levels;

FIGS. 26–38 each shows a particular picture to appear on the display of the control device;

FIG. 44 is a default data table;

FIG. 45 shows set data;

FIG. 46 is a data code table;

FIG. 66(A–B) lists parameters to be set in the communication control unit of FIG. 59;

FIGS. 67A–67C show specific formats of communication data to be sent by remote information;

FIG. 68 shows a specific data format for read which is one of the accesses of the control device to the copier shown in FIG. 60;

FIG. 70 shows a specific data format for execute processing;

FIGS. 71A–71C show specific data formats with which the control device accesses the communication control unit;

FIGS. 77–80 are flowcharts each demonstrating a particular subroutine included in the main routine of FIG. 77;

DESCRIPTION OF THE PREFERRED EMBODIMENTS

Figure 2:
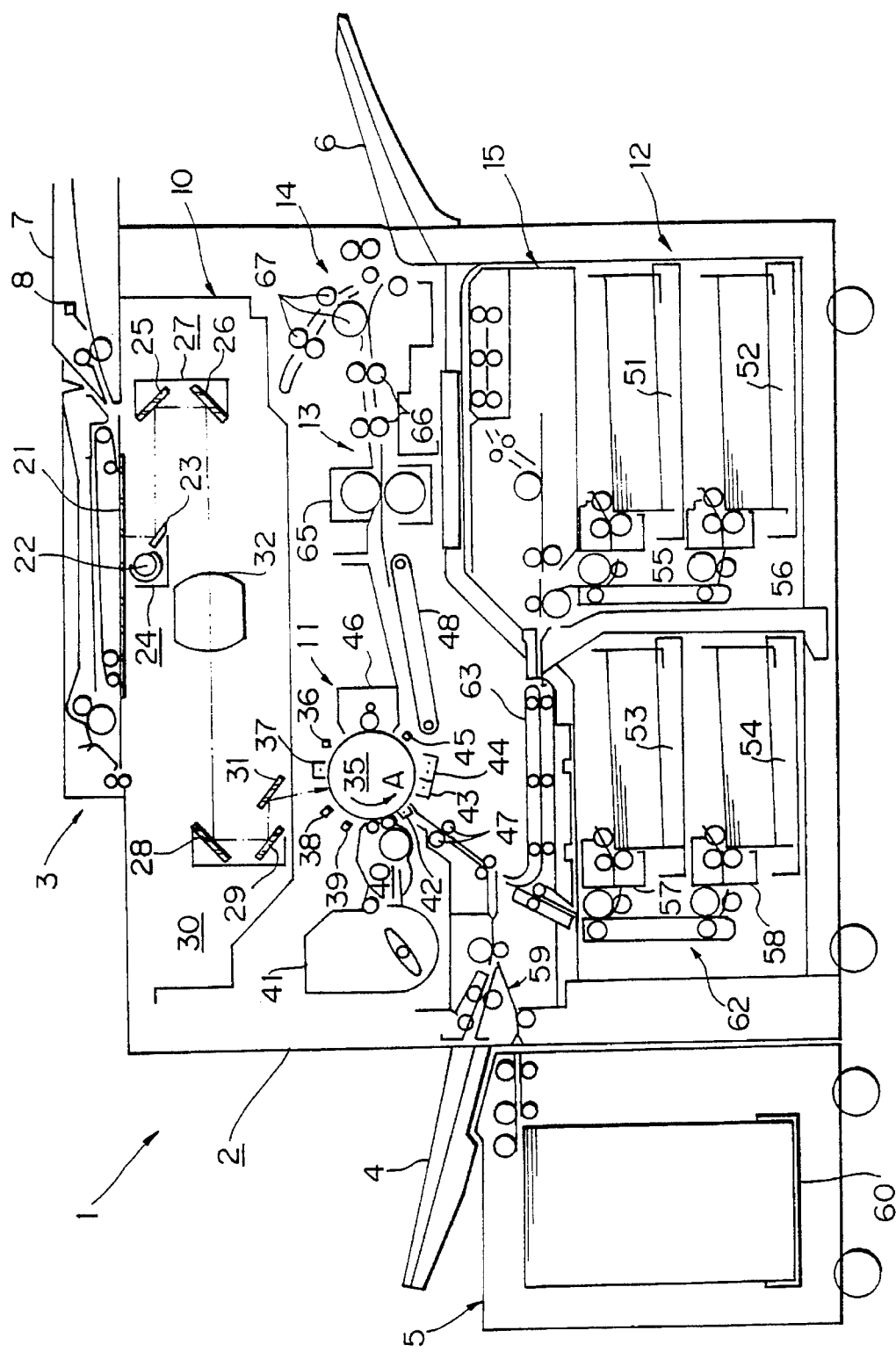
FIG. 2 shows a glass platen included in the copier of FIG. 2 image forming apparatus used in the embodiment.

Referring to FIG. 2, an image forming apparatus to which the present invention is applicable is shown and implemented as an electrophotographic copier operable with plain paper sheets (sometimes abbreviated as PPC hereinafter). As shown, the copier, generally 1, has a body 2, an automatic document feeder (ADF) 3 mounted on the top of the body 2, a manual insertion tray 4 and a mass sheet feeder 5 operatively connected to one side of the body 2, and a copy tray 6 mounted on the other side of the body 2. A document tray 7 is included in the ADF 3 and provided with a document set sensor 8. Accommodated in the copier body 2 are a scanner section 10, an image forming section 11, a sheet feeding section 12, a fixing and discharging section 13, an inverting section 14, a two-sided copy unit 15, etc.

The scanner section 10 is made up of a first scanner 24 having a glass platen 21, a lamp 22 and a first minor 23, a second scanner 27 having a second minor 25 and a third mirror 26, a third scanner 30 having a fourth minor 28 and a fifth minor 29, a sixth minor 31, and a lens 32.

The image forming section 11 includes a photoconductive drum 35. Arranged around the drum 35 are a quenching lamp 36, a main charger 37, an eraser 38, a potential sensor 39, a developing unit 40 to accommodate a toner cartridge 41, a pretransfer charger 42, a transfer charger 43, a separation charger 44, a photosensor or P sensor 45, a cleaning unit 46. A register roller pair 47 is located on a sheet transport path just in front of an image transfer position while a transport belt 48 is arranged behind the transfer position.

In the sheet feeding section 12, a first to a fourth tray 51, 52, 53 and 54 are removably disposed, and each is loaded with paper sheets of particular size. A first to a fourth sheet feed units 55, 56, 57 and 58 are respectively associated with the trays 51–54 for feeding sheets from the tray. Also, a manual insertion/mass feed unit 59 is shared by the m an u al insertion tray 4 and mass sheet feeder 5. A mass sheet feed tray (LCT) 60 is accommodated in the mass sheet feeder 5.

A right, a left and a horizontal transport section 61, 62 and 63, respectively, are provided to transport the sheets selectively fed from the sheet feed units 55–59 and two-sided copy unit 15. A fixing unit 65 and a discharge roller group 66 are arranged in the fixing and discharging section 13 while a turn-over roller group 67 is arranged in the inverting section 14.

In operation, the drum 35 supported by a shaft, not shown, is rotated in a direction indicated by an arrow A in the figure by, for example, a copy command. A document is fed by the ADF 3 to the glass platen 21 and then illuminated by the first scanner 24. The resulting reflection from the document is focused onto the drum 35 via the first mirror 23, second mirror 25, third mirror 26, lens 32, fourth mirror 28, fifth mirror 29, and sixth mirror 31. The drum 35 has been uniformly charged by the main charger 37 beforehand. As a result, the reflection from the document electrostatically forms a corresponding latent image on the drum 35. The eraser 38 illuminates needless portions of the latent image to match it to a paper sheet or a projection image. To reproduce the document image in a x1 magnification, the drum 35 and first scanner 24 are driven at the same speed. The developing unit 40 develops the latent image with a toner to produce a corresponding toner image. At this instant, a potential (bias voltage) may be applied to the developing unit 40 to increase or decrease the density of the image, as desired.

A sheet is fed form any one of the trays 51–54, manual insertion tray 4, mass feed tray 60 and two-sided copy unit 15 by associated one of the sheet feed units 55–59 at a predetermined timing. The sheet is driven along the right transport path 61, left transport path 62 or horizontal transport path 63 to the register roller pair 47 which is held in a halt then. Subsequently, the register roller pair 47 is driven at such a timing that the leading edge of the sheet meets that of the toner image formed on the drum 35. Then, the preretransfer charger 42 and transfer charger 43 transfer the toner image from the drum 35 to the sheet. Since the surface of the drum 35 is extremely smooth, the separation charger 44 lowers the potential and, therefore, the electrostatic adhesion of the sheet.

The sheet carrying the toner image is separated from the drum 35 by a separating member, not shown, and then conveyed to the fixing unit 65 by the transport belt 48. The fixing unit fixes the toner image on the sheet by heat and pressure. Thereafter, the sheet or copy is driven out of the copier to the copy tray 6 by the discharge roller group 66. In a two-sided copy mode, for example, the sheet is once driven into the inverting section 14, turned over, fed to the two-sided copy unit 15, and again fed from the unit 15 toward the image forming section 11. After the image transfer, the cleaning unit 46 removes the toner remaining on the drum 35 with a brush and a cleaning blade thereof, and then the quenching lamp 36 uniformizes the surface potential of the drum 35.

The various timings stated above are controlled by a control circuit, which will be described, mainly on the basis of pulses synchronous to the rotation of the drum 35 or reference pulses for driving the drum 35.

Figure 3:
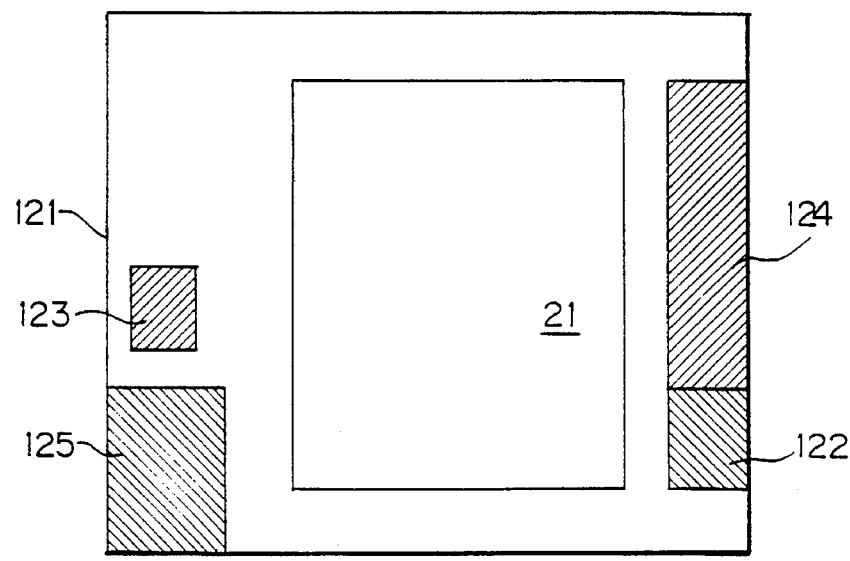
FIG. 3 shows a glass platen included in the copier of FIG. 2 and various patterns adjoining it.

FIG. 3 shows the glass platen 21 and its neighborhood in a plan view. There are shown in the figure, an optical table 121, a photosensor pattern or P sensor pattern 122, an ADS reference pattern 123, a VL pattern 124, and a VD pattern 125. The P sensor pattern 122, ADS reference pattern 123, VL pattern 124 and VD pattern 125 are provided on the underside of the optical table 121.

Figure 4:
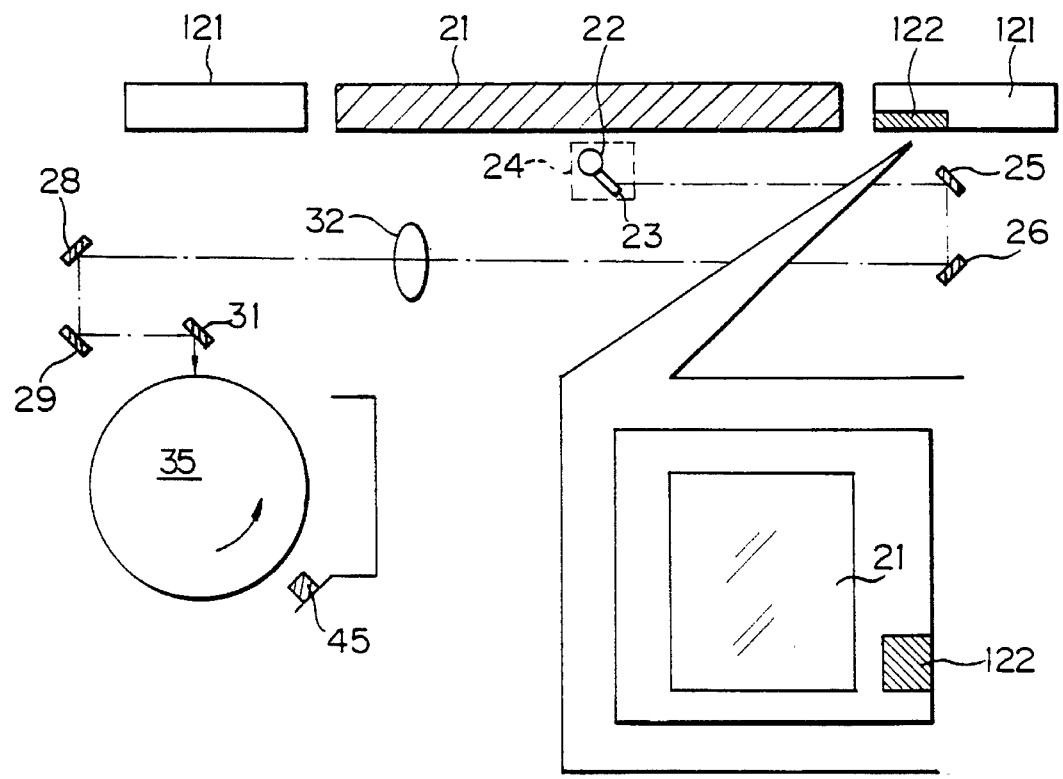
FIG. 4 shows part of the copier of FIG. 2 joining in the control of toner concentration.

A reference will be made to FIG. 4 for describing a toner concentration control procedure particular to the copier 1. To begin with, the first scanner 24 is brought to a position below the P sensor pattern 122. A reflection from the P sen sor pattern 122 is focused onto the surface of the drum 35 having been uniformly charged by the main charger 37.

Figure 5:
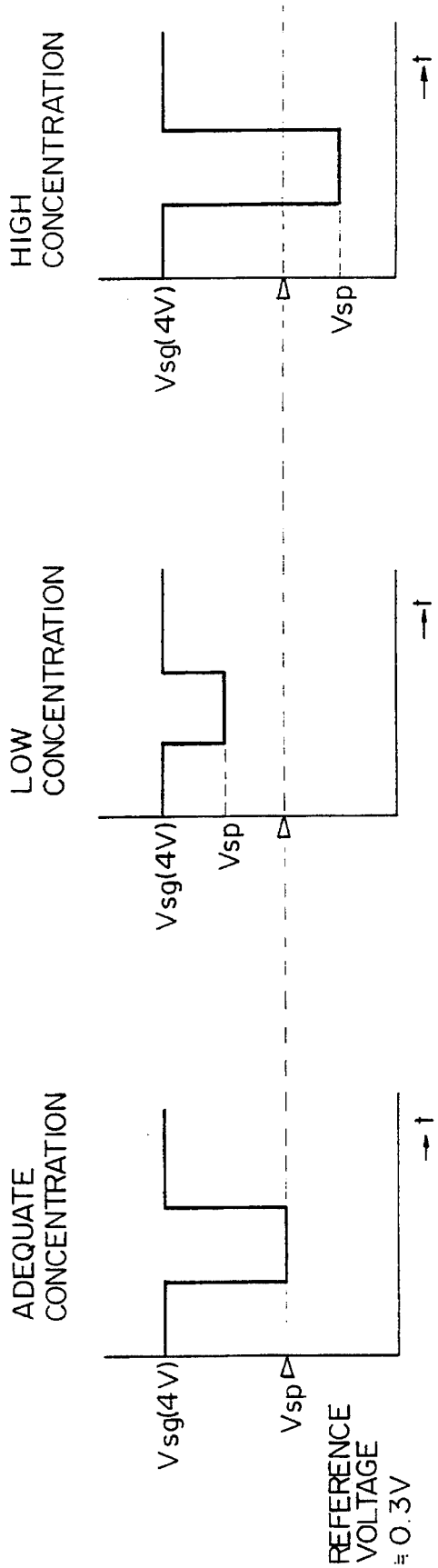
FIG. 5 is a diagram representative of a relation between the output of a photosensor or P sensor included in the copier and representative of a P sensor pattern formed on a photoconductive drum and the output of the sensor representative of the background of the drum.

Then, the developing unit 40 forms a corresponding toner image on the drum 35. The resulting toner image or P sensor toner image is read by the P sensor 45. Assume that the output voltage of the P sensor 45 associated with the P sensor toner image (P sensor output voltage) is Vsp, that the P sensor output voltage associated with the background of the drum 35 is Vsg, that a is value $\frac{1}{13}$Vsg resulted from the comparison of Vsp and Vsg is a reference voltage, and that the toner concentration is adequate when Vsp is the reference voltage. When Vsp system embodying the present greater than $\frac{1}{13}$Vsg, the toner concentration is determined short and a toner is supplemented. FIG. 5 shows such a relation between Vsp and Vsg.

Figure 6:
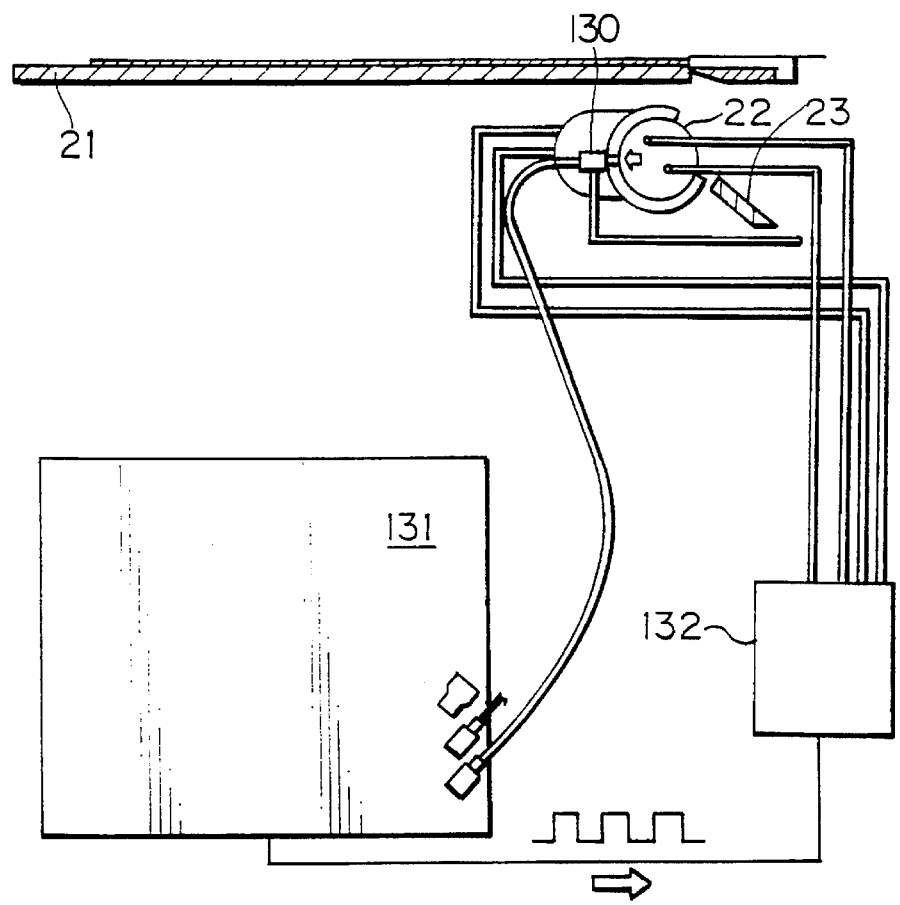
FIG. 6 shows a lamp provided on a first scanner included in the embodiment together with a light control arrangement.

FIG. 6 shows the lamp 22 of the first scanner 24 together with a light quantity control system associated therewith. There are shown in the figure a sensor 130 responsive to the light from the lamp 22, a main control board 131, and a stabilizer 132. Specifically, the quantity of light from the lamp 22 has to be maintained adequate at all times to insure the stable formation of a latent image on the drum 35. For this purpose, the sensor 130 senses the quantity of light from the lamp 22 and delivers its output to the main control board 131. In response, the main control board 131 causes the stabilizer 132 to change a lamp output signal, thereby controlling the quantity of light from the lamp 22.

Figure 7:
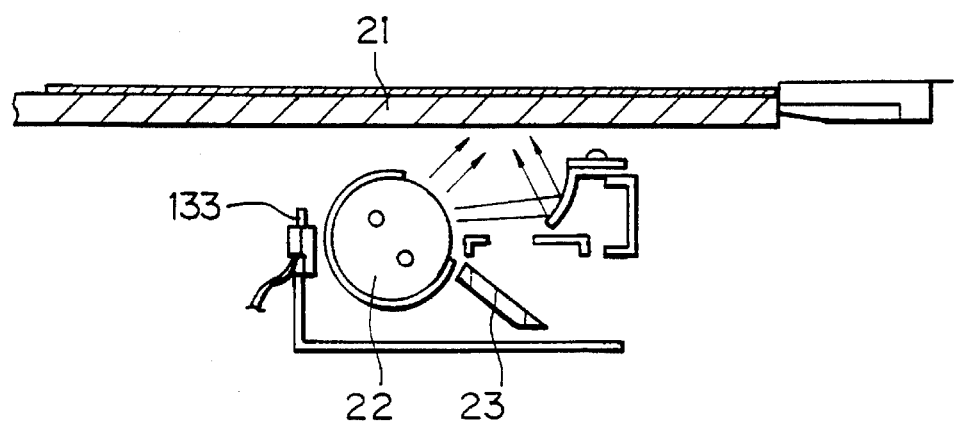
FIG. 7 shows the first scanner in detail.

The first scanner 24 is shown in detail in FIG. 7. An automatic density set (ADS) control procedure will be described with reference to FIG. 7. While the lamp 22 scans the document, an ADS sensor 133 continuously reads the resulting reflection from the document. The highest output voltage of the ADS sensor 133 is compared with a reference value which will be described. Then, the bias voltage for development is changed on the basis of whether VDE is high (light) or low (dark) so as to maintain a constant image. The output of the ADS sensor 133 to appear when the ADS reference pattern 123, FIG. 3, is illuminated by a predetermined quantity of light is the above-mentioned ADS reference value.

Figure 8:
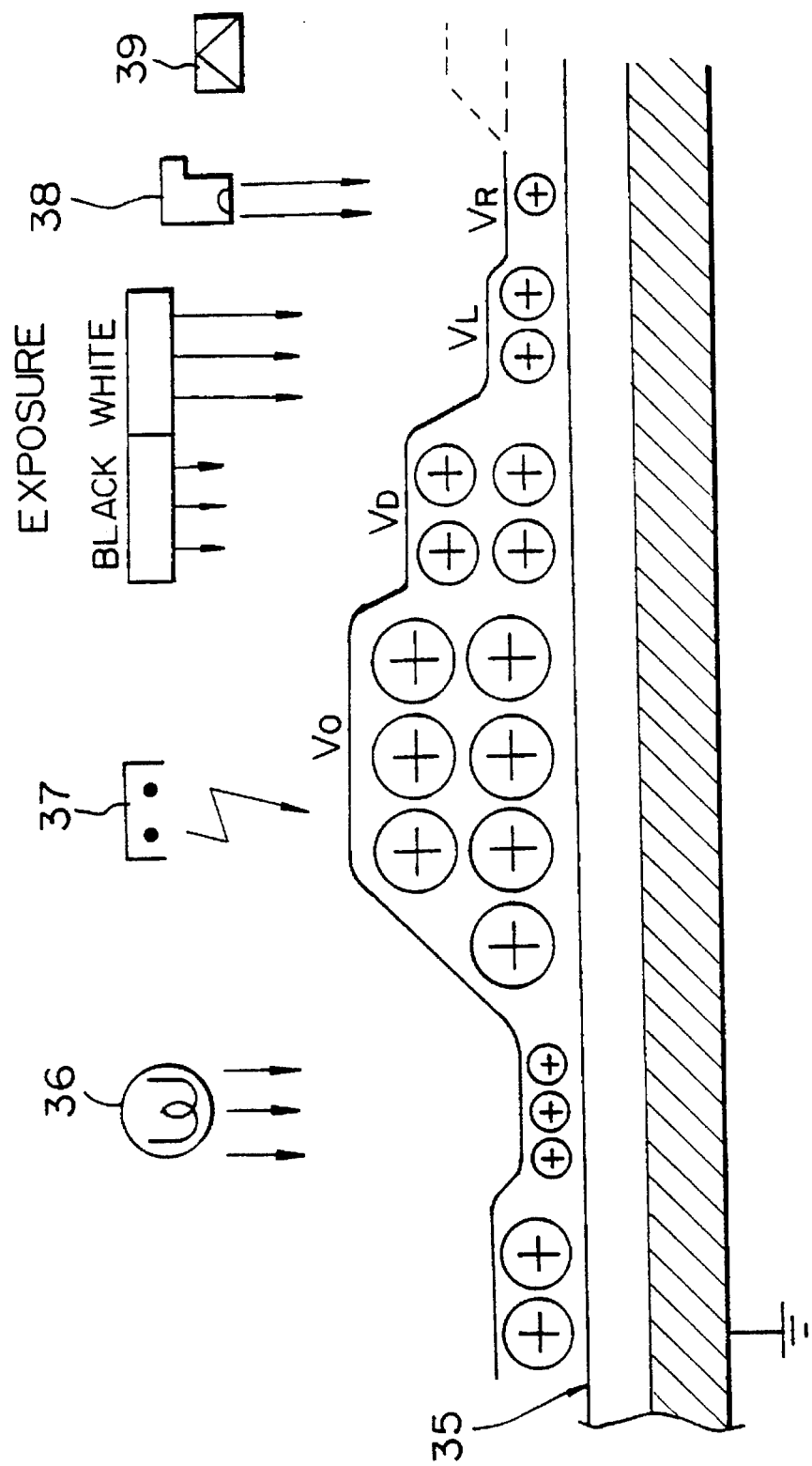
FIG. 8 shows various potentials to be deposited on the surface of the drum.
Figure 9:
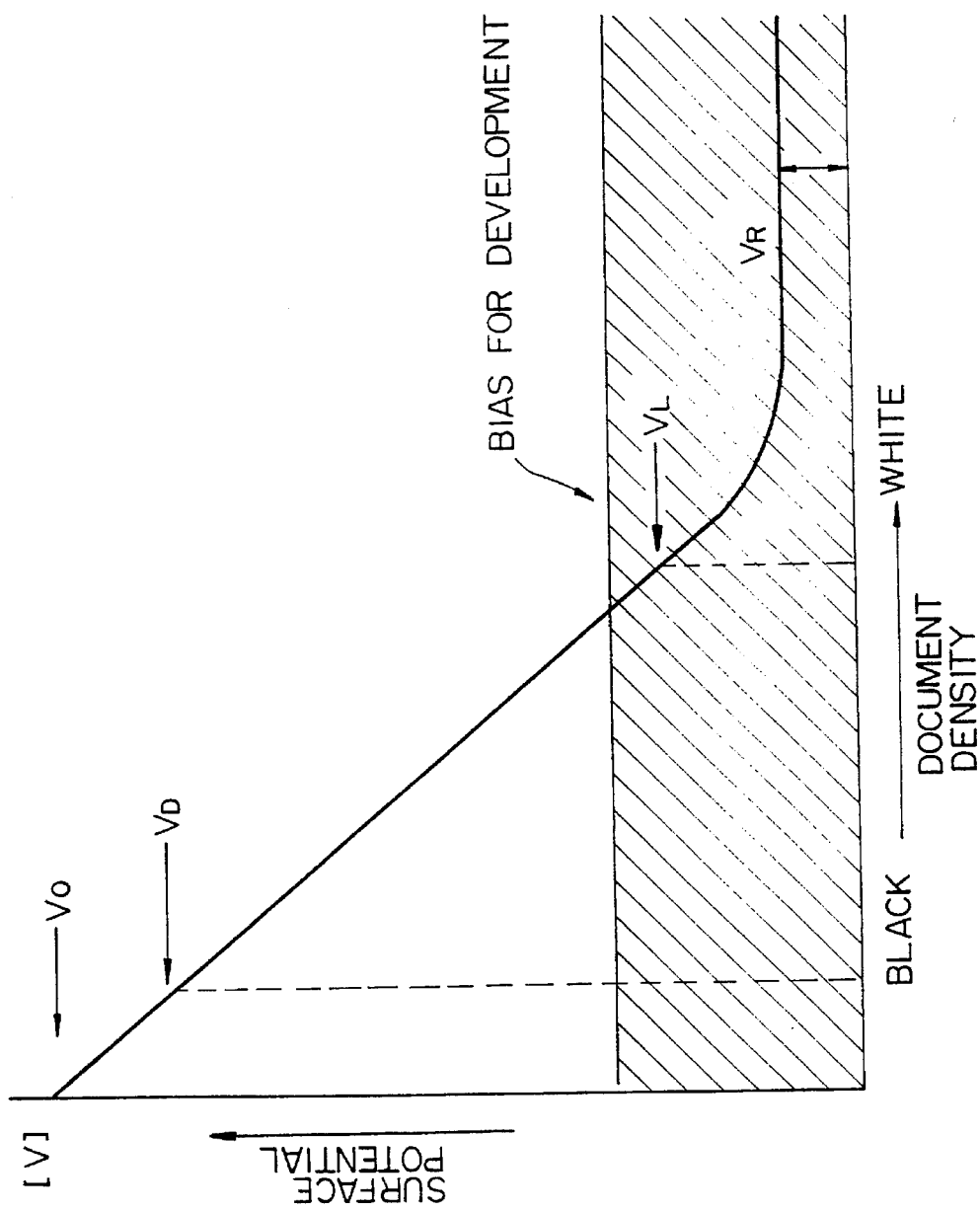
FIG. 9 is a graph indicative of a relation between the various potentials of the drum and the density of a document.

Referring to FIGS. 8 and 9, process control to be executed by the copier 1 will be described. Generally, the potential of a latent image changes due to the aging of the lamp 22, contamination of the optics (mirrors, lens, etc.), change in the output of the main charger 37, changes in the sensitivity and residual potential of the drum 35, etc. The process control senses a change in the potential of a latent image by use of the potential sensor 39 and feeds it back to the charging, exposing and developing processes, so that a stable image may be formed at all times. Stabilizing a latent image is also successful in stabilizing the toner concentration control implemented with the P sensor 45.

As shown in FIG. 8, the quenching lamp 36 illuminates the surface of the drum 35, and then the main charger 37 uniformly charges it. Let the potential deposited on the drum 35 by the main charger 37 be referred to as a postcharge potential V0. Also, let a potential derived from the illumination of the VL pattern 124, FIG. 3, and a potential derived from the illumination of the VD pattern 125, FIG. 3, be called a white area potential VL and a black area potential VD, respectively. Further, a potential resulting from the illumination of the drum 35 by the eraser 38 will be referred to as a residual potential VR.

The process control will be described with reference to FIG. 9. To produce an adequate image, it is necessary that the difference between the black area potential VD and the white area potential VL be maintained constant. Although the residual potential VR cannot be reduced to zero even when the quantity of light is increased, it is possible to maintain the potential difference by adding VR to the target values of the potentials VD and VL. Although the residual potential VR increases uniformly the surface potentials by VR, the increase in surface potential can be compensated for if VR is also added to the bias for development.

Figure 10:
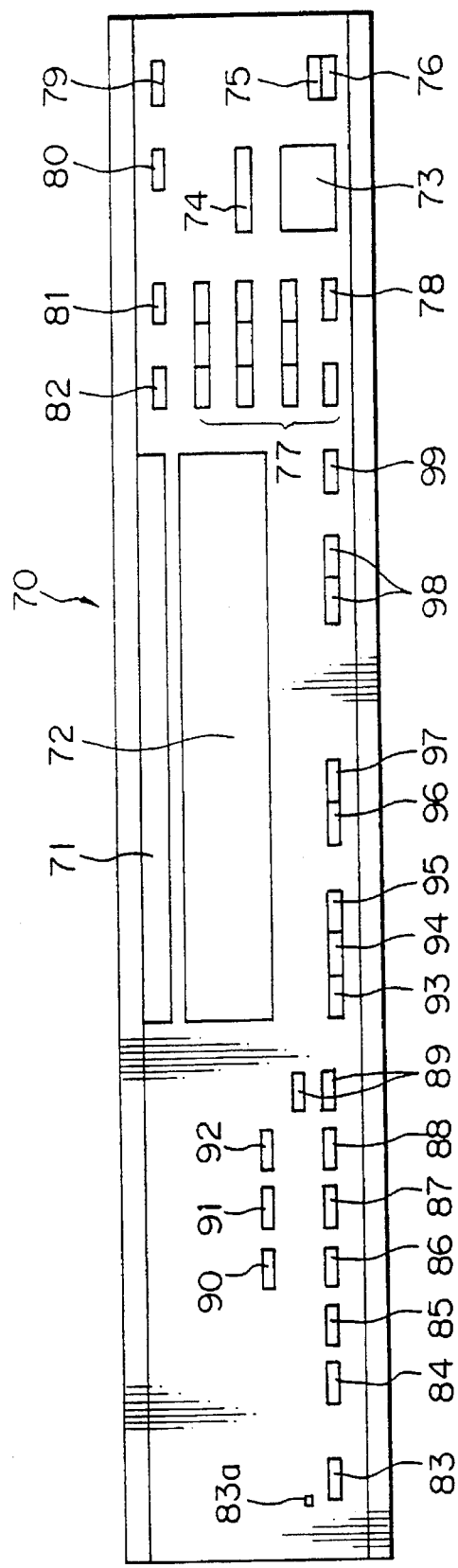
FIG. 10 shows a specific layout of an operation panel provided on the copier.

FIG. 10 shows a specific arrangement of an operation panel provided on the copier in a plan view. As shown, the operation panel, generally 70, has a guidance display 71 and a pattern display 72 each being implemented by a liquid crystal display. A number of keys are positioned at the right and left and at the front of the operation panel. Specifically, a start key 73, an interrupt key 74, a preheat key 75, a mode clear/preheat key 76, numeral keys 77, a clear/stop key 78, a timer key 79, a program key 80, an enter key 81, and a guidance key 82 are arranged at the right-hand side. A remote inform key 83, a sorter key 84, a two-side key 85, a page continuous key 86, a delete key 87, a sheet-oriented magnification change key 88, zoom keys 89, a margin key 90, a center key 91 and a size-oriented magnification change key 92 are arranged at the left-hand side. Further, a reduce key 93, an enlarge key 94, a ×1 key 95, a sheet select key 96, an automatic sheet select key 97, density adjust keys 98, and an automatic density key 99 are located at the front of the intermediate area. When the remote inform key 83 is turned on to effect a communication, an indicator in the form of an LED 83a glows.

Figure 11:
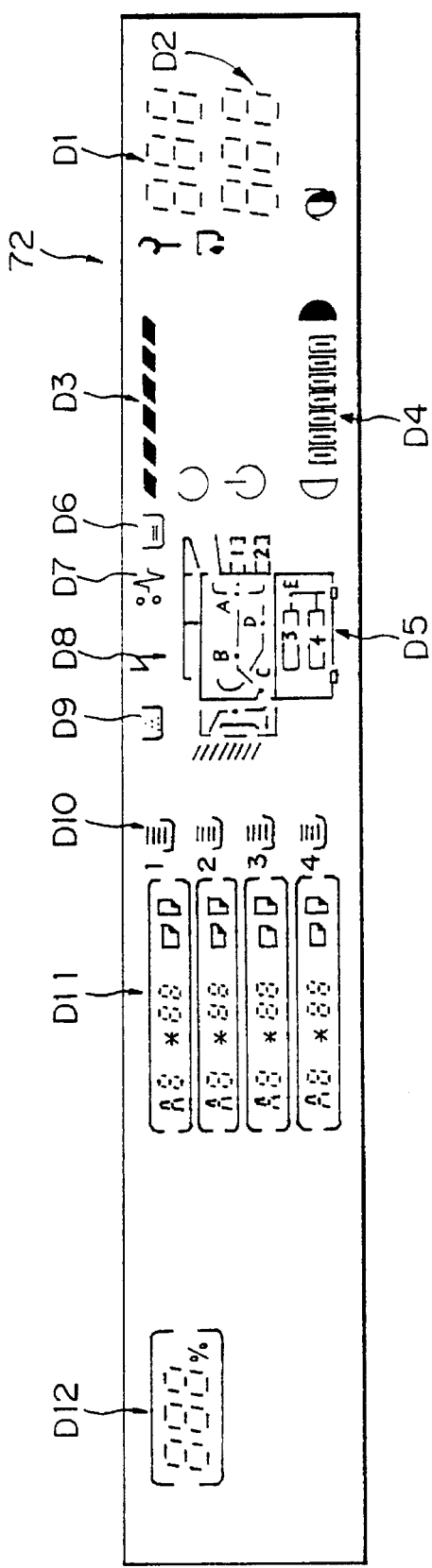
FIG. 11 is an enlarged view of a pattern display included in the operation panel.

FIG. 11 shows the pattern display 72 in an enlarged view. As shown, the pattern display 72 includes a pattern D1 indicative of the number of copies set, a pattern D2 indicative of the number of copies produced, a pattern D3 indicative of a running state, a pattern D4 indicative of density, a pattern D5 indicative of a misfeed position, a pattern D6 requesting sheet supplement, a pattern D7 indicative of a misfeed, a pattern D8 indicative of a remote communication error, a pattern D9 requesting toner supplement, a pattern D10 indicative of remaining amounts of sheets, a pattern D 11 indicative of sheet selection/size/direction, and a pattern D12 indicative of a magnification.

The guidance display 71, FIG. 10, displays messages for operation and warning. The operation panel 70 is characterized in that the remote inform key 83 allows the user to hold a communication for requesting a service, and in that the error indicator D8 informs the operator of a remote communication error. If desired, the exclusive remote inform key 83 may be replaced with a particular order in which other keys are pressed or a particular duration of depression.

Referring again to FIG. 1, a control system embodying the present invention locates a control device or host machine 141 at a service station and connects it to a plurality of copiers or PPC 1 by telephone lines 142 and exchanges 143. The user's stations are each provided with a communication control unit (CCU) 144. The copier 1 is connected to the CCU 144. A telephone set 145 and a facsimile apparatus, can also be connected to the CCU 144. The CCU 144 is inserted in the existing subscriber line.

How data are interchanged in the control system will be described hereinafter. To begin with, data is down-loaded from the control device 141 to the copier 1, as follows. The control device 141 sends a copier identification code or ID code, a control code and control data to the CCU 144. If the control code is meant for the CCU 144, the CCU 144 executes processing based on the received data; if it is meant for the copier 1, the CCU 144 sends the control code and control data to a particular copier 1 designated by the ID code. The copier received the control code and control data performs a corresponding operation. To up-load data from the copier 1 to the control device 141, it sends an ID code, an occurrence code and occurrence data to the CCU 144. On setting up the line, the CCU 144 sends the collected data to the control device 141.

Figure 12:
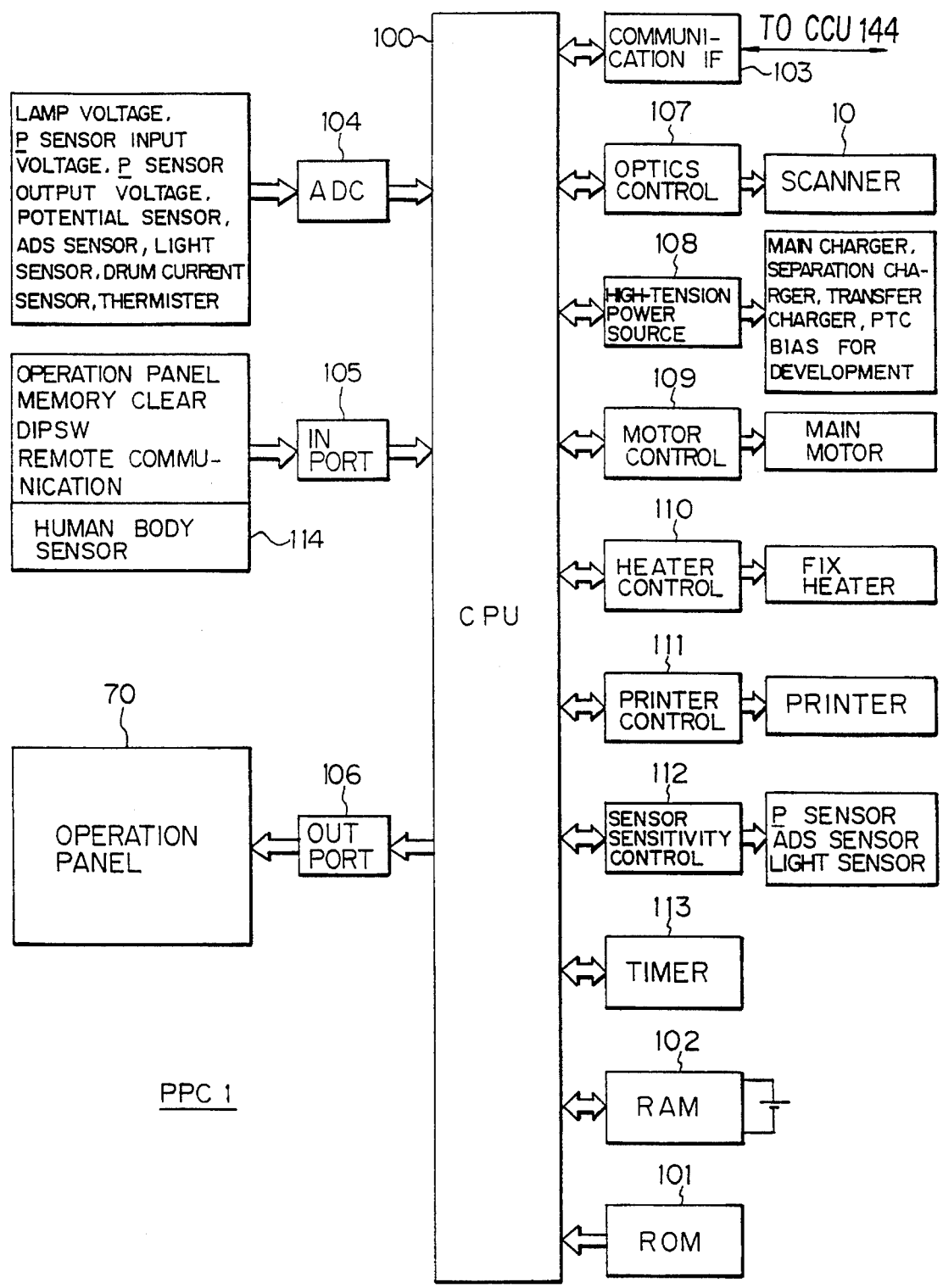
FIG. 12 is a block diagram schematically showing control circuitry included in the copier shown in FIGS. 1 and 2.

FIG. 12 is a block diagram schematically showing control circuitry incorporated in the copier 1. As shown, the control of the copier body 2 is mainly executed by a CPU 100 on the basis of control programs and data stored in a ROM (Read Only Memory) 101. A RAM (Random Access Memory) 102 stores interim data to occur during processing. A communication interface (IF) unit 103 interfaces the copier 1 to the CCU 144, i.e., receives control code and data from the CCU 144 in the event of sending dam of the copier 1 to the CCU 144. An analog-to-digital converter (ADC) 104 receives a voltage to be applied to the lamp 22, an emission voltage for the P sensor 45 and a voltage representative of received light, an output of the potential sensor 39, an output of the ADS sensor 133, an output of the sensor 130, an output of a drum current sensor responsive to a current to flow through the drum 35, an output voltage of a thermistor included in the fixing unit 65, and so forth.

An IN port 105 receives the outputs of various keys provided on the operation panel 70, FIG. 10, a memory clear dip switch (DIPSW), a remote communication permit/inhibit dip switch (DIPSW), and a human body sensor 114 which is a kind of object sensors. Provided on the front end, e.g., the front cover of the copier 1, the human body sensor 114 senses a human body or an object approaching the copier 1. For example, this sensor may be implemented by a pyroelectric infrared ray sensor or a thermocouple type infrared ray sensor using a thermoelectromotive force. The remote communication permit/inhibit dip switch permits or inhibits the communication with the CCU 144, FIG. 1. An OUT port 106 produces display control data meant for the displays and indicators of the operation panel 70 shown in FIGS. 10 and 11.

An optics control unit 107 controls the scaner section 10, FIG. 2. A high-tension power source unit 108 applies a high voltage to each of the main charger 37, separation charger 44, transfer charger 43 and pretransfer charger (PTC) 42 and applies a bias voltage to a developing roller included in the developing unit 40. A motor control unit 109 controls a main motor for driving the drum 35 and various rollers included in the sheet feed units and transport sections. A heater unit 110 controls the current supply to a heater received fixing roller of the fixing unit 65, so that the surface temperature of the fixing roller may remain in a range. A printer control unit 111 delivers copier control data to a printer. A sensor sensitivity control unit 112 light reception gains of the sensors 130, 133 and 45 as well as the emission voltage for the LED of the sensor 45. A timer 113 indicates time and is used to ON/OFF control an AC power source by a weekly timer.

When the memory clear dip switch is in an ON state in the event of the turn-on of a power source, the contents of a RAM (or nonvolatile memory) backed up by a battery BT are replaced with predetermined values. Remote communication control is executed only if the remote communication permit/inhibit dip switch is in an ON state in the event of the turn-on of the power source. The surface temperature of the fixing roller is determined in terms of the output voltage of the thermistor of the fixing unit 65. When this temperature is lower than predetermined one, the copying operation is inhibited.

Figure 13:
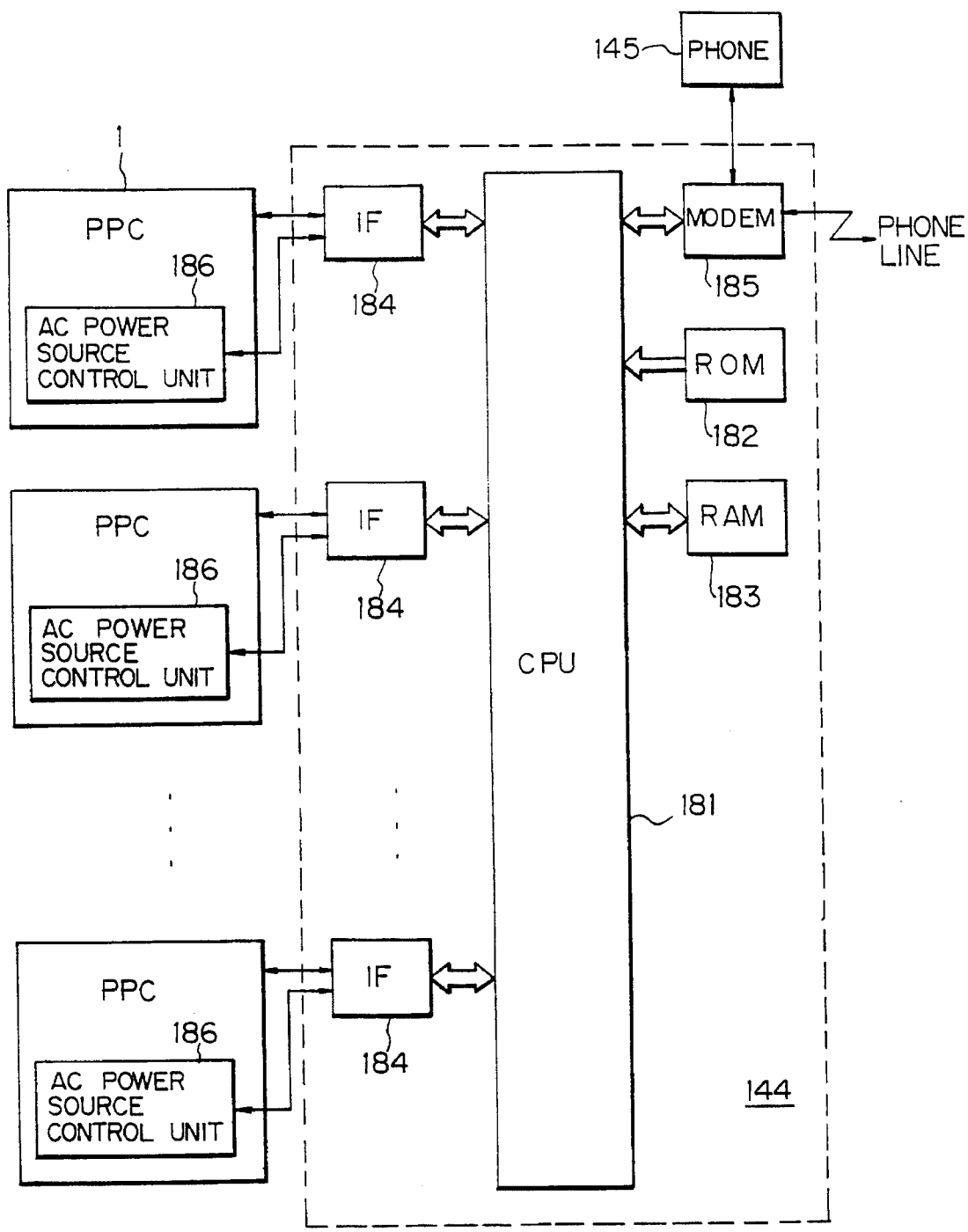
FIG. 13 is a block diagram schematically showing a specific construction of a communication control unit of FIG. 1.

FIG. 13 shows a specific configuration of the CCU 144, FIG. 1. The control of the CCU 144 is mainly effected by a CPU 181 on the basis of control programs and data stored in a ROM 182. A RAM 183 is used to store interim data to occur during processing. The CPU 181 has the following functions:

(1) To collect data of the copier 1 via an associated interface (IF) circuit 184 and send it from a modem 185 to the control device 141 via the exchange 143 and telephone line 142, FIG. 12;

(2) To receive a control code and data from the control device 141 via the telephone line 142 and exchange 143 with the modem 185 and send them to the copier 1 via the IF circuit 184;

(3) To send a control signal to an AC power source control unit 186 included in the copier 1 via the IF circuit 184 so as to ON/OFF control the power supply;

(4) To distinguish a plurality of copier which may be connected to the CCU 144 and to arbitrate remote communications thereof; and (5) To switch the communication with the control device 141 and the ordinary conversation on the telephone set 145 with the modem 185.

The communication between the CCU 144 and the copier 1 is effected via a communication interface by serial communication or parallel communication.

Figure 14:
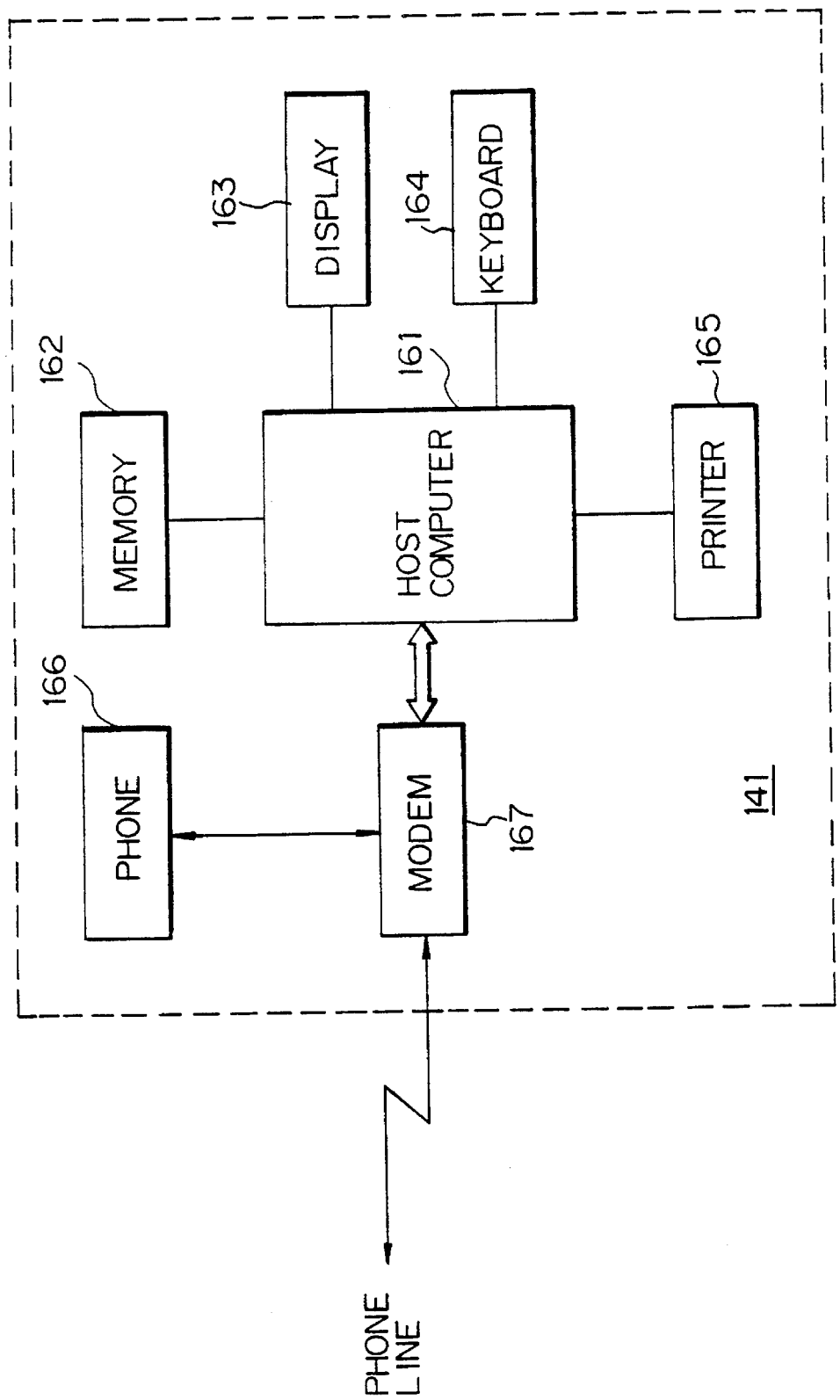
FIG. 14 is a block diagram schematically showing a specific construction of a control device of FIG. 1.

FIG. 14 shows a specific construction of the control device 141. As shown, the control device 141 has a host computer 161 for executing various kinds of processing, a memory 162 for storing control data and other data, a cathode ray tube or similar display 163 for displaying various pictures which will be described, operating means in the form of a keyboard 164, a printer 165 for outputting control data, a telephone set 166, and a modem 167 for communicating with the user's copier over the telephone line 142.

The contents of the RAM 102 of the copier or PPC 1 shown in FIG. 12 should not be rewritten while an operation is under way. The statuses in which the RAM 102 should not be rewritten are as follows:

| | |
|---|---|
| Status 1: | when the drum 35 is in a stop |
| | ... data relating to processes rewritable |
| Status 2: | when the heater of the fixing unit is OFF |
| | ... fixing temperature allowed to be set |
| Status 3: | waiting state |
| | ... modes other than operation mode rewritable |
| Status 4: | jam |
| | ... part of process data and operation mode rewritable |
| Status 5: | fault |
| | ... part of programs rewritable |
| Status 6: | inoperative state | all rewritable except for program code of communication IF 103

In the inoperative state or status "6", the minimum power source necessary for a communication to begin is in an ON state. At the beginning of a communication, the AC power source control unit 186, FIGS. 1 and 13, controlled by the CCU turns on a necessary power source to allow most of the data in the RAM 102 to be rewritten. Typically, the status "6" occurs when the weekly timer is in an OFF state.

Figure 15:
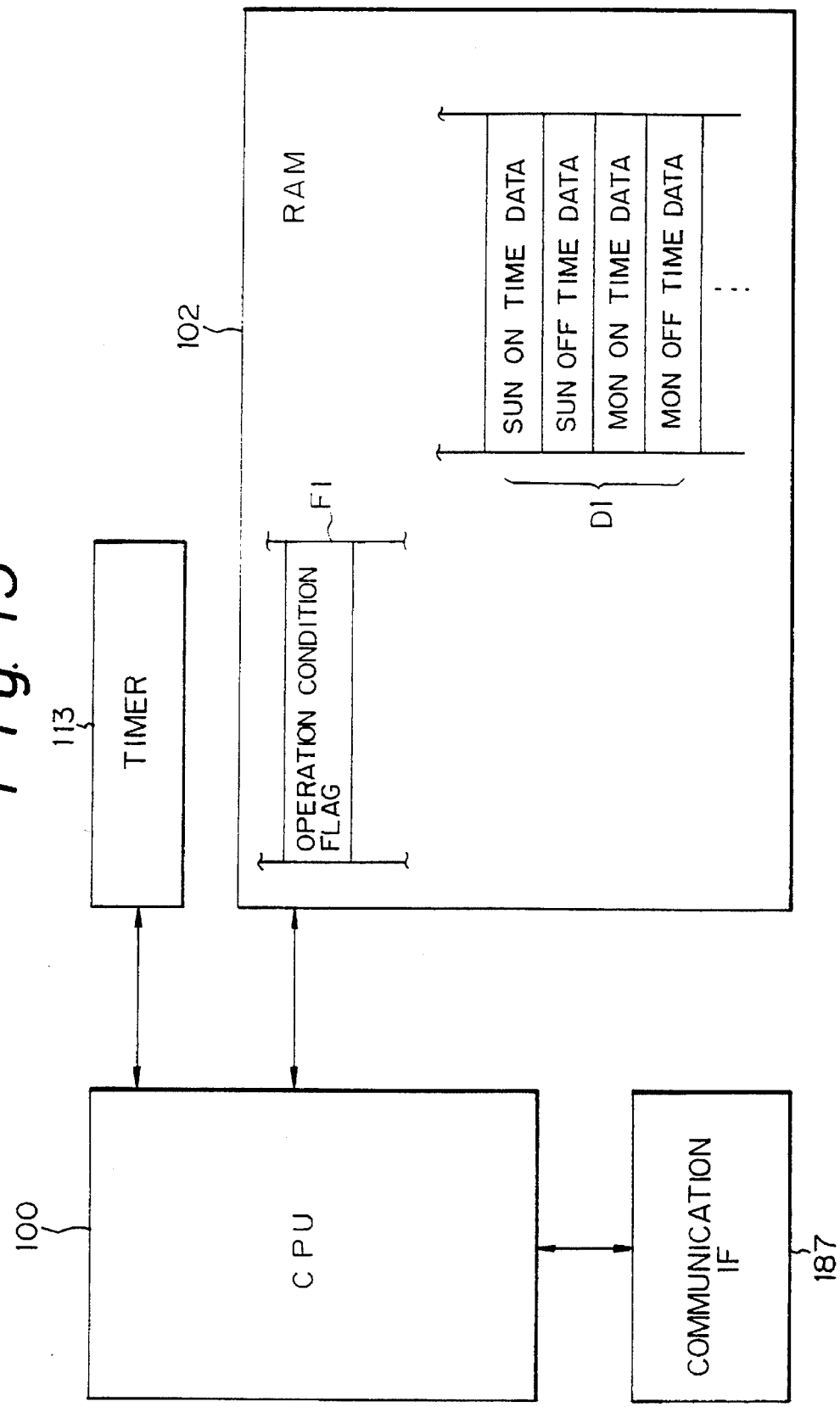
FIG. 15 is a schematic block diagram for describing a down-loading operation to occur in the inoperative condition of the copier.

How to rewrite the contents of the RAM 102 is as follows. As shown in FIG. 15, the control device 141, FIG. 1, reads an operation status flag F1 stored in the RAM 102 and relating to the statuses "1" to "6" via the telephone line 142, CCU 141 and communication IF 187. When the read data F1 is indicative of the status "6", i.e., when the weekly timer is in an OFF state, the control device 141 down-loads to a predetermined address of the RAM 102 the data of the copier 1 stored in the memory 162, FIG. 14, at the time of delivery or the modification of the copier 1. At this instant, all or part of the data stored in the RAM 102 is rewritten.

It may occur that simply reading the operation status flag F1 does not satisfy the rewriting condition for the following reason. Usually, several seconds to several ten minutes is necessary for data to be down-loaded over a communication line. Should the weekly timer be turned on during such a period of time, the status would shift to, for example, the status "3" and cause the copier 1 to start operating, interrupting the down-loading.

Figure 16:
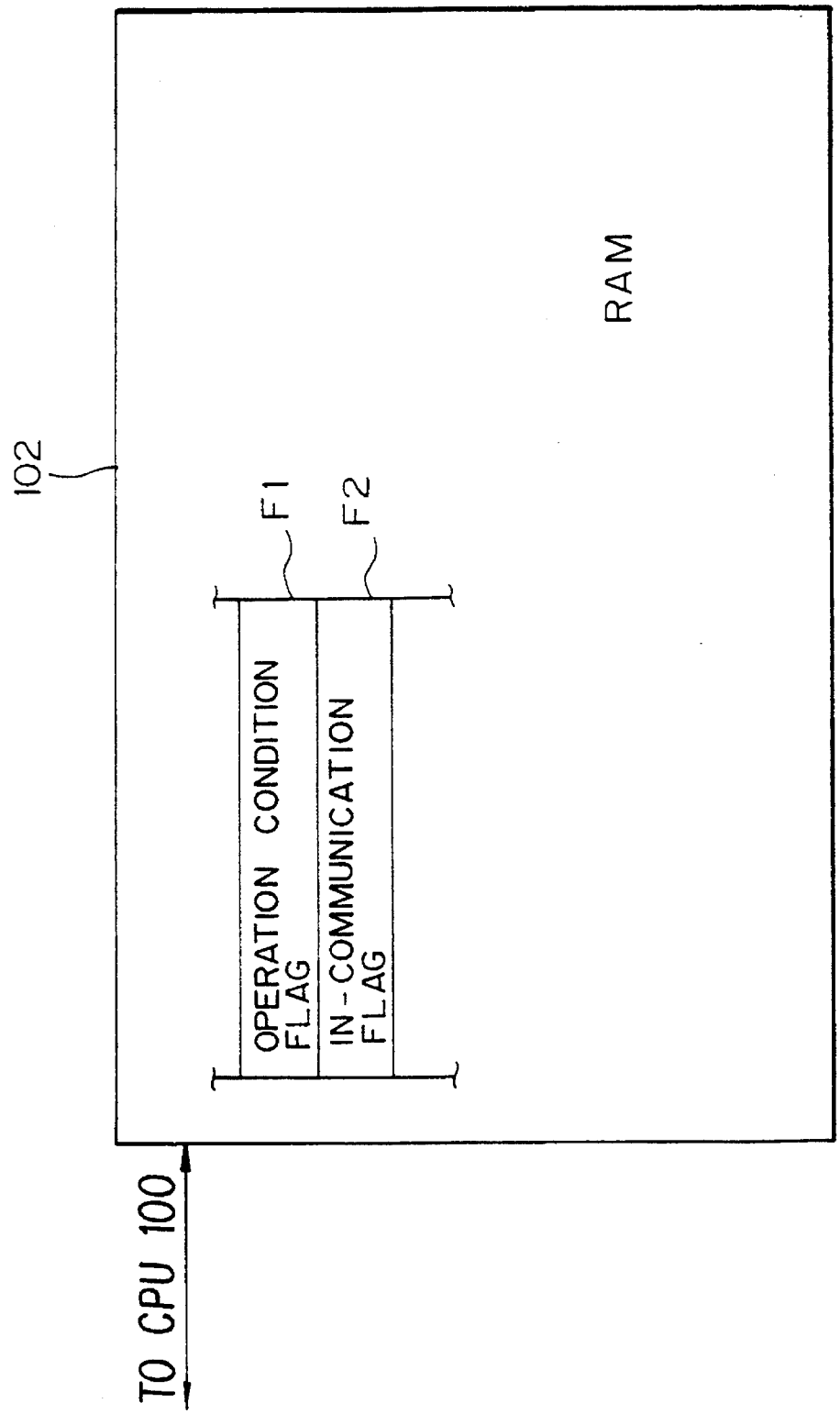
FIG. 16 is a schematic block diagram for describing a down-load interruption preventing operation to occur in the inoperative condition of the copier.

To eliminate the above problem, as shown in FIG. 15, the illustrative embodiment reads out the past power ON/OFF time data stored on a week-day or date basis and the current time of the timer 113. Only if the down-loading procedure will complete before the weekly timer turns on the power source, the embodiment starts on the down-loading procedure. This decision uses the timer 113 of the copier 1 since the weekly timer is subordinate to the timer 113. Another approach to prevent the down-loading from being interrupted is that the control device 141 prevents the weekly timer from being turned on. This alternative approach may be implemented as any one of the following three methods:

Method 1: To read the current time of the timer 113 and then stop the timer 113, corrects the period of time consumed to return the time to the stored time after downloading, write the current time as if the timer 113 was continuously operating, and then start on the operation again;

Method 2: To read and store the next ON time data of the weekly timer and, at the same time, write in the weekly timer the time data delayed by a down-loading time, and then return the stored ON time data to the weekly timer after down-loading; and Method 3: As shown in FIG. 16, to provide the RAM 102 an in-communication flag F2 beforehand, set the flag F2 on the start of down-loading, and reset it after down-loading. As the weekly timer is turned on, the CPU 100 of the copier 1 checks the in-communication flag F2 and, if it is set, inhibits the transition to another status.

Therefore, by any one of the above methods "1" to "3", it is possible to prevent down-loading from being interrupted even when the weekly timer reaches an ON time while down-loading is in progress.

Figure 17:
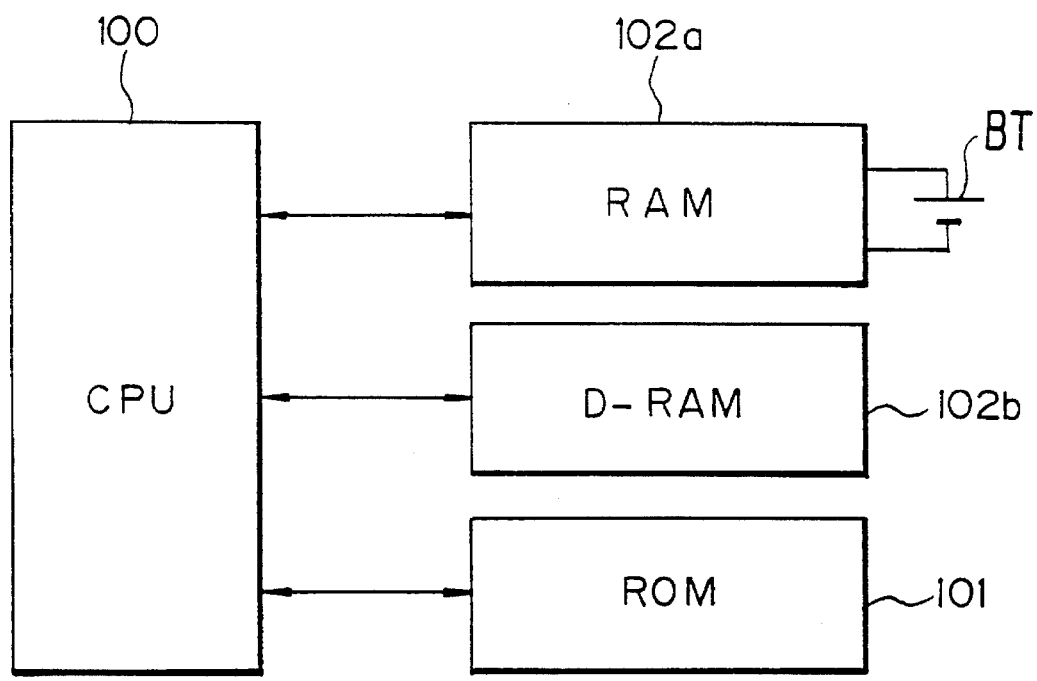
FIG. 17 is a schematic block diagram for describing the destination of down-load data.

FIG. 17 shows another specific memory configuration which includes a nonvolatile RAM 102a and a D-RAM 102b in addition to the ROM 101. The ROM 101 stores a communication IF program, down-load bootstrap program and other basic programs. Backed up by the battery BT, the RAM 102a stores process control set data, operation mode set data, etc. Alternatively, the basic programs may be partly stored in the ROM 101 and partly in the RAM 102a. The D-RAM 102b stores a fault diagnosis program or similar program for executing a different kind of processing for a moment, while implementing a temporary work area for data processing.

The memory 162 of the control device 141, FIG. 14, stores a particular type of machine and a particular ID code associated with each of the copiers 1. Data matching set data and program particular to each copier 1 are selectively down-loaded to the RAM 102a and D-RAM 102b.

A procedure to occur in the waiting status "3" will be described. As shown in FIG. 15, the control device 141 reads the status flag F1 relating to the statuses "1" to "6". If the flag F1 is indicative of the status "3", the control device 141 down-loads, among the data stored at the time of delivery or the modification of the copier 1, predetermined data except for the operation mode to a predetermined address of the RAM 102. As shown in FIG. 18, a heater 652 is accommodated in a fixing roller 651 included in the fixing unit 65. When the heater 652 is in an ON state, the control device 141 down-loads predetermined data other than the set temperature. It is to be noted that the range of data to be down-loaded depends not only on the operation status flag but also on the presence/absence of peripheral equipment, environmental conditions, and the type of the machine.

It is likely that down-loading is interrupted even in the waiting status "3". The status "3" is usually cancelled as the fixing roller 651 is heated to a predetermined temperature. Hence, pressing the start key 73, FIG. 10, on the cancellation of the status "3" brings about the following problems. Assume that the start key 73 is pressed when data relating to image formation sent from the control device 141 are being written to the RAM 102, interrupting the down-loading. Then, an image will be formed before all the image forming data have been transferred, resulting in a defective copy. For example, when the potential of the drum 35 and the bias voltage for development are not transferred in combination, a defective copy will be produced due to an inadequate potential. Moreover, assume that the start key 73 is pressed when the control device 141 is sending the set values of the control mode particular to the copier 1, interrupting the down-loading. Then, the copier 1 will perform an operation not expected by the user or the serviceman.

In the light of the above, as shown in FIG. 18, the control device 141 determines an expected reloading time D3 of the copier 1 in communication, e.g., a temperature D2 of the fixing roller 65 via a thermistor 653, and then estimates the remaining period of time in which the set temperature will be reached on the basis of a relation between the time and the temperature elevation rate. Only if the down-loading will complete within the remaining period of time, the control device 141 starts on the down-loading.

Alternatively, to prevent down-loading from being interrupted in the waiting status "3", the control device 14 may execute control such that even when the status "3" is cancelled, the transition to the next status is inhibited, as follows. Specifically, as shown in FIG. 18, the RAM 102 is provided with an in-down-load flag F3 beforehand. On the start of down-loading, the control device 141 sets the flag F3 and, after the down-loading, resets it. As the waiting state "3" is cancelled, the CPU 100 of the copier 1 checks the flag F3 and, if it is set, inhibits the transition to the next status.

Assume that the copier 1 has a weekly timer, but a time is not set in the timer. Then, the inoperative status "6" will not be reached forever. In this embodiment, down-loading can be effected by any one of the following methods:

Method 1: At the time of delivery of the copier 1, the serviceman enters data particular to the copier 1 in the control device 141 so as to up-load them to the copier 1. These data include time data of a weekly timer and allow the control device 1 to see that a time is not set in the weekly timer before a communication. In such a case, a time is set by setting up down-loading in the waiting status.

Method 2: Down-loading in the waiting status i s restricted regarding the data which can be rewritten. Hence, a command is sent to the copier 1 to set the inoperative status "6" or the time data is rewritten to set it up, and the down-loading is effected.

In this way, the embodiment down-loads data in matching relation to the waiting status "3" or the inoperative status "6"

each having a particular restriction. This prevents downloading from being interrupted and, in addition, reduces the load on the serviceman.

Some copiers, e.g., inexpensive copiers lack the weekly timer and the AC power source control unit 186 to be controlled by the CCU 144. Down-loading is effected with this kind of copier, as follows. When the control device 141 calls the copier 1 via the telephone line 142 and CCU 144, it can see the ON/OFF state of the power source of the copier 1, depending on whether or not the copier 1 returns an answer or whether or not a carrier signal is present. Based on the result of decision, the control device 141 may execute any one of the following three different types of downloading.

Type 1: When the power source of the copier 1 is in an ON state, the control device 141 effects down-loading in matching relation to the waiting status "3" or the inoperative status "6"; when the former is in an OFF state, the device 141 continuously monitors the power source and, on the turn-on of the power source, effects down-loading.

Type 2: A drawback with the type 1 is that when the power source is OFF, the communication rate increases due to the continuous monitor. To eliminate this drawback, the control device 141 monitors the power source intermittently and, on the turn-on of the power source, effects down-loading.

Type 3: Even the type "2" increases the communication rate due to the intermittent monitor and, in addition, increases the load on the control device 141. In the light of this, a memory for temporarily holding down-loaded data and a communication control function for emulating downloading are incorporated in the CCU 144. The communication control function can be implemented by use of the RAM 183, FIG. 13 as a memory and by storing a down-load program in the ROM 182 beforehand. The control device 141 once down-loads data to the CCU 144, causes the CCU 144 to monitor the power source of the copier, and effects down-loading on the turn-on of the power source.

A reference will be made to FIGS. 19–46 for describing the communication between the communication between the control device 141, 144, and the copier 1 in detail.

To begin with, the control device 141 sends a copier ID code, control code and data while the copier 1 sends a control code and data, as stated earlier. In the meantime, the the CCU 144 is operated as will be described with reference to FIG. 19.

Figure 19A:
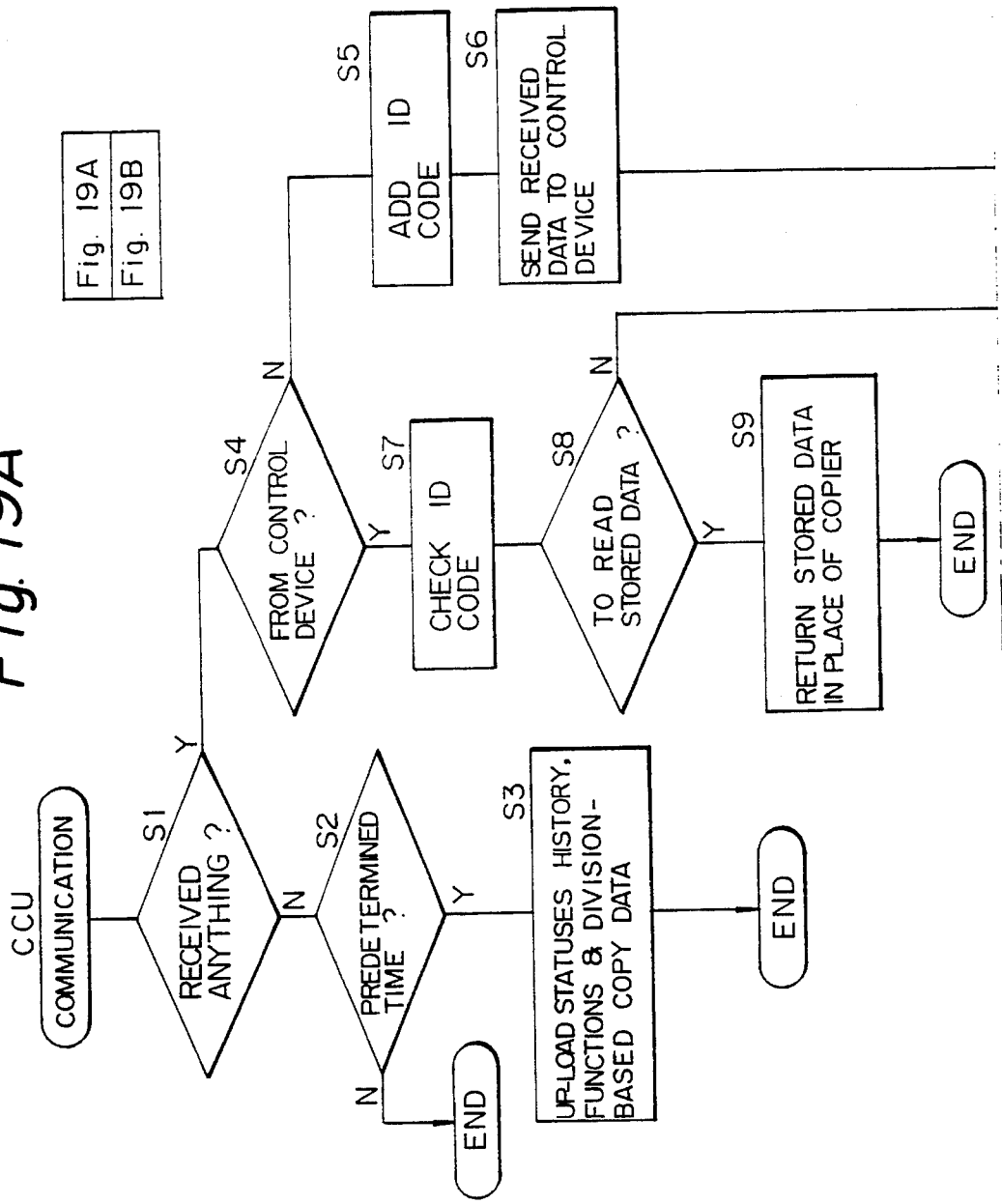
FIG. 19(A–B) is a flowchart demonstrating a specific operation of the communication control unit of FIG. 1.
Figure 19B:
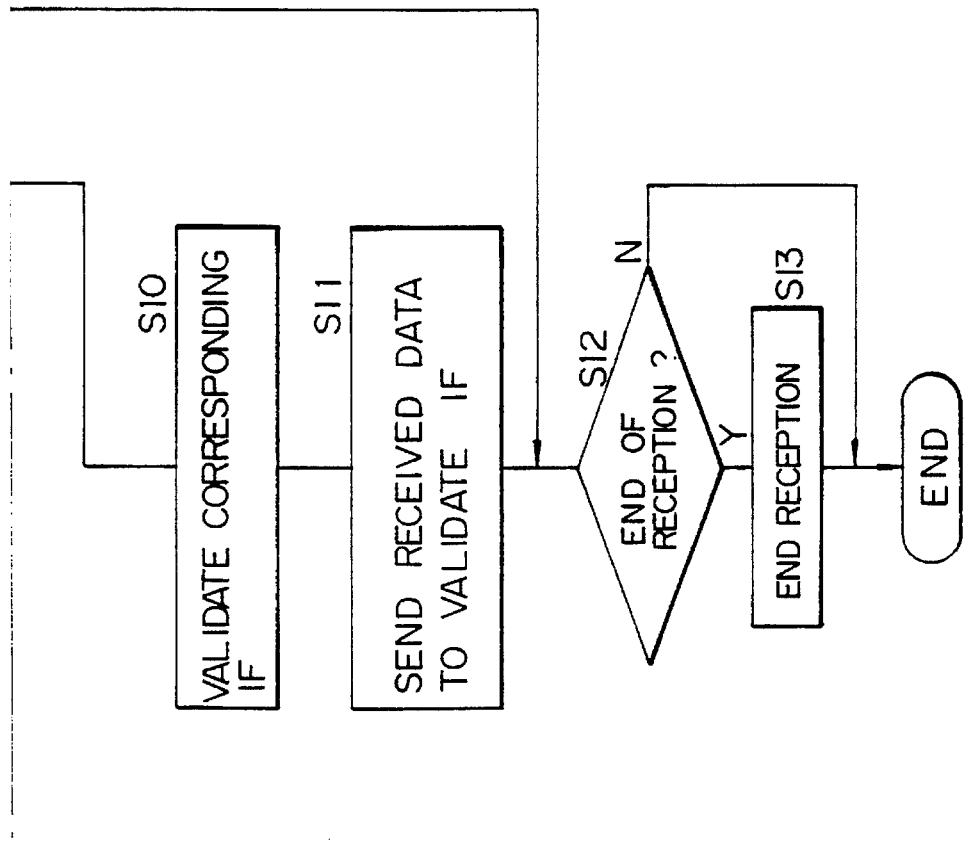

As shown in FIG. 19, in steps S1–S3, while the CCU 144 does not receive no data from the copier 1 or the control device 141, the CCU 144 reads the history data of jam, number of copies, operation time and error, function data, division-by-division data and other data at a predetermined time set in the timer thereof beforehand and stores them in the RAM 183, FIG. 13. Therefore, the control device 141 can up-load such data even when the power source of the copier 1 is OFF.

When the CCU 144 receives data from either of the copier 1 and control device 141 in the step S1, it determines whether or not the data has been sent from the control device 141 (S4). If the result of this decision is negative, N, the CCU 144 determines that the data is from the copier 1, generates a copier ID code out of the received IF circuit 184, FIG. 13, and then adds the ID code to the data (S5). Subsequently, the CCU 144 sends the received data with the ID code to the control device 141 (S6). If the data has been received from the control device 141 as determined in the step S4, the CCU 144 determines a copier ID code (S7) to identify a copier with which the control device 141 is to hold a communication. Then, the CCU 144 determines whether or not the received data requesting the read-out of data stored in the RAM 183 (S8). If the answer of the step S8 is positive, Y, the CCU 144 sends the date of interest to the control device 141 in plae of the copier 1 (S9). If the answer of the stp S8 is negative, the CCU 144 activates only the IF circuit 184 associated with the copier 1 of interest (S10) and then sends the received data to the IF circuit 184 (S11). Subsequently, the CCU 144 determines whether or not the reception has ended (S12) and, if the answer if positive, disconnects the line and IF circuit 184 (S13).

The communication between the control device 141 and the copier 1 is as follows. The copier ID code will not be described specifically since it is dealt with by the CCU 144. As shown in FIG. 20, the control code and data are made up of an information code having eleven bytes, the number of data having two bytes, data extnding over the indicated number of bytes, and an end code having one byte. In the event of communication, the control code and data are implemented by ASCII code. The information code indicative of the contents of data is arranged according to predetermined rules shown in FIGS. 21A, 21B and 22A–22D. These rules apply to both the transmission from the copier 1 to the control device 141 and the transmission from the control device 141 to the copier. FIG 21A shows the format of the information code while FIG. 21B shows the contents of numerals belonging to the first and second levels of the information code. FIGS. 22A–22D show respectively the contents of numbers belonging to the third to sixth levels of the information code.

Some specific examples will be described with reference to FIG. 20. To read the operation time of the copier 1, the control device 141 sends an information code "14070010101" and the number of data "0" to the copier 1. On receiving the number of data "0", the copier 1 returns to the control device 141 the same information code, the number of data "4", and four bytes of operation time data. To mute a buzzer disposed in the copier 1, the control device 141 sends an information code "51050080101" and the number of data "1" to the copier 1. The copier 1 waits until one byte of data has been fully received, rewrites a memory MDBZ storing a buzzer mode corresponding to the information code to store the received data, and then returns the same information code and the number of data "0" to the control device 141. As a result, when a key input expected to cause the buzzer to sound is entered, the copier 1 mutes the buzzer by referencing the memory MDBZ.

Further, a wild card "*" can be used as an information code. Specifically, the information codes are represented by serial numerical values when their contents are analogous. Hence, to read all the data relating to the weekly timer, for example, the control device 141 sends an information code "5105302**" and the number of data to the copier 1. In response, the copier 1 decodes the information code and then sends data corresponding to consecutive information codes "51053020000" to "51053029999" to the control device 141. However, regarding an information code which is absent in the copier 1, the copier 1 does not return any data. For example, in FIG. 20, since "51053001000" and other information codes are absent, the copier 1** returns data associated only with "51053020101, 51053020201, 51053020301, 51053040101" and "51053020501". The wild card "*" is available only in the event of reading and has the number of data "0".

To call all the data set in the copier 1, the control device 141 uses an information code "51******". As shown in FIG. 21B**, the numeral "5" of the first level of the information code indicates set data or similar data which can be written and read. When the first level is "5", the second level is "1", and the rest is the wild card "*", then the copier 1 decodes such an information code, reads memory data corresponding to information codes "51000000000" to "51999999999", and then returns all the information codes present and the number of codes to the control device 141.

The control device 141 causes the copier 1 to perform a given operation by use of an information code whose first level and second level are "7" and "1", respectively. For example, with such an information code, the control device 141 may cause the copier 1 to test the main charger, main motor and other loads independently or in combination, to train the fixing unit, or to perform a procedure for setting up adequate image forming conditions.

Since a single information code includes two bytes of data, more than ninety-nine data cannot be sent. Assume that more than ninety-nine data should be continuously sent, e.g., a program should be up-loaded or down-loaded. Then, as shown in FIG. 21B, while the read and write information code is "9" at the first level and "1" at the second level, the third and successive levels thereof are so set as to indicate the block of a program to be sent, as an exception. For example, when one block has sixty-four bytes, an information code "91000000000" and the number of data "64" may be sent and followed by sixty-four bytes from the sixty-fourth byte of the program. Information codes whose first level is "5" and second level is "2" or "3" are also available for the transfer of data.

A reception procedure which applies to both the control device 141 and the copier 1 will be described with reference to FIGS. 23 and 24. A transmission procedure is not illustrated since it simply sends, in the event of reading, an information code of data to read and the number of data "0" while sending, in the event of writing, an information code of data to write, the number of data, and data.

Figure 23B:
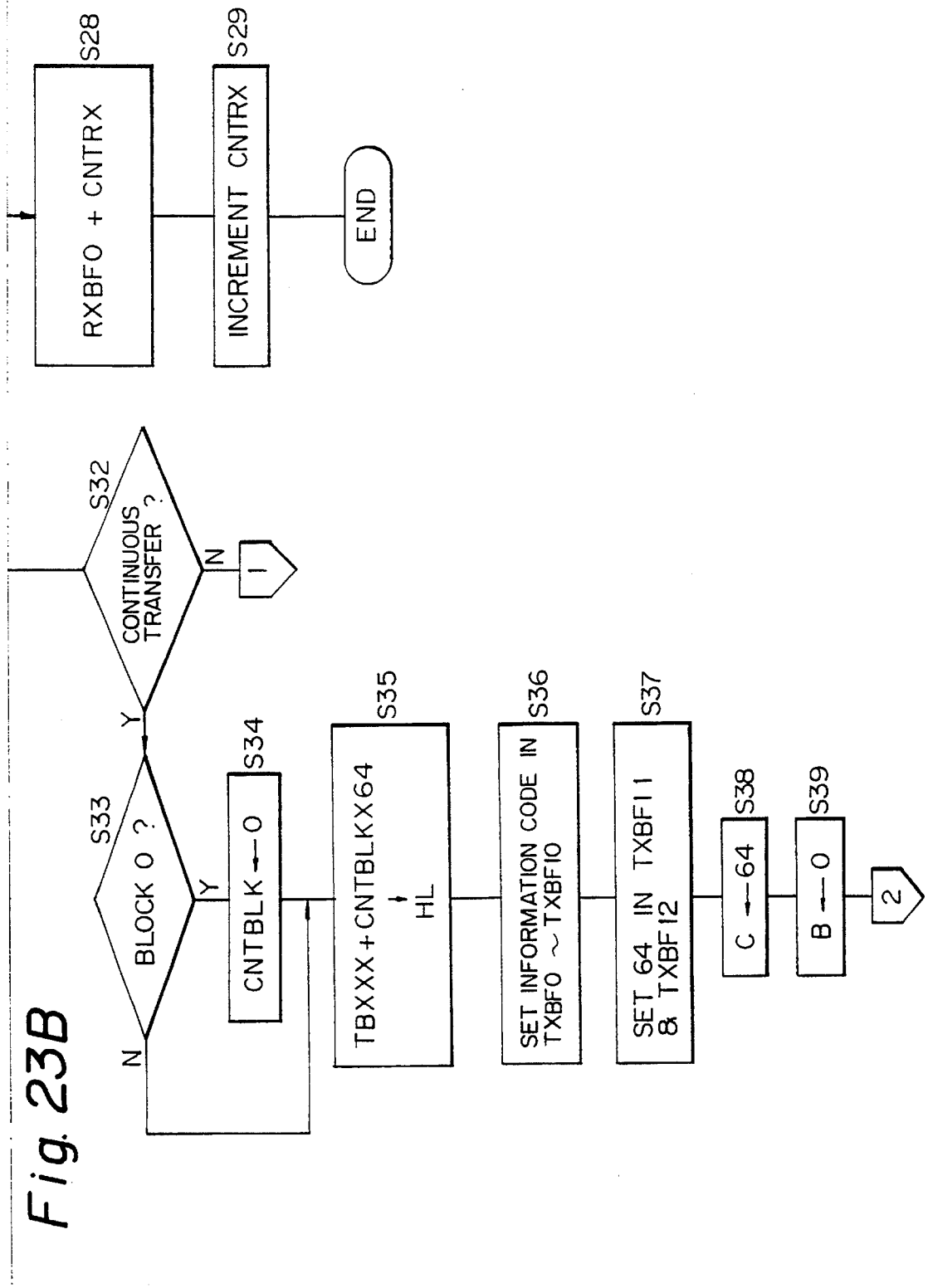
FIG. 23(A–B) is a flowchart demonstrating the operations of the copier and control device at the time of reception.
Figure 24A:
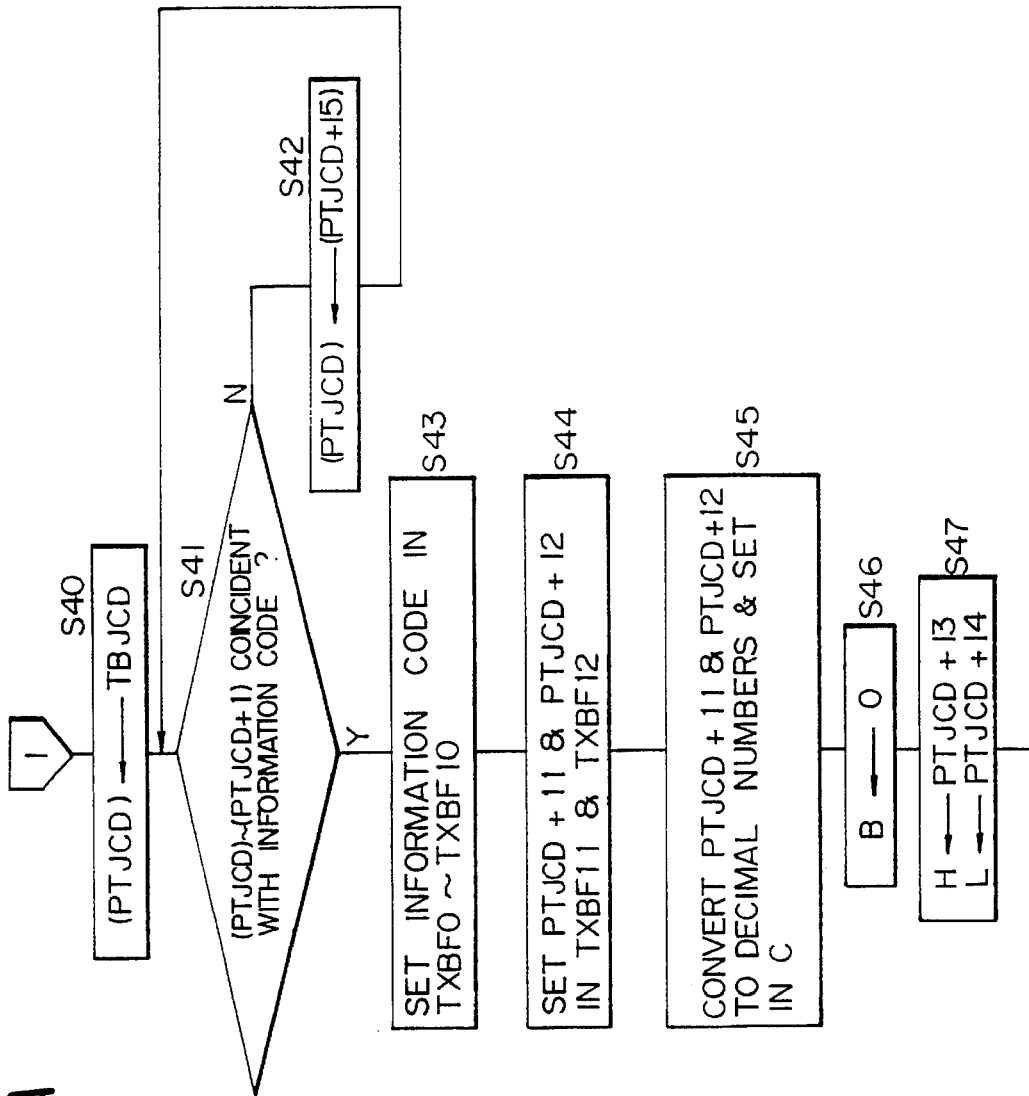
FIG. 24(A–B) is a flowchart associated with FIG. 23.
Figure 24B:
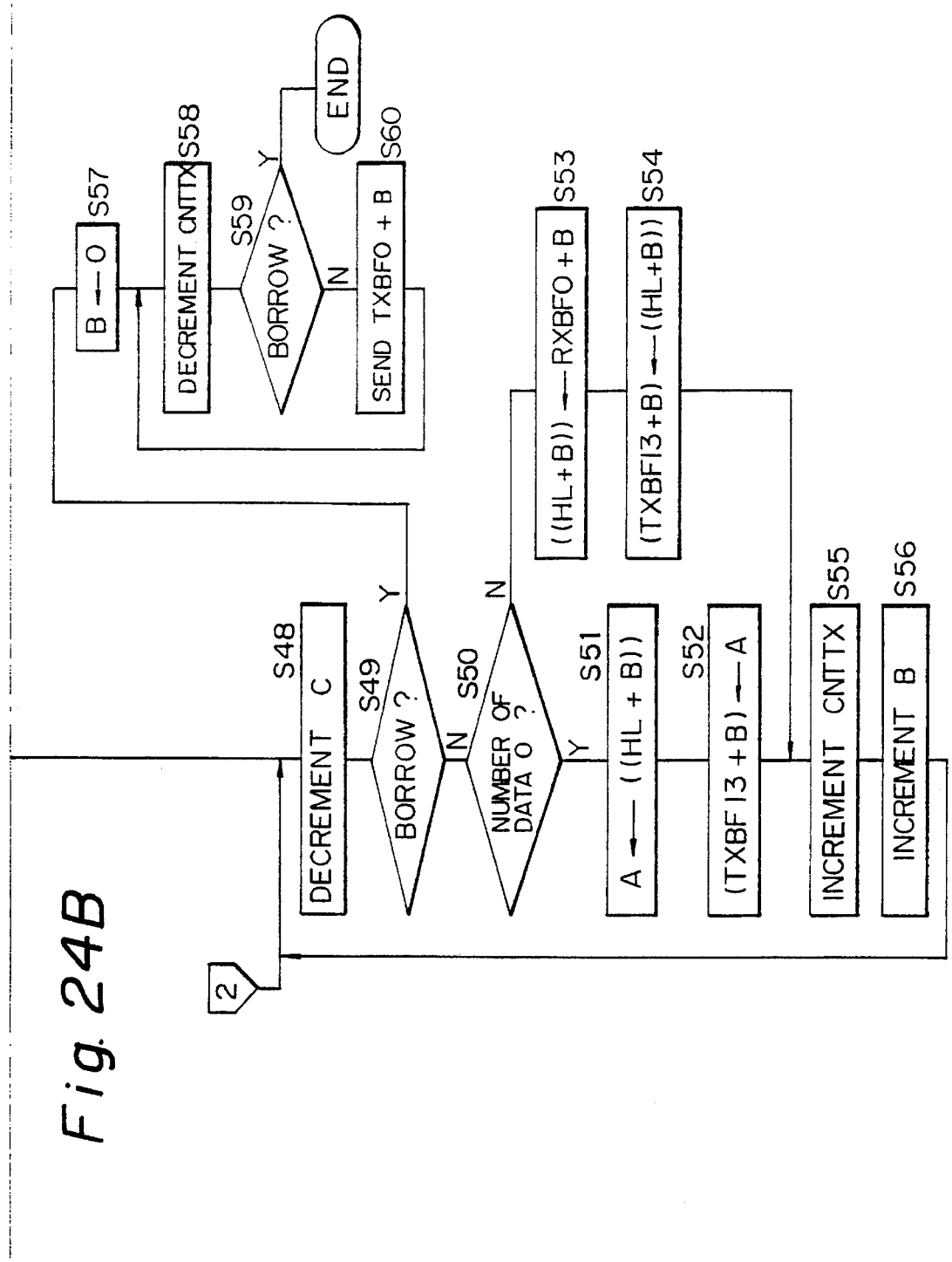

As shown in FIG. 23, in steps S21–S29, an information code, the number of data, and data are inputted. Regarding the steps S23–S26, after two bytes of data have been read, a transmit buffer counter CNTTX and a receive buffer counter CNTRX both are reset to "0". Assuming that the leading address of a receive buffer is, for example, "RXBF0", then input data is set in the buffer at "RXDF0+ CNTRX" (S28), and then the receive buffer counter CNTRX is incremented (S29). After the input of the information code, the number of data, and the data, whether or not the received data is a reply to data written by a transmission from the own station is determined (S30). If the result of this decision is positive, Y, whether or not the information code, the number of data and the data are correct is determined (S31), and then the program ends. Such a procedure is executed with, among the contents shown in FIG. 21 B, the write-in and read-out of all data, the write-in and read-out of an optics control program, and the write-in and read-out of a program.

If the received data is not a reply as determined in the step S30, whether or not a continuous transfer is to occur is determined (S32). If the answer of this step S32 is negative, the program advances to a step S40, FIG. 24, for setting the leading address TBJCD of an information code table in an information code table pointer. As shown in FIG. 46, the information code table is constituted by information codes, numbers of data, and addresses where the data are stored. When the number of data is two or more, the leading address is stored.

In a step S41, whether or not the information code and the pointer thereof (PTJCD~PTJCD+10) are coincident is determined. If they are not coincident. "15" is added to the pointer PTJCD (S42), and then whether or not the information code and the pointer thereof (PTJCD~PTJCD+10) are coincident is determined again (S41). This is repeated until the information code and the pointer thereof become coincident. When they are coincident as determined in the step S41, the information code is set in transmit data buffers TXBF0 to TXBF10 (S43). Then, the contents of the numbers of data PTJCD+11 and PTJCD+12 existing in the information code table are set in transmit data buffers TXBF11 and TXBF 12, respectively (S44).

Subsequently, the numbers of data are converted to decimal numbers and then set in a C register (S45). Thereafter, "0" is set in a B register (S46). Then, the content of the number of data PTJCD+13 is set in an H register while the content of the number of data PTJCD+14 is set in an L register (S47). Next, the C register is decremented (S48). Subsequently, in buffers TXBF11 and TXBF12, respectively (S44). steps S49–S56, the read-out of data (S51 and S52), the buffers TXBF11 nd TXBF12, respectively (S44). write-in of data (S53 and S54), the decrement of the transit buffer counter CNTTX and B register (S55 and S56), and other processing are sequentially executed until a borrow occurs.

The read-out of data is executed when the received number of data is "0" as determined in the step S50. Specifically, the content of an address indicated by the content of (HL+B) is set in an A register (S51), and then the value of the A register is set in the transmit data buffer TXBF13+B (S52). The write-in of data is effected when the received number of data is "1" as determined in the step S50. Specifically, the content of the receive buffer RXBF0+B is written to an address indicated by the content of (HL+B) (S53) and then in the transmit buffer TXBF13+B (S54). When a borrow occurs in the C buffers TXBF11 ll and TXBF12, respectively (S44) register in the step S49, "0" is set in the B register (S57), and then the receive buffer counter CNTRX is decremented (S58). The content of the transmit buffer TXBF0+B is continuously sent until a borrow occurs (S59 and S60). When a borrow occurs in the receive buffer counter CNTRX, the processing ends.

Referring again to FIG. 23, when a continuous transfer is to occur as determined in the step S32, whether or not the block "0" is received is determined (S32). Only if the block "0" is received, "0" is set in a receive block counter CNTBLK (S34), and then the leading address "TBxxx"+ CNTBLK*64 of the data to continuously transfer in an HL register (S35). The leading address "TBxxx" is representative of the leading address of, for example, a RAM 1003 or that of program addresses. Subsequently, the information code is set in the transmit buffers TXBF0 to TXBF10 (S36). ASCII data "36(H)" and "34(H)" representative of the number of data "64" are set in the transmit data buffers TXBF11 and TXBF12, respectively (S37). Subsequently, "64" is set in the C register (S38) while "0" is set in the B register (S39). This is followed by the step 48 and successive steps, FIG. 24, to read, write and transmit data. In the case of continuous transfer, the embodiment directly transfers data without converting it to ASCII code.

The data of the copier 1 to be interchanged with the control device 141 are ASCII data. Hence, when the operation time, for example, of the copier 1 is 4,321 hours, "34H" , "33H" "32H" and "31H" are stored in data areas DONTM1, DONTM2, DONTM3, and DONTM4, respectively. Therefore, to count the operation time of the copier 1, when one hour expires, another data area DONTM is incremented, the data of this area DONTM is again converted to ASCII data, and then the ASCII data is set in the areas CONTM1 to DONTM4. Such processing is also true with other data.

As stated above, regarding the communication between the control device 141 and the copier 1, an information code of data and the number of data "0" are sent in the event of read-out while an information code of data, the number of data and data are sent in the event of write-in. However, this will not be referred to for simplicity hereinafter.

Figure 25:
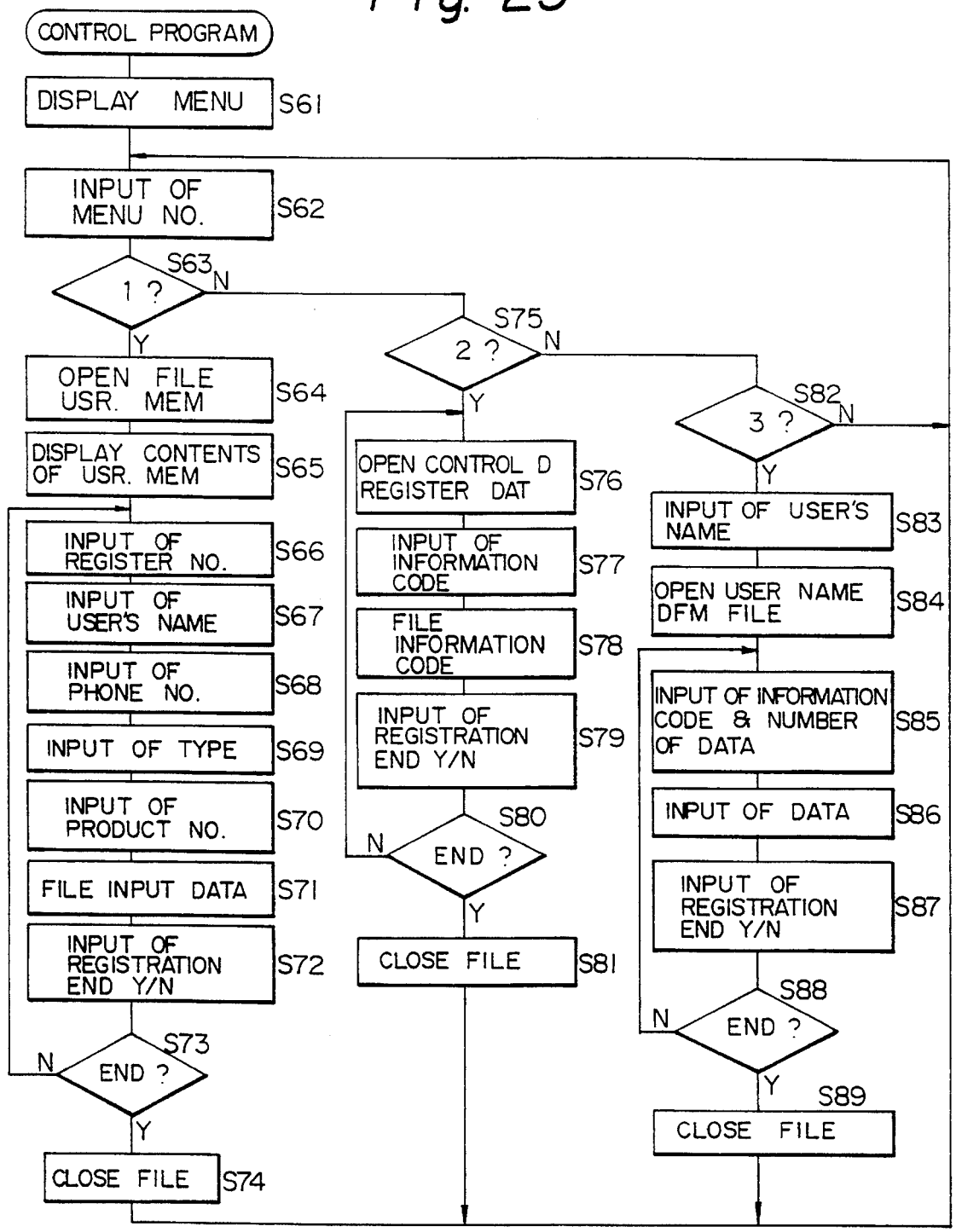
FIG. 25 is a flowchart representative of a control program of the control device.
Figure 29:
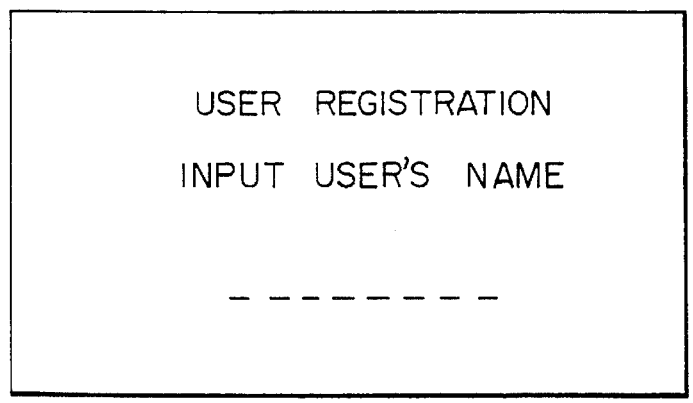
Figure 30:
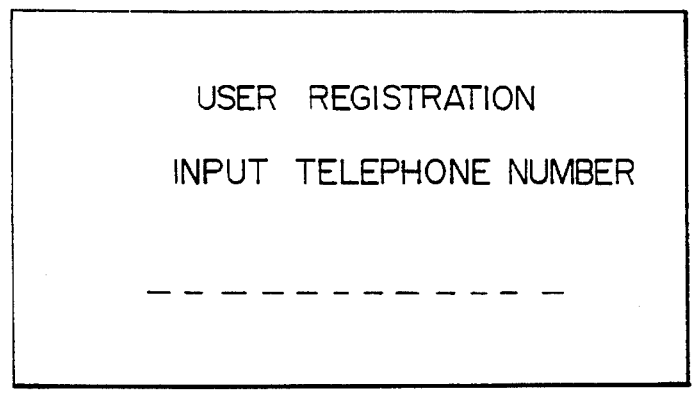
Figure 31:
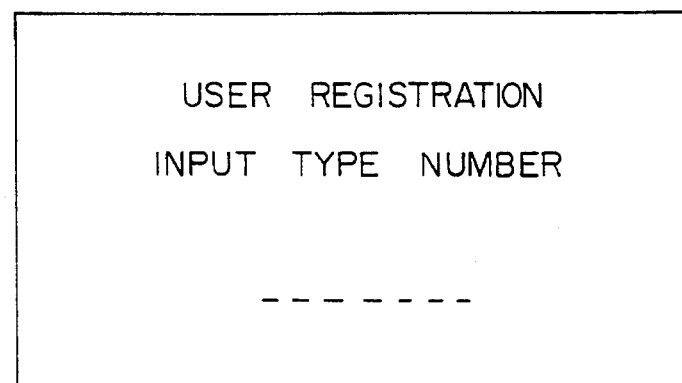
Figure 32:
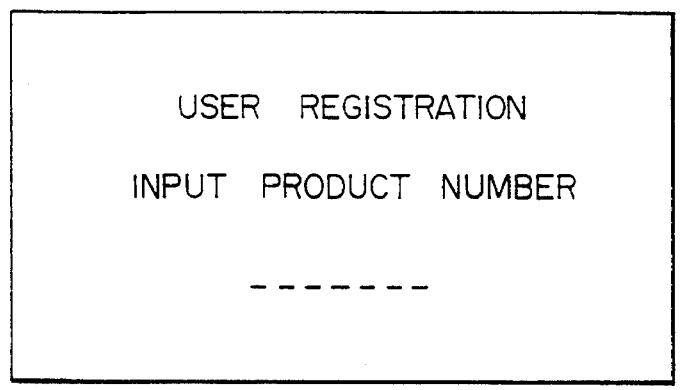

A reference will be made to FIGS. 25–35 for describing the usual operation of the control device 14. As shown in FIG. 25, the control device 141 displays a menu picture shown in FIG. 26 on a display 163, FIG. 14. In this condition, the control device 141 allows a menu No to be entered. A menu number "1" is representative of a menu for registering users to be dealt with by the control device 141. With this menu, it is possible to register the type, product number and so forth of the copier 1 before shipment. A file name is implemented as a name, e.g., USR.MEM. When the menu number is inputted (S62), the control device 141 opens a file USR.MEM (S63 and S64) and then displays the contents of the file (S65), as shown in FIG. 27. In this condition, the control device 141 allows a register (S68), type number (S66), user's name (S67), telephone number of machine (S69) and product number (S70) to be inputted, while displaying corresponding pictures shown in FIGS. 28–32.

Figure 33:
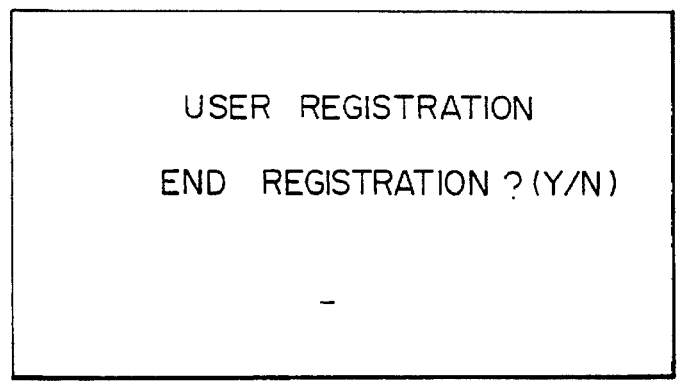

Subsequently, the control device 141 stores the input data in a MEM file (S71) and then displays a picture of FIG. 33 inquiring whether or not to end the registration (Y/N) (S72). When "Y" is inputted, the control device 141 closes the file and ends the registration (S73 and S74) and returns to the step S62. When "N" is inputted, the program returns to the step S66 to display the picture of FIG. 28, thereby allowing another user to be registered.

Assume that the USR.MEM file includes the type code and the product number of the copier 1 represented by characters "FT4060" and "1234567", respectively. Then, as shown in FIG. 27, there appears on the display 163 "00001; A Copy Service; 37771234; FT4060; 123456". Here, "00001" heading the information is representative of the register number, the following "A Copy Service" is representative of the user's name, and the subsequent "37771234" is representative of a telephone number; a semicolon is used to divide nearby items.

Control data registration associated with the menu number "2" (S75–S81) and initial mode registration associated with the menu number "3" (S82–S89) will be described specifically later.

Figure 39:
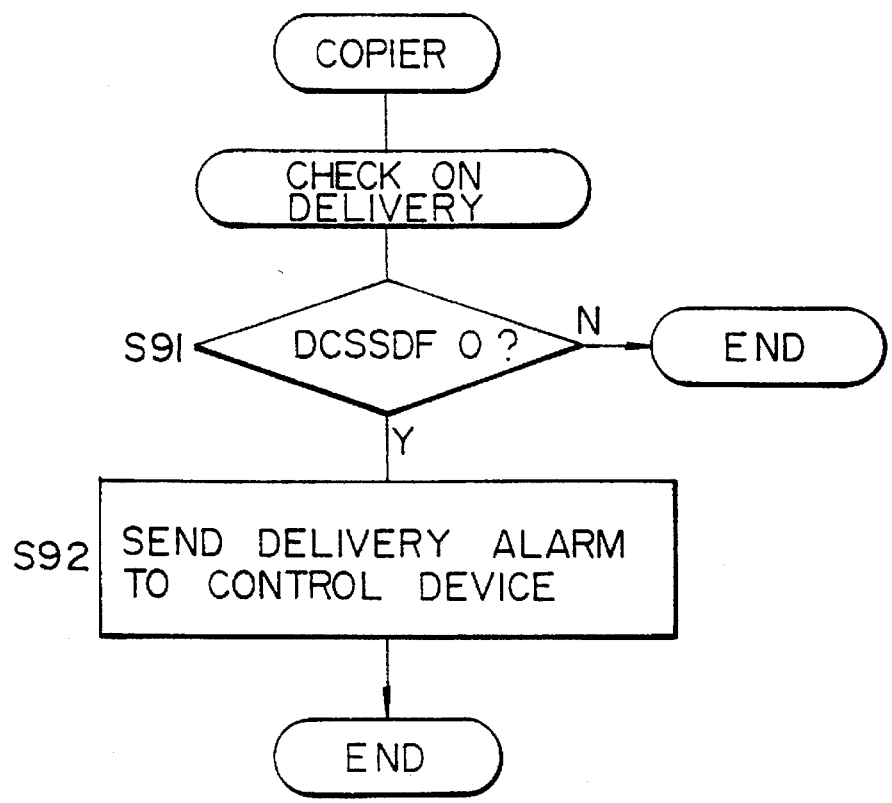
FIG. 39 is a flowchart indicative of the operation of the copier at the time of delivery.

Referring to FIG. 39, control to be executed at the time of delivery of the copier 1 will be described. At the time of delivery, initial data transmission data indicative of whether or not all the data associated with the copier 1 have been stored in the control device 141 is stored in a predetermined address DCSSDF of the nonvolatile RAM 102. "0" stored in the address DCSSDF shows that all the data have not been stored in the control device 141 while "1" shows that all the data have been stored. Specifically, when the copier 1 is installed at the user's station, it is connected to the control device 1 by the telephone line 142 and CCU 144, as shown in FIG. 1. As the power switch of the copier 1 is turned on, the CPU 100 of the copier 1 determines the content of the address DCSSDF (S91) and, if it is "0", sends the product number to the control device 141 together with an installation alarm (S92). The installation alarm is a signal which causes the copier 1 to start on an alarm transmission. If the content of the address DCSDF is "1", the CPU 100 ends the program.

Figure 40:
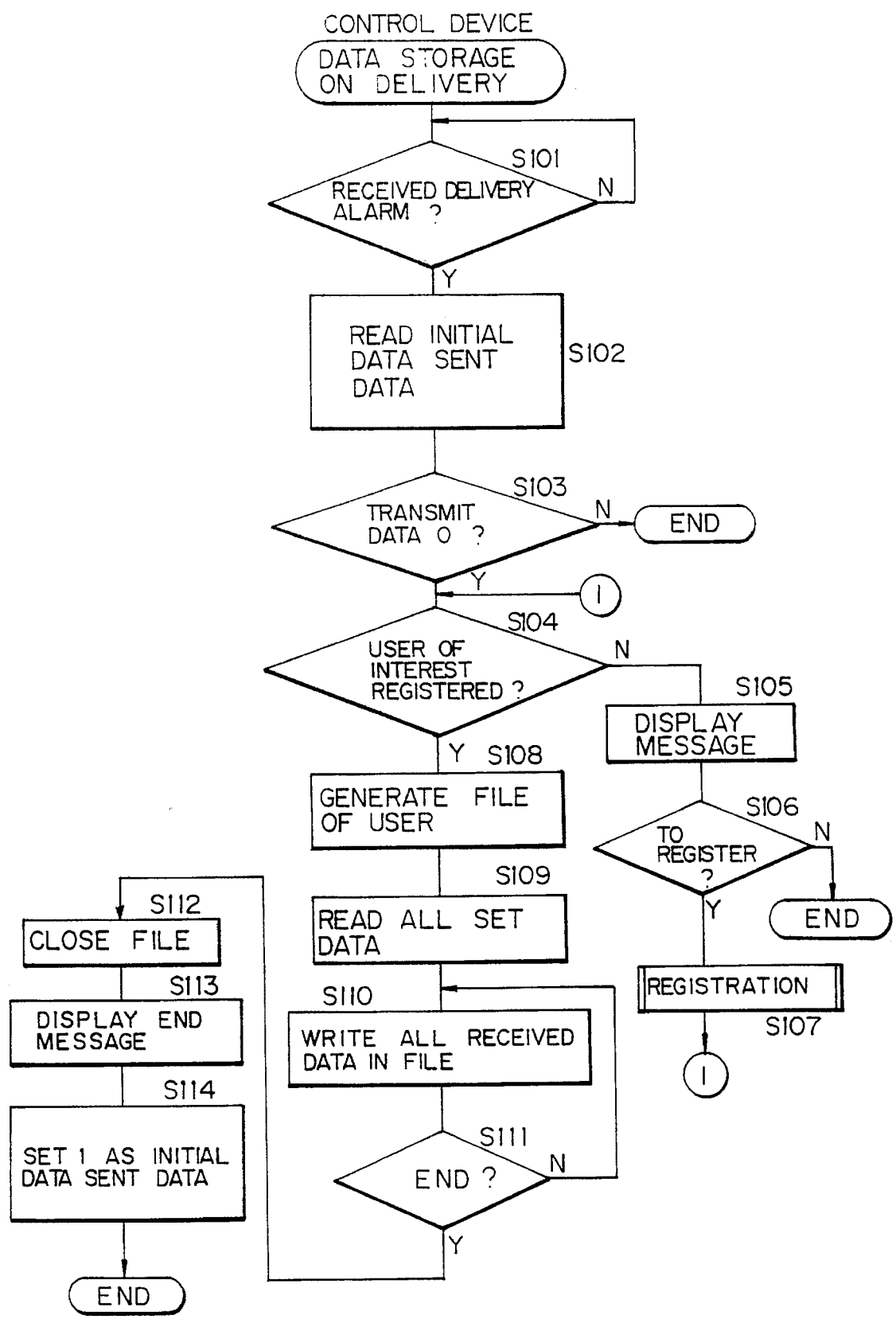
FIG. 40 is a flowchart indicative of the operation of the control device at the time of delivery.

How the control device 141 operates at the time of delivery of the copier 1 will be described with reference to FIG. 40. As shown, on receiving the installation alarm, the control device 141 reads the initial data transmission data (S101 and S102) and then checks it (S103). If the data is "1", the control device 141 ends the processing while, if it is "0", the control device 141 executes a step S104 and successive steps. Specifically, the control device 141 opens the previously stated file USR.MEM and then determines whether or not the user matching the received type code and product number is registered (S104). If the answer of this step S104 is negative, the control device 141 displays such a result (S105). In this case, an arrangement may be made such that the program jumps to the user registration control steps S63–S74, FIG. 25 (S106 and S107). If the user is registered as determined in the step S104, the control device 1411 automatically determines a file name on the basis of the user's name stored in the file USR.MEM, generates a file of the file name, and then opens (S108). For example, assuming A Copy Service, the control device 141 generates a file "A Copy Service. DTF"; "DTF" is an expander of the file name and indicative of a data file generated at the time of delivery.

Subsequently, the control device 141 writes the current date in the file, reads all the data relating to the values set in the copier 141 (S109), and then stores the received information code and data in the file (S110). On storing all the data (S111), the control device 141 closes the file (S112), displays the file name together with an end message, e.g., "Filed installation data" (S113), and then writes "1" as the initial data transmission data (S114).

The file "A Copy Service. DTF" generated by the above procedure may be represented by characters "19920314; 51050080101/01/00; 51010130101/01/00; . . . ". Here, "19920314" heading the file is indicative of the date, "51050080101" is an information code, "01" is the number of data, and "00" is the data. The information code, the number of data and the data are divided by "/" while the others are divided b";".

During the data up-loading at the time of installation, the embodiment causes the control device 141 to read data set in the copier 1 in response to the installation alarm. Alternatively, the copier 1 may send all the data thereof to the control device 141 after the installation alarm. Specifically, in such an alternative procedure, the copier 1 sends the installation alarm and then the type code, product number, and data group stored in a memory. On receiving the installation alarm, the control device 141 searches for the user stored in the file USR.MEM and matching the following type code and product number, automatically generates a file, e.g., "A Copy Service. DTF", opens it, and then executes the above-described control. Further, control data may be registered at the control device 141.

Figure 34:
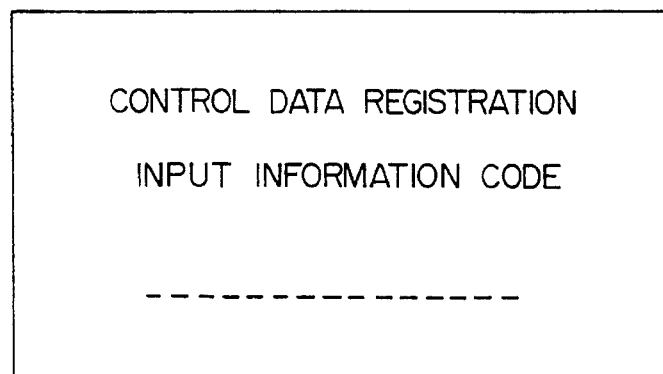
Figure 38:
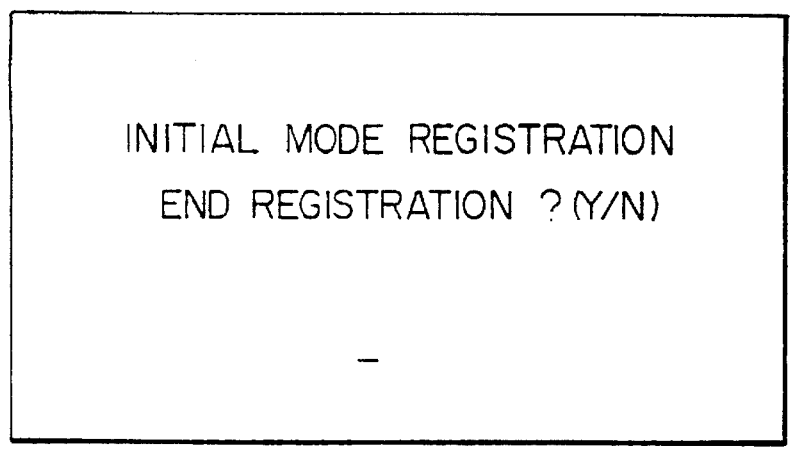

Referring to FIGS. 34 and 35 as well as to FIG. 25, control data registration associated with the menu number "2" will be described. When the control data registration designated by the menu number "2" is selected, the control device 141 opens a file storing registered control data (S75 and S76). At this instant, the file name is determined as "CONTROL D REGISTER. DAT" beforehand. The control device 141 requests the operator to enter an information code by use of a picture shown in FIG. 34. As the operator enters an information code (S77), the control device 141 stores it in the file (S78) and then inquires the operator whether or not to end the registration (Y/N) by use of a picture shown in FIG. 35 (S79). When "Y" is entered, the control device 141 ends the registration and closes the file (S80 and S81). If "N" is entered, the program returns to the step S76 to show the picture of FIG. 34 again.

When only the data storing the file "CONTROL D REGISTER. DAT" should be managed, an information code storing the file may be simply sent to the end of the file at the time of installation, instead of calling all the data set in the copier 1. Further, whether or not all the data of the copier 1 are stored in the control device 141 may be determined by using a memory built in the control device 141. This memory should preferably be implemented by a nonvolatile memory, e.g., a floppy disk or a hard disk.

Figure 41:
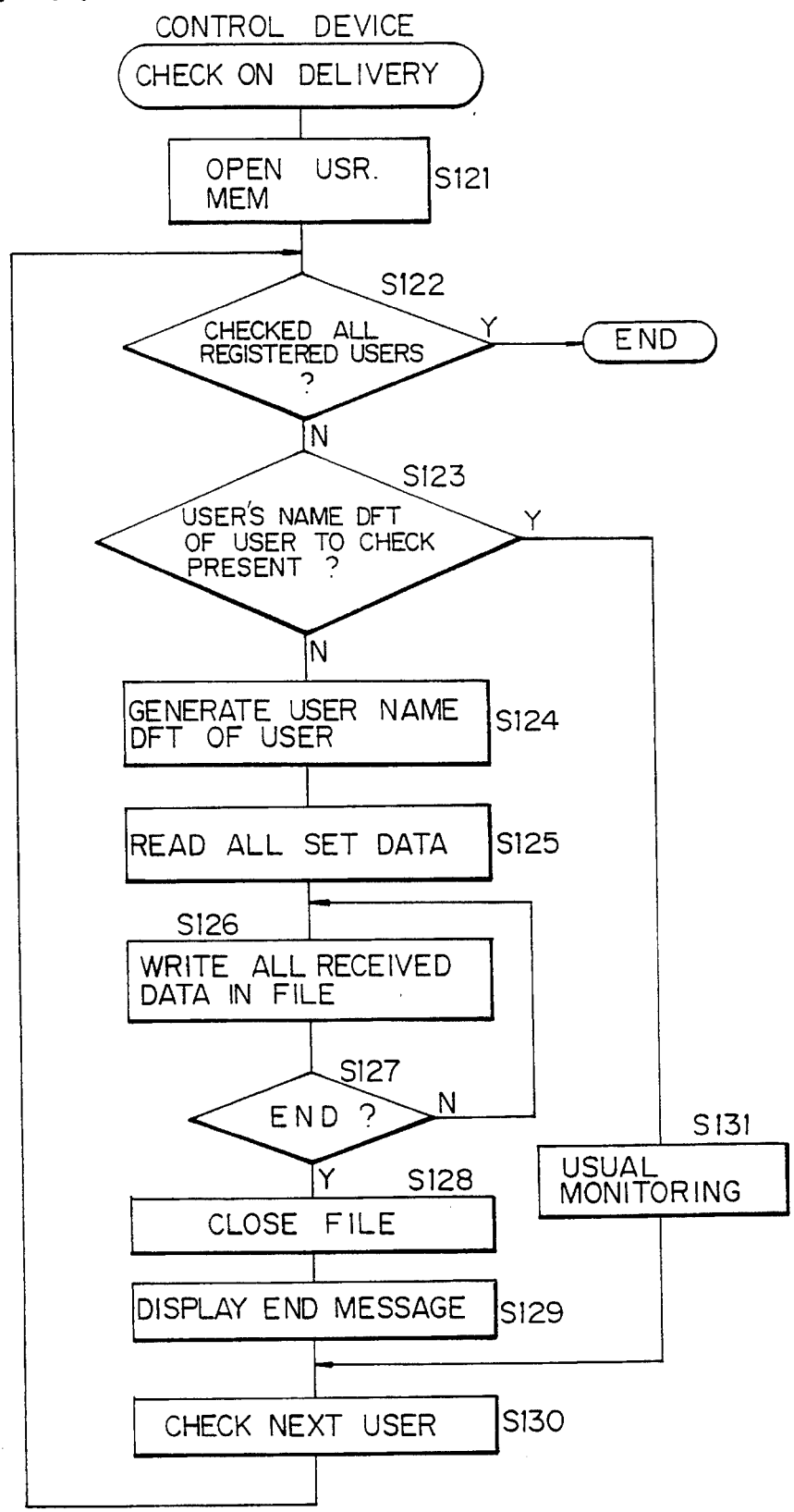
FIG. 41 is a flowchart representative of a modified operation of the control device at the time of delivery.

The operation of the control device 141 in the above condition will be described with reference to FIG. 41. To begin with, in steps S121–S123, the control device 141 determines whether or not the initial delivery data file storing the names of all the users is present in order to monitor the statuses of all the users registered at the file USR.MEM. This is effected, for example. during the night of the date of delivery. For example, the control device 141 searches for the data file "A COPY SERVICE. DFT" associated with "A Copy Service" which is registered at the file "USR.MEM" (S123). When the data file of interest is present, the control device 141 executes usual monitor processing (a copy counter and whether or not a state analogous to an error has occurred on the day) (S131). If such a file is absent, the control device 141 determines that the copier 1 has just been delivered, generates a file (S124), reads all the data of the copier 1 (S125), and then stores them in "A COPY SERVICE. DFT" (S126). On storing all the data (S127), the control device 141 closes the file (S128) and then displays the file name generated in the step S129 together with an end message, e.g., "Stored delivery data" (S128). Subsequently, the control device 141 executes the above procedure with the next registered user (S130), returns to the step S122, and ends this control on completing it with all the registered users. Again, only the data stored in "CONTROL D REGISTER. DAT" may be up-loaded. Why the control device 141 executes the above processing during the night is that the copier 1 is used less frequency than during the day. The processing is automatically executed by the timepiece function of the control device 141. Alternatively, when the copier 1 has a timepiece, the copier 1 may send an alarm to the control device 141 on a predetermined day. Further, when the alarm is to be sent, the copier ID code which the CCU 144 adds may be used in place of the type code and product number to be sent by the copier 1. A printer 406, FIG. 14, is incorporated in the control device 141. Hence, the contents of the file may be printed by the printer to provide more easy-to-see data than with a display. In addition, this file may be loaded by a table calculation program so as to print an easy-to-see table, as shown in FIG. 45 specifically.

A reference will be made to FIGS. 36–37, as well as to FIG. 25, for describing control which allows the control device to determine the time of delivery and automatically down-load initial mode data to the copier 1. The control device 141 usually displays the control menu shown in FIG. 26, as stated earlier. When the menu number "3" is selected, the control device 141 displays a picture shown in FIG. 36 to inquire the name of the user whose initial modes are to be registered (S82 and S83). As the user's name is entered, the control device 141 searches for a file "USER'S NAME. DFT" (S84), opens it, and then inquires an information code by use of a picture shown in FIG. 37. This file is given with a particular name, e.g., "A COPY SERVICE. DFM"; the expander is indicative of the registration file storing initial modes. If such a file is absent, the control device 141 generates it and opens it. Subsequently, as the information code indicative of the initial mode data, the number of data and data are entered (S85 and S86), the control device 141 inquires whether or not to end the initial modes (Y/N) by use of a picture shown in FIG. 38. If "Y" is entered, the control device 141 ends the registration and closes the file (S88 and S89) while, if "N" is entered, it returns to the step S84 to display the picture of FIG. 37 again.

The initial mode registration file stores an information code corresponding to the mode selection data, the number of data, and data in sequence. The information code and the number of data axe divided by "/" while the others are divided by ";". When the file "A COPY SERVICE. DFM" stores, for example, an initial mode for muting a buzzer and an initial mode for decrementing the copy number display by 1 at a time, as desired by the user, they are represented by characters "51050080101/01;51010130101/01/01; . . . " by way of example.

Figure 42:
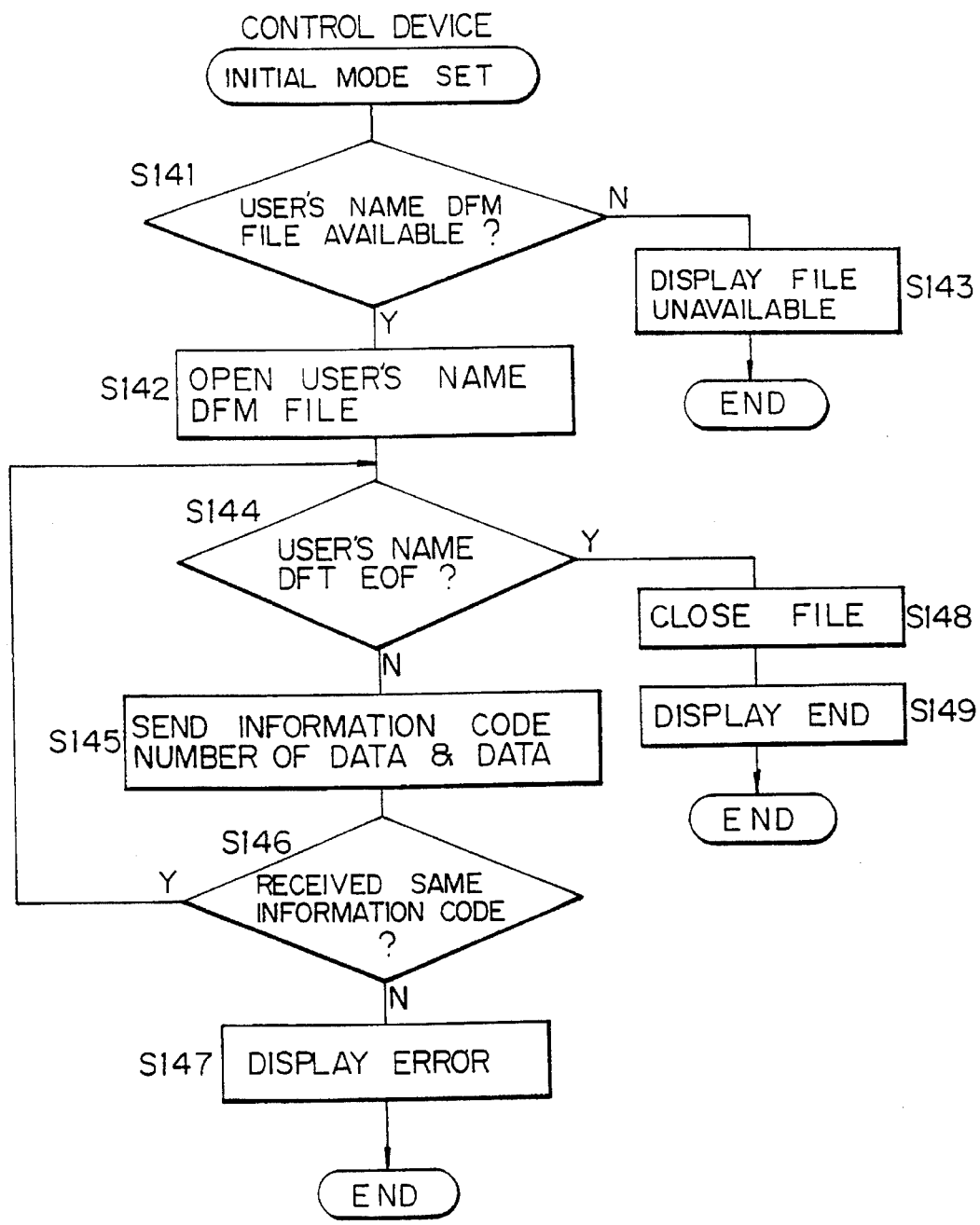
FIG. 42 is a flowchart representative of the initial mode set control of the control device.

At the time of delivery, the initial modes are set by a procedure which will be described with reference to FIG. 42. After the previously described data up-loading at the time of delivery, the control device 141 searches for the file "A COPY SERVICE. DFM" (S141) and, if it is present, opens it (S142). If this file is absent, the control device 141 displays a message and waits (S143). After opening the file, the control device 141 sequentially reads the contents of the file and sends them to the copier 1 while deleting the division mark "/" (S145). 0n reading the division mark ";", the control device 141 does not send the data and waits until a code identical with the information code sent has been returned (S146). If the code identical with the information code is not received, the control device 141 displays an error (S147) and then ends this procedure.

The control device 141 executes the above processing up to the end of the file "A COPY SERVICE. DFM". As the file ends, the control device 141 closes the file (S144 and S148), displays an end message (S149), and then ends this processing. On receiving the data, the copier 1 rewrites corresponding initial mode data. For example, a mode data "1" for muting the buzzer and a decrement mode data meant for the copy counter are written to areas DMBZOF and DMCPCT, respectively. In this condition, when the power switch of the copier 1 is ON, the copier 1 references the area DMBZOF and, if it is "1", mutes the buzzer thereof. Also, when the copy start key is pressed, the copier 1 references the area DMCPCT and, if it is "1", displays the set number of copies on the copy number display and sequentially decrements it by 1 at a time.

Figure 43A:
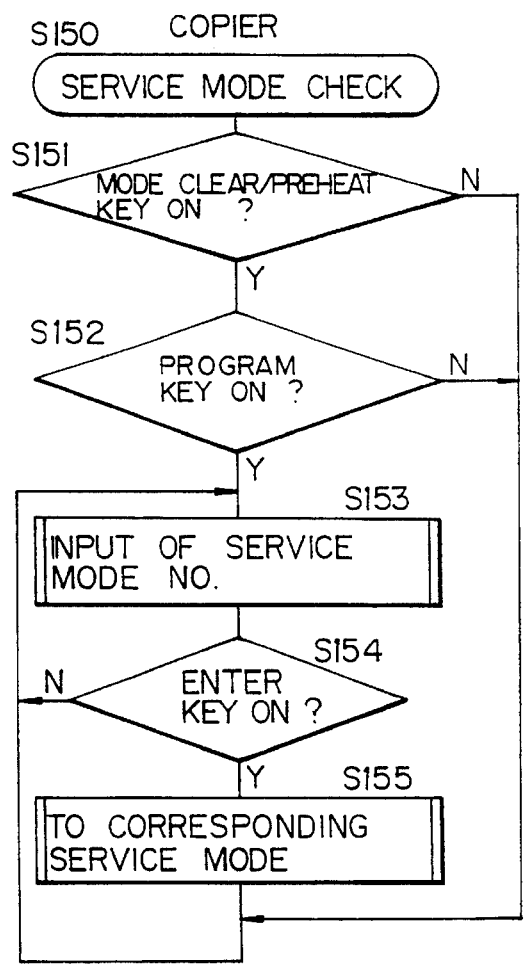
FIGS. 43A and 43B are flowcharts demonstrating the memory clear procedure of the copier.
Figure 43B:
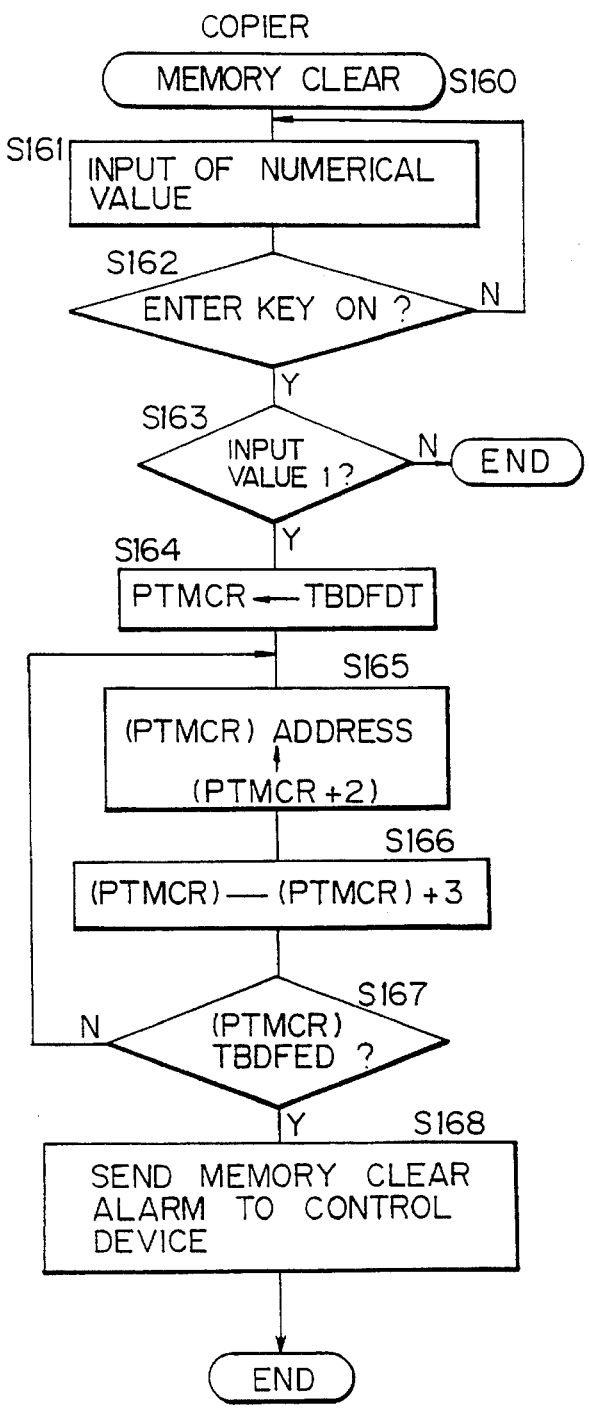

Referring to FIGS. 43A and 43B, how data is downloaded from the control device 141 to the copier 1 when the memory of the copier 1 is cleared will be described. As shown in FIG. 43A, in a service mode check flow S150, the main switch of the copier 1 is turned on (S152) with the mode clear/preheat key 189 and program key 153 being pressed (S151 and S152), thereby setting up a service mode. In this mode, a service mode number is entered on the numeral keys 156 (S153), and then the enter key 155 is pressed. Then, the copier executes particular service mode processing associated with each of the service mode numbers. Assume that a memory clear number "100" is set as a service mode number beforehand. Then, when the number "100" is entered and then the enter key 155 is pressed, a memory clear set mode flow S160 shown in FIG. 43B is executed. At this instant, memory clear processing occurs in response to the numeral "1" and enter key 155 while the program returns to the service number input state in response to the numeral "0" and enter key 155 (S161–S163). In the memory clear processing, the copier 1 rewrites the memory thereof by referencing a default data table. As shown in FIG. 44, the default data table is stored in the RAM 102 and made up of the addresses and initial values of data to rewrite; both the address and the data have one byte.

As shown in FIG. 43B, the copier 1 sets the leading address TBTFDT of the default data table in a memory clear pointer PTMCR (S164). In FIG. 44, the content of the memory clear address pointer PTMCR is indicative of the bias data address DBBIAS by way of example. The copier 1 writes bias data (content of PTMCR+2) "80H" in the address indicated by the content of the pointer PTMCR (S165) and then adds "3" to the content of the pointer PTMCR (S166). The copier 1 repeats these steps until the content of the pointer PTMCR becomes equal to the address TBDFED and then ends the memory clear processing (S167). Finally, the copier 1 sends a memory clear alarm, type code and product number to the control device 141.

On receiving the memory clear alarm, the control device 141 opens the user registration data file "USR.MEM" to search for the user on the basis of the type code and product number. Then, the control device 141 searches for the data file generated at the time of installation, e.g., "A COPY SERVICE. DFT". If this file is not available, the control device 141 displays a suitable message, e.g., "A COPY SERVICE DFT not available", energizes a buzzer several times, and waits. If such a file is available, the control device 141 opens it, sequentially reads the contents, and sends them to the copier 1. This procedure is executed when the main switch is ON in the same manner as when the control device 141 sets initial modes.

This embodiment down-loads data from the control device 141 to the copier 1 when the memory of the copier is cleared and, therefore, achieves the following advantages. Some modern copiers 1 switch the power source of the RAM 102 from a main power source to, for example, a lithium battery when the power source is turned off, so that data stored in the RAM 102 may not be lost. In this type of copier 1, when the control board has failed, it is bodily replaced with another in order to simplify repair and reduce maintenance cost. However, if the data stored in the RAM 102 which is mounted on the control board is not transferred to a new control board, it is necessary to set various modes of the copier 1 all over again and readjust the image quality. By contrast, when the control board is replaced, the embodiment executes the memory clear processing for setting image forming data and initial modes in default values in the service mode. As a result, data generated at the time of delivery of the copier 1 are automatically down-loaded to eliminate troublesome operations including the above-mentioned mode resetting and image quality readjustment.

Further, since the embodiment monitors the copier 1 during the night by up-loading the data of the copier 1, the latest data can be down-loaded in the event of replacement of the control board. Control for effecting this will not be described specifically since all that is required is to replace the data file of the copier generated at the time of delivery and to be down-loaded at the time of memory clearing with the latest data.

In addition, the control device 141 can be implemented by a personal computer, a work station or particular equipment developed to control the copier 1. Therefore, there can be executed processing which would be too heavy to be executed by the copier 1 alone.

Figure 47:
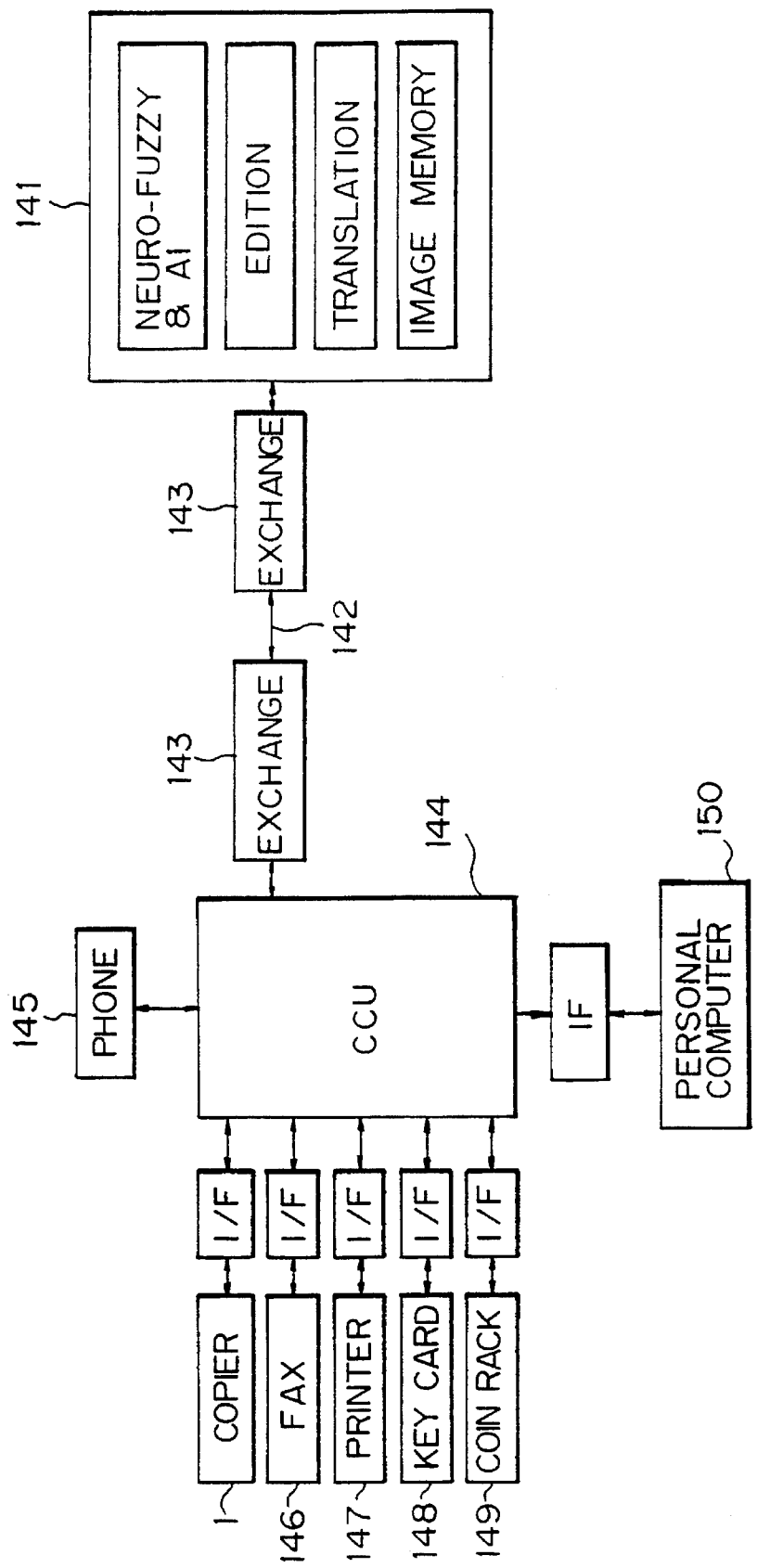
FIG. 47 is a block diagram schematically showing an alternative embodiment of the present invention.

Referring to FIG. 47, an alternative embodiment of the present invention will be described. In this embodiment, the same or similar constituents as or to those of the previous embodiment are designated by like reference numerals, and a detailed description will not be made to avoid redundancy. With this embodiment, it is possible to calculate, for example, image forming condition data up-loaded from the copier 1 to the control device 141 by neuro-fuzzy control and AI (Artificial Intelligence) control and then down-load the results to the copier 1 or to effect fault diagnosis with the copier 1. Further, when the copier 1 is a digital copier of which photoelectrically transduces a document image and processes the resulting digital signal, it is possible to up- or down-load image data so as to edit and manipulate an image, translate a document or offer an image service.

A facsimile terminal 146, a printer 147, a key card 148, a coil rack 149 and a personal computer 150 may be connected to the CCU 144 in addition to the copier 1. When part or all of the programs owned by the control device 141 are loaded in the personal computer 150, the serviceman can supervise the copier at the use's side by carrying the personal computer 150. While the embodiment allows the control device 141 and copier 1 to interchange data via the CCU 144 and exchange 143, the functions of the CCU 144 and exchange 143 may be incorporated in the control device 141 and copier 1. Further, the control device 141 and copier 1 may be connected by a cable in place of the telephone line 142 or communicate with each other by radio or light.

A reference will be made to FIGS. 48–50 for describing other functions available with the present invention.

Figure 48:
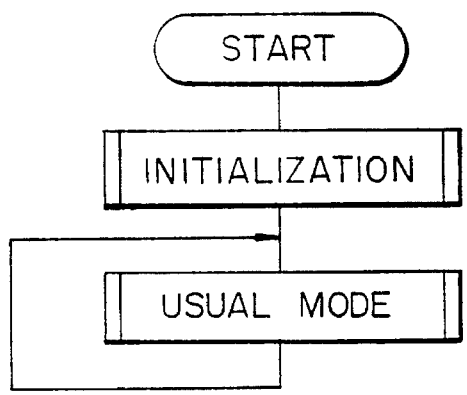
FIG. 48 is a flowchart demonstrating a main routine to be executed by a CPU shown in FIG. 12.

The CPU 100 of the copier 1 shown in FIGS. 1 and 12 executes a main flow shown in FIG. 48 after the power switch of the copier 1 has been turned on. Specifically, the CPU 100 executes initialization and then processing in a usual mode. Apart of this flow, the CPU 100 communicates with the control device 141 by interrupt processing every time a communication request and an auto-call request is generated, although not shown in the figures.

In the usual mode, the CPU 100 executes image formation and various kinds of automatic adjustment depending on conditions. The following description will concentrate on automatic VL adjustment by way of example. The automatic VL adjustment refers to the automatic adjustment of the lamp voltage for reducing, for example, the contamination of the background ascribable to the fall of the sensitivity of the photoconductive drum 35 due to aging, change in the sensitivity of the drum 35 due to low temperature, contamination of the optics, decrease in the quantity of light due to the deterioration of the lamp, etc. In practice, when the power source is turned on, the CPU 100 executes a specific automatic VL adjustment shown shown in FIG. 50 by calling it from the main routine. Specifically, assume that correction using the residual voltage VR is to be performed when the temperature is low. Then, when the temperature of the drum 35 is higher than 25 degrees or when a predetermined number of copies have been produced, the potential sensor 39, FIGS. 2 and 8, senses the residual potential VR of the drum 35. In response to the output of the sensor 39, the CPU 100 determines whether or not a copying operation has ended. If a copying operation has ended, the CPU 100 starts on VL detection. For VL detection, the CPLI 100 causes the first scanner 24 to move to below the VL pattern 124, FIG. 3. The resulting reflection from the VL pattern 124 is focused onto the drum 35 having been uniformly charged by the main charger 37, thereby forming a VL pattern on the drum 35. The potential sensor 39 senses the surface potential (white area potential VL) of the VL pattern and corrects the voltage to the lamp 22 on the basis of the ratio of the potential VL to a reference lamp voltage.

Figure 49:
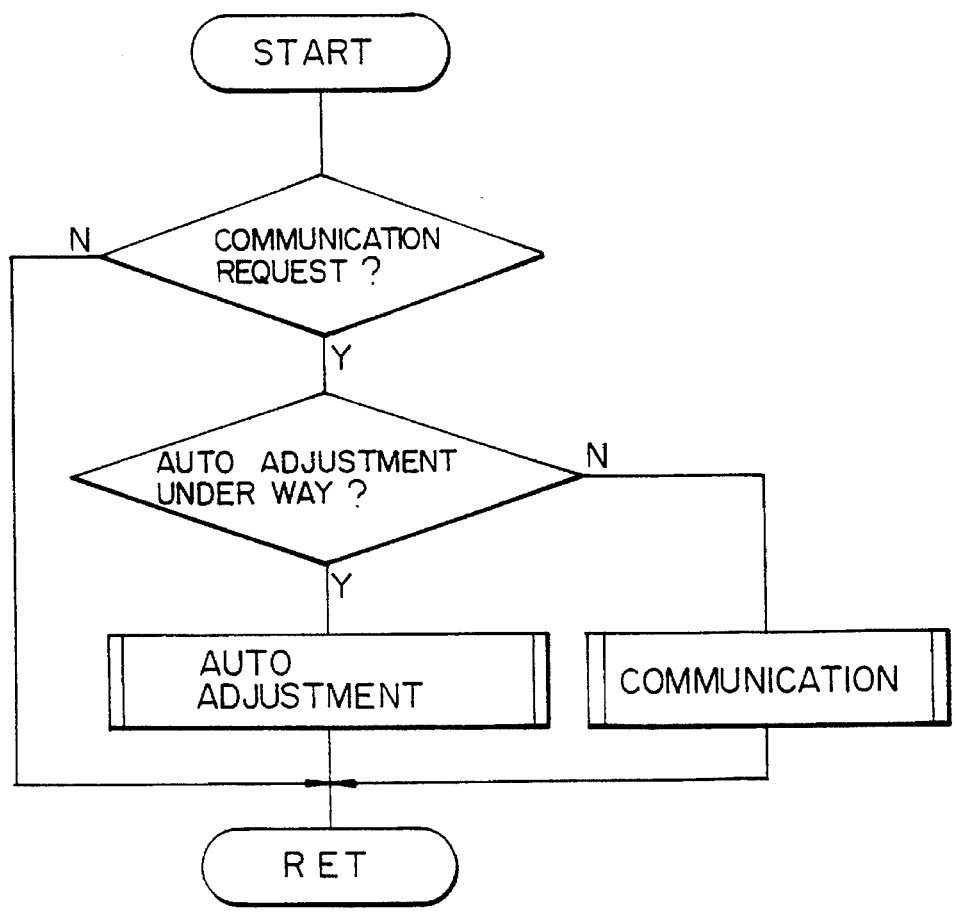
FIG. 49 is a flowchart representative of part of usual mode processing of FIG. 48 which relates to a communication with the control device.
Figure 50:
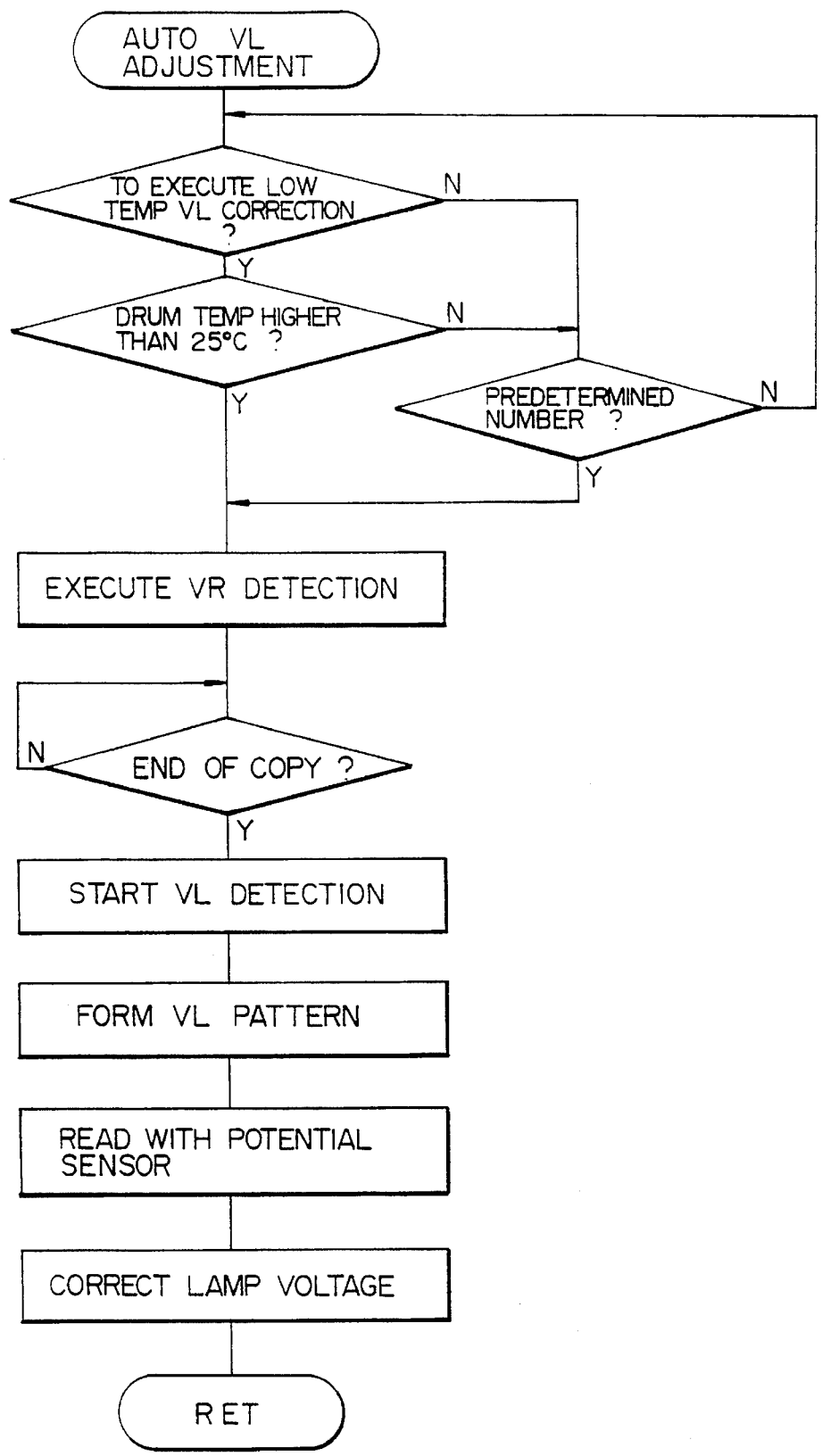
FIG. 50 is a flowchart representative of an automatic VL adjustment procedure also included in the usual mode processing.

FIG. 49 shows part of the processing in the usual mode which relates to the communication of the copier 1 with the control device 141. When the control device 141 generates a communication request. the CPU 100 determines whether or automatic adjustment, including the above-stated automatic VL adjustment, is under way. If the adjustment is under way, the CPU 100 continues the adjustment while inhibiting communication. If the adjustment is not under way, the CPU 100 executes a communication with the control device 141 and then returns. If image formation is in progress when the transmission request is generated, the CPU 100 also continues the image formation while inhibiting communication.

Another function available with the present invention will be described hereinafter. Since the function to be described can be implemented by the same hardware as the previous embodiments, the hardware will not be shown or described. The communication between the control device 141 and the copier 1 should preferably be held in the time zone in which the telephone line 142 is not frequently occupied. For this purpose, the human body sensor 114, FIG. 12, is provided on the front end of the copier 1 and plays the role of deciding means. This will be described with reference to FIG. 51.

Figure 51:
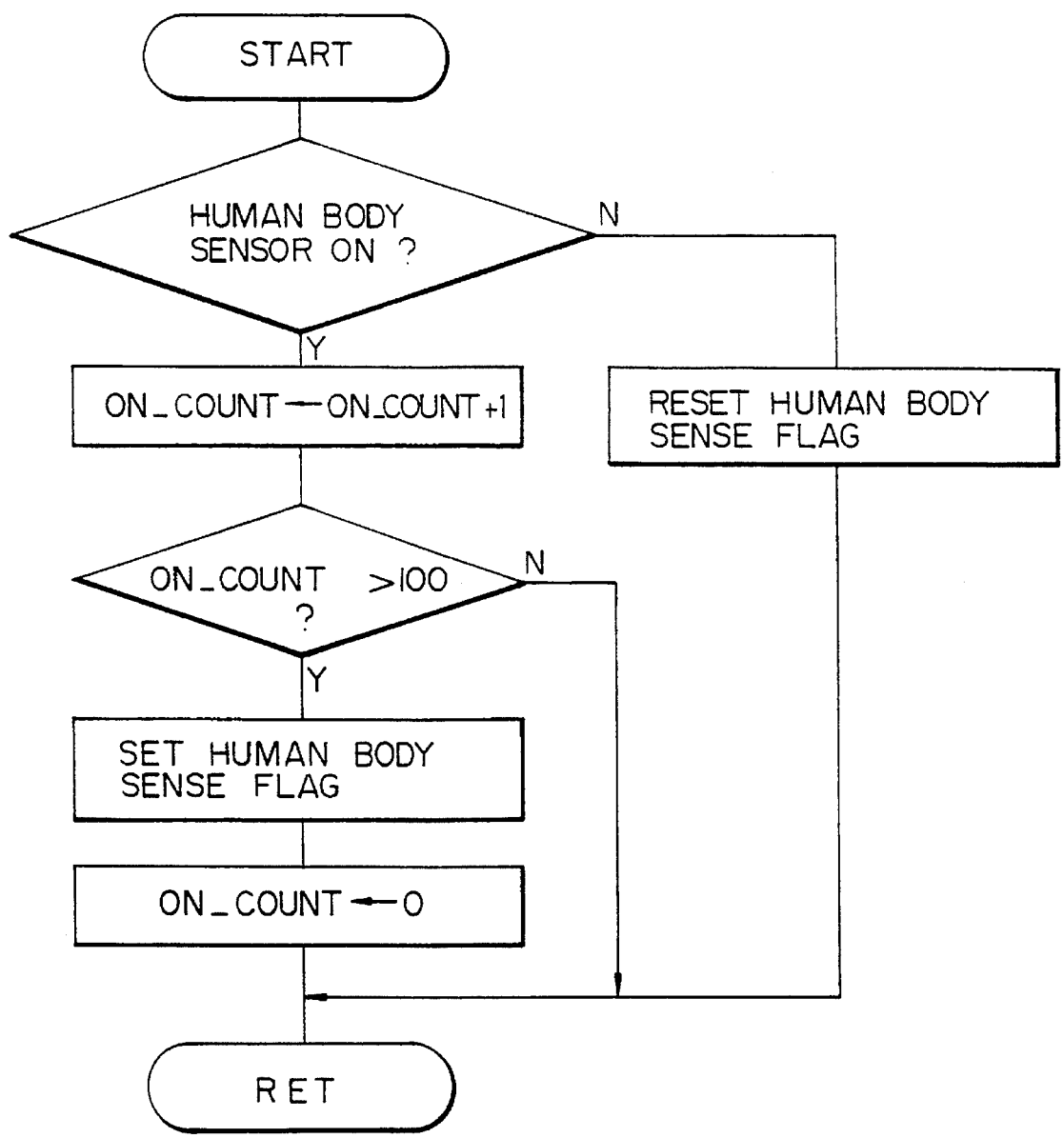
FIG. 51 is a flowchart representative of human body sense processing to be executed by the CPU of the copier in another alternative embodiment of the present invention.

As shown in FIG. 51, the CPU 100 of the copier 1 determines whether or not the sensor 114 has turned on and, if it has not turned on, resets a human body sense flag to "0" and then returns. When the sensor 114 has turned on, the CPU 100 increments a human body counter ON_COUNT by 1. Then, the CPU 100 determines whether or not the count of the counter ON_COUNT has exceeded a predetermined value ("100" in the figure). If the count is short of the predetermined value, the CPU 100 returns; if otherwise, it sets the human body sense flag to "1", clears the counter ON_COUNT to "0", and the returns. By so sensing a human body with reference to the flag, it is possible to prevent persons simply walking past the copier 1 from being sensed.

Figure 52:
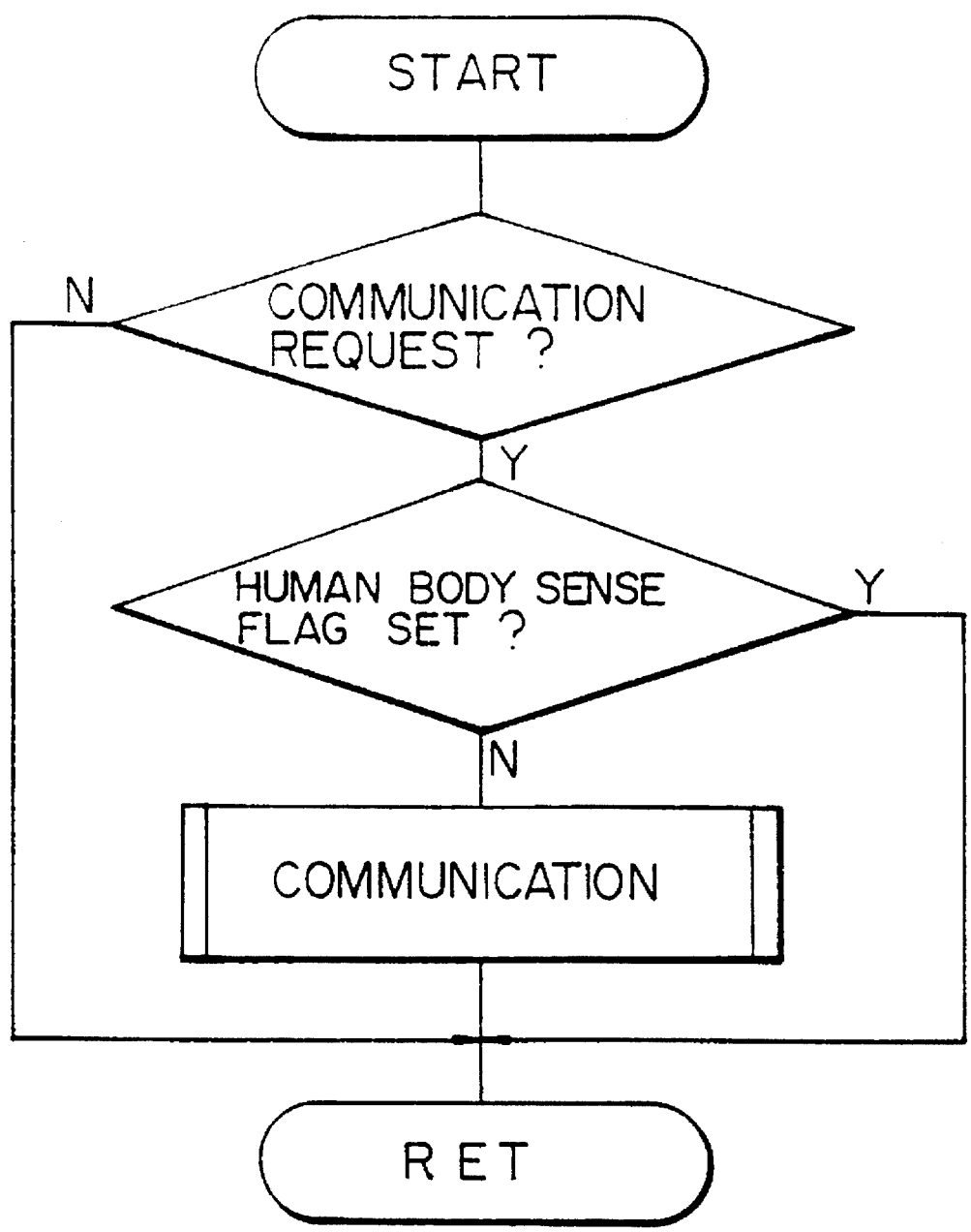
FIG. 52 is a flowchart representative of processing relating to a communication with the control device in thee embodiment.

FIG. 52 demonstrates a procedure relating to the communication of the copier 1 with the control device 141 and to be executed by the CPU 100 in this embodiment. As shown, when the control device 141 generates a communication request, the CPU 100 determines whether or not the human body sense flag is "1" and, if it is not "1", sets up a communication with the control device 14 and then returns. If the flag is "1", the CPU 100 determines that a person to use the copier 1 is present and returns immediately by inhibiting the communication.

Figure 53:
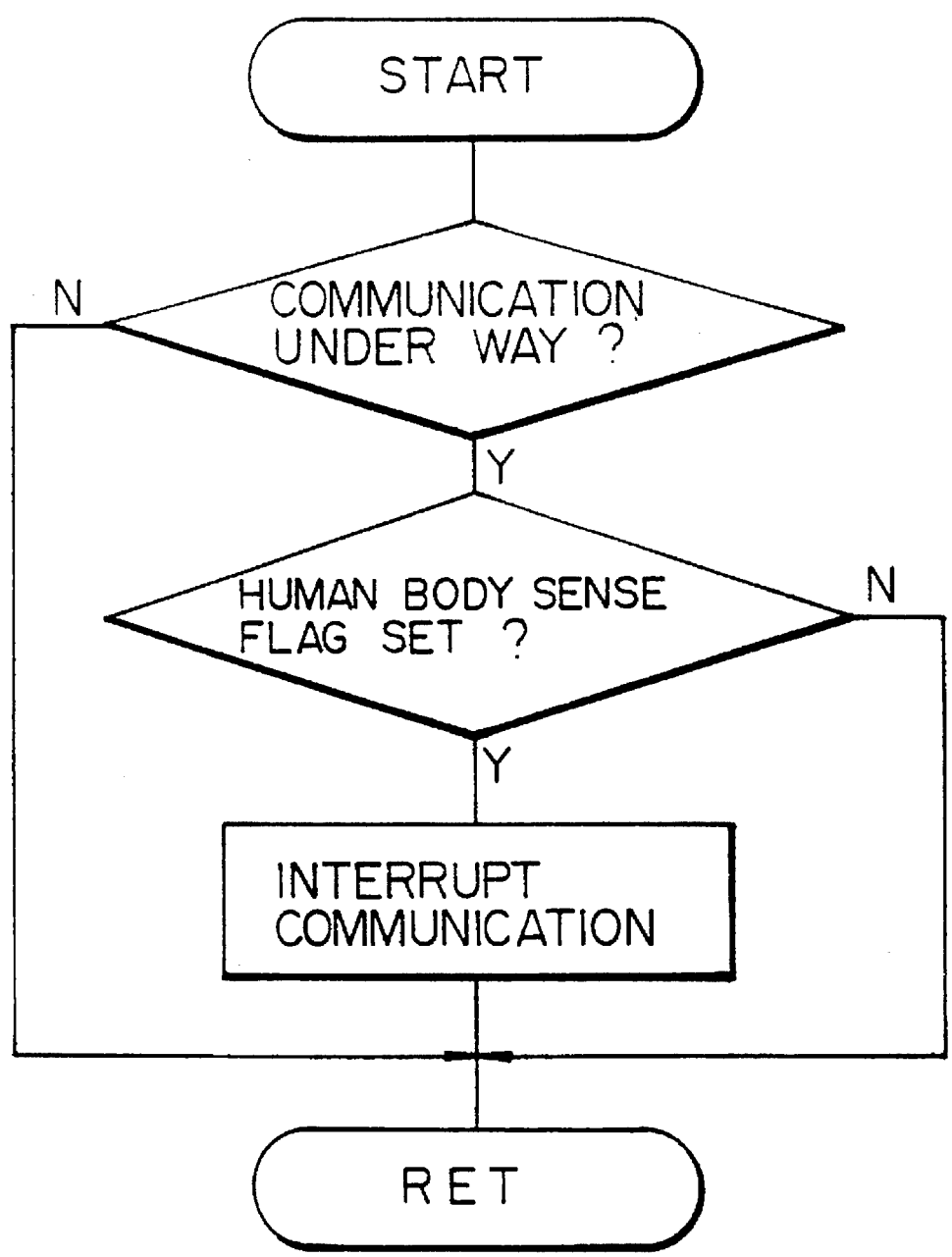
FIGS. 53–55 are flowcharts each demonstrating another processing also relating to a communication with the control device.

FIG. 53 shows another communication procedure to be executed by the CPU 100 of the copier 1. When a communication with the control device 1 is under way, the CPU 100 determines whether or not the human body sense flag is "1" and, if it is not "1", returns immediately. If the flag is "1", the CPU 100 interrupts the communication and then returns.

Figure 54:
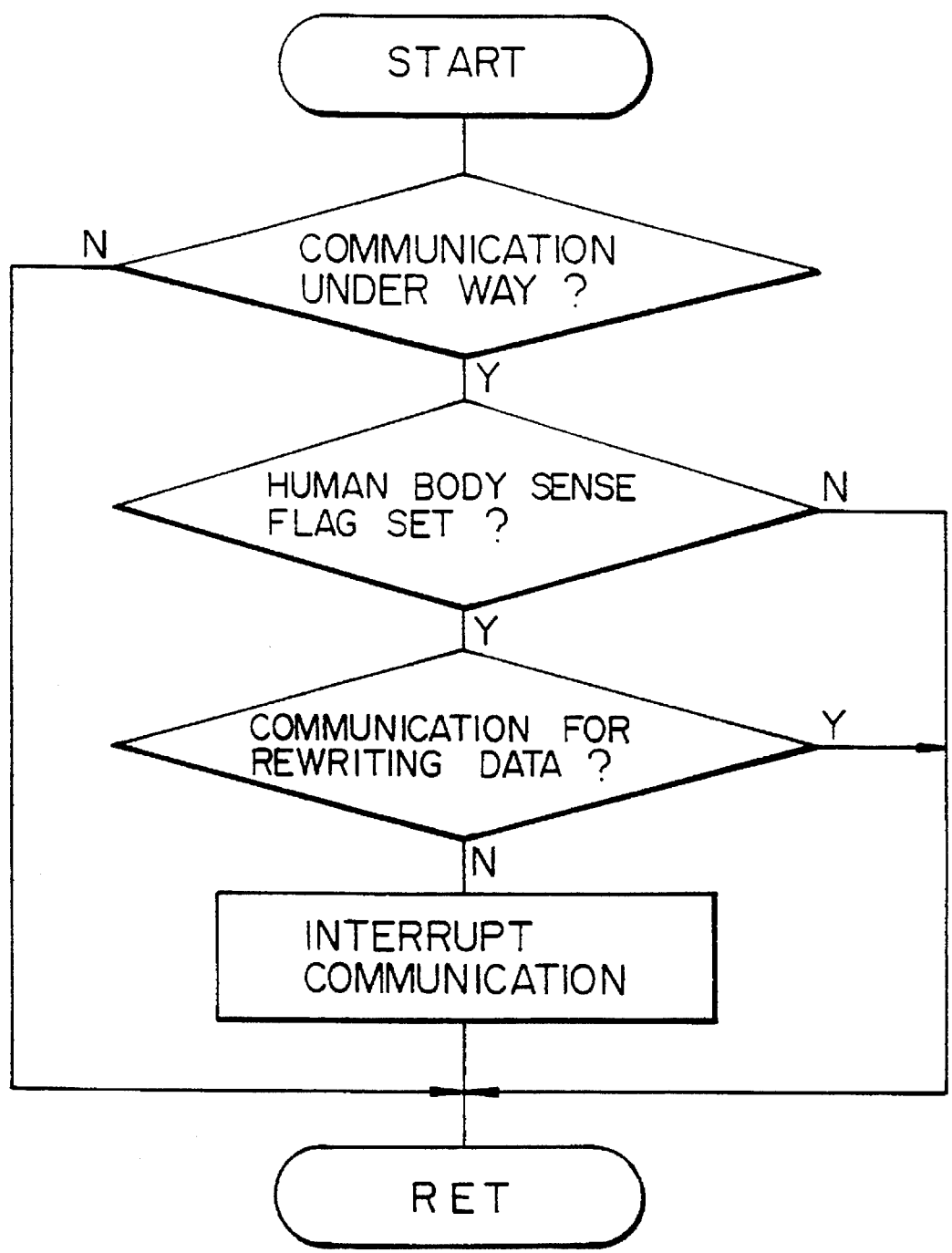

FIG. 54 shows still another communication procedure to be executed by the CPU 100. When a communication with the control device 1 is under way, the CPU 100 determines whether or not the human body sense flag is "1" and, if it is not "1", returns immediately. If the flag is "1", the CPU 100 determines whether or not the communication under way is to rewrite data representative of adjusted image forming conditions. If the result of this decision is negative, the CPU 100 interrupts the communication and then returns; if otherwise, it returns immediately, awaits the end of the communication, and then sets up the usual image forming mode since the interruption might destroy data existing in the copier 1.

Figure 55:
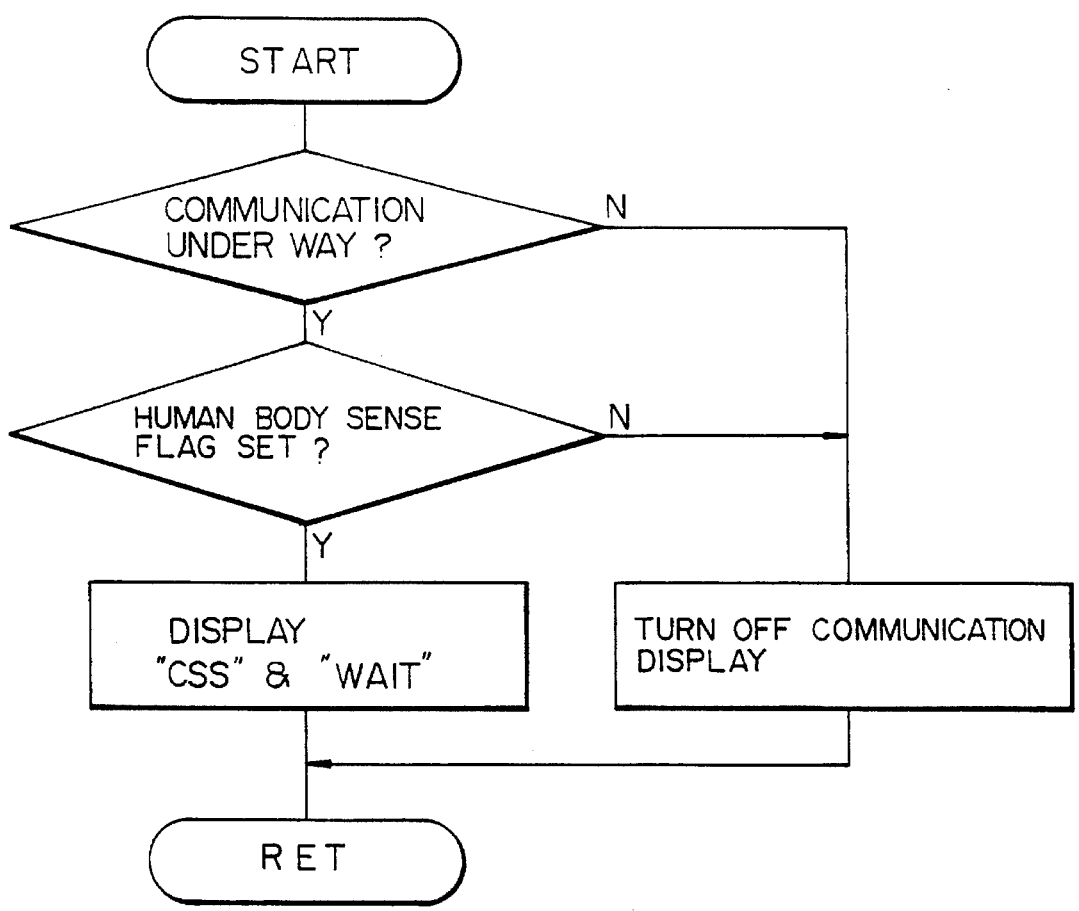

Assume that the human body sensor 114 turns on while a communication is held between the copier 1 and the control device 141, setting the human body sense flag to "1". Then, the CPU 100 should preferably inform the person standing by the copier 1 of the communication under way on the operation board 70. For example, as shown in FIG. 55, the CPU 100 causes the magnification section (D12) of the pattern display 72, FIG. 11, to display "CSS" and turn on a message "WAIT". When the communication with the control device 141 ends, the CPU 100 causes the display 72 to turn off these indications.

If desired, the human body sensor 114 may be replaced with an object sensor capable of sensing even objects other than human bodies by, for example, infrared rays.

Figure 56:
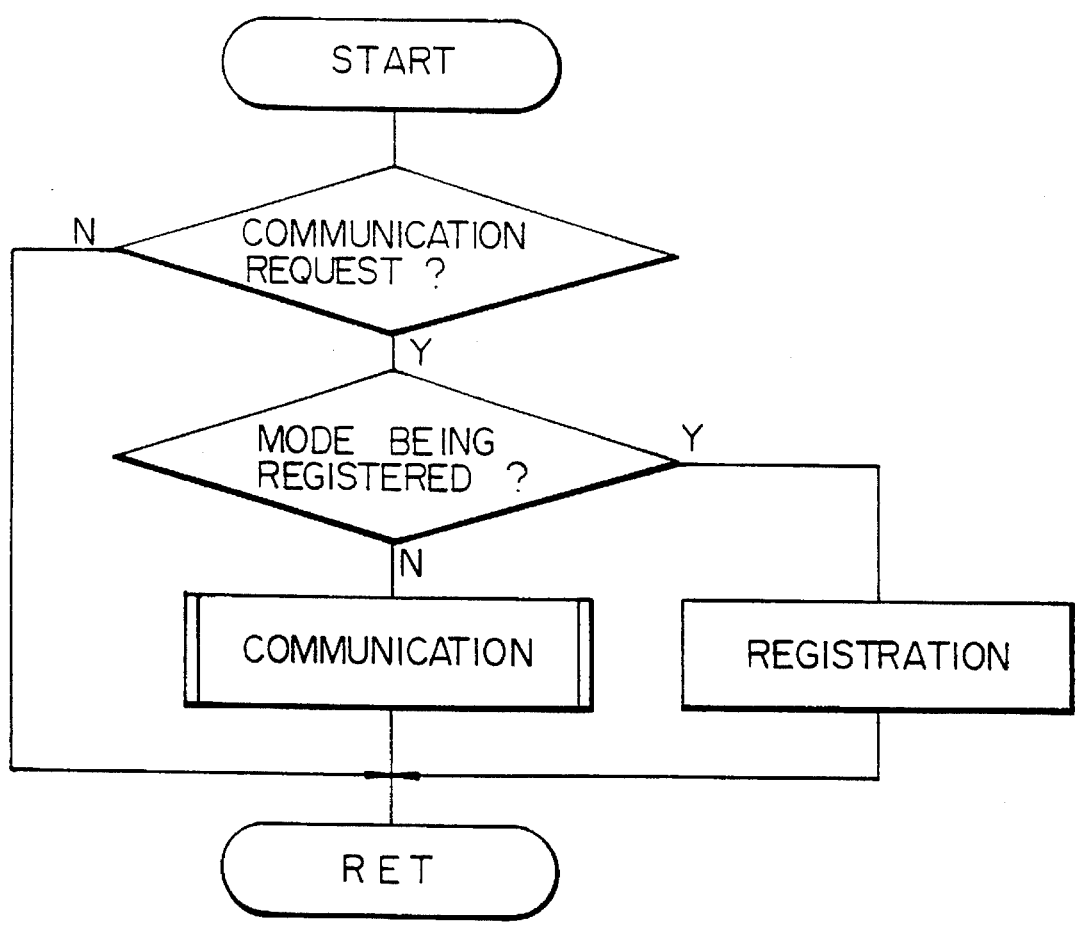
FIGS. 56 and 57 are flowcharts each being representative of specific processing relating to a communication with the control device to be executed by the CPU of the copier in still another embodiment of the present invention.

FIG. 56 demonstrates another function available with the present invention and relating to the communication of the copier 1 with the control device 141. As shown, when the control device 141 sends a communication request to the copier 1, the CPU 100 of the copier 1 determines whether or not a program mode is set up. The program mode refers to a mode which allows the operator to register a combination of desired image forming modes (enlargement, reduction, two-sided printing, etc.) by use of the program key 80, FIG. 10, provided on the operation panel 70. If the program mode is not set up, the CPU 100 causes the copier 1 to hold a communication with the control device 141 and then returns. If the program mode is set up, the CPU 100 returns after the mode has ended. Specifically, when the control device 141 generates a communication request while the program mode is under way, the CPU 100 gives priority to the program mode and inhibits the copier from communicating with the control device 141.

Figure 57:
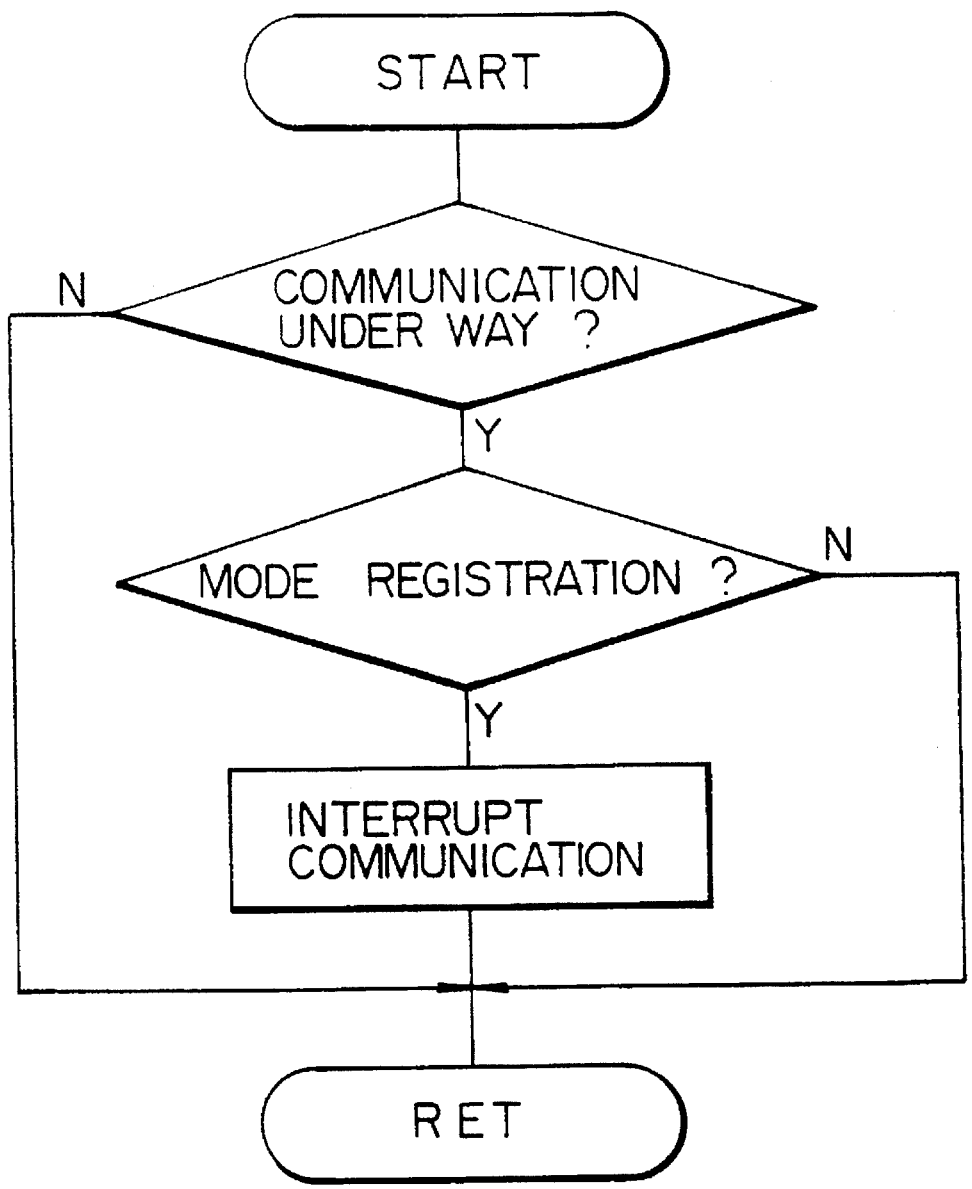

FIG. 57 shows another processing of the CPU 100 relating to the communication of the copier 1 with the control device 141. As shown, the CPU 100 determines whether or not a program mode registration request is generated while the copier 1 is communicating with the control device 141. If the result of this decision is negative, the CPU 100 returns. On the generation of the request, the CPU 100 interrupts the communication with the control device 141 and then returns.

Figure 58:
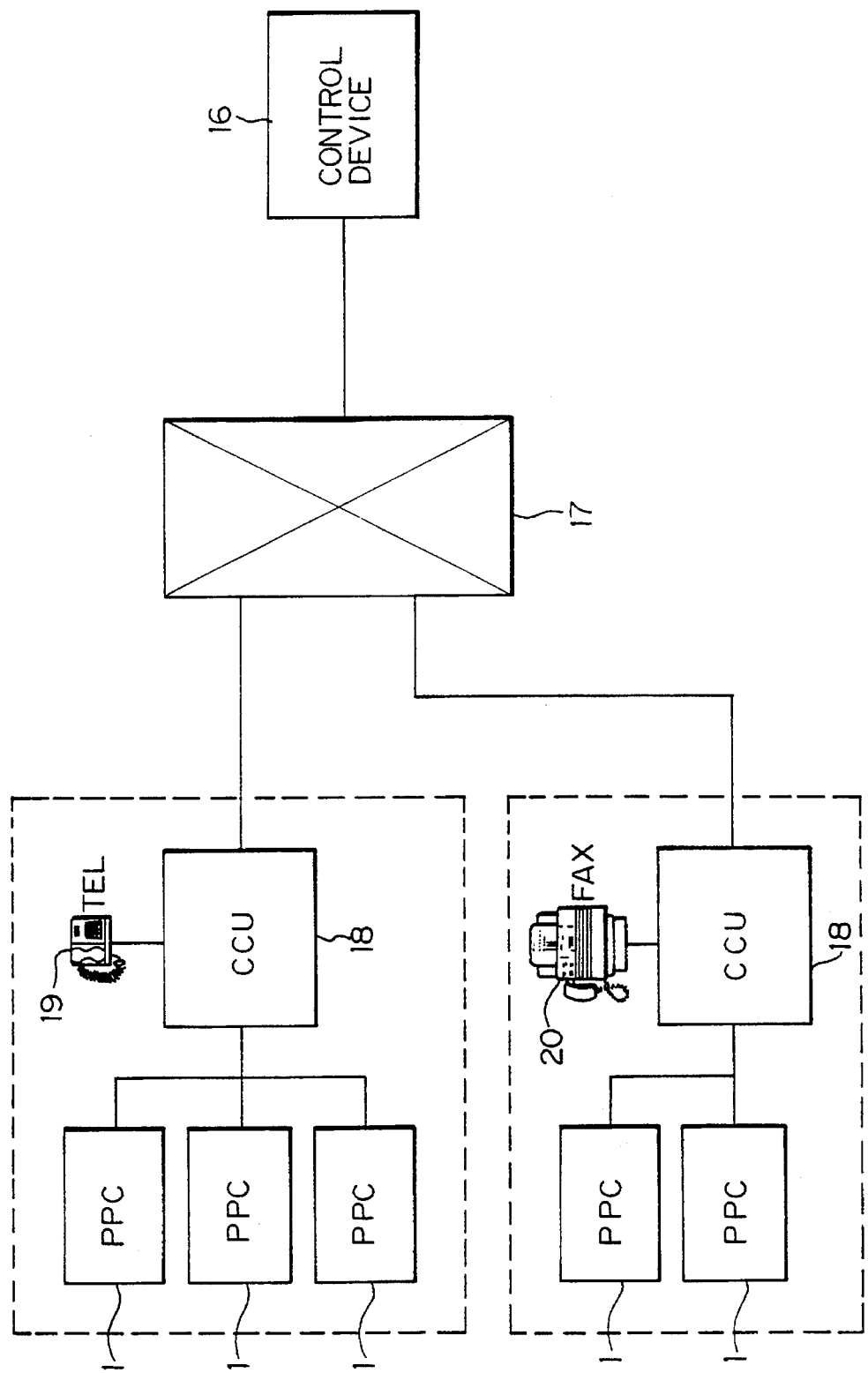
FIG. 58 is a block diagram schematically showing yet another alternative embodiment of the present invention.

FIG. 58 shows another alternative embodiment of the control system in accordance with the present invention. In this embodiment, a control device 16 is located at a service station and connected to the copiers (PPCs) or similar image forming apparatuses 1 located at the users' stations by a switched telephone network 17. At each user's station, a CCU 18 is installed for controlling the communication of the copier 1 with the control device 16. The copier 1 is connected to the CCU 18. A telephone set 19 and a facsimile apparatus 20 are also connectable to the CCU 18.

While a plurality of copiers 1 are shown as being connected to each CCU 18, they may, of course, be replaced with a single copier 1. The copiers 1 may each be of a different type and may be replaced with printers or other image forming apparatuses. Let the maximum number of copiers 1 connectable to each CCU 18 be five by way of example. The CCU 18 and associated copiers 1 are connected by a multidrop system of RS-485 standard. The communication between the CCU 18 and each copier 1 is controlled by a basic data transmission control procedure. The CCU 18 is capable of communicating with any one of the associated copiers 1 by setting up a data link by a centralized control polling/selecting system in which it plays the role of a control station. Each copier 1 is provided with an address set switch for setting a value particular thereto, and the polling address and selecting address of the copier 1 are determined on the basis of the set value.

Figure 59:
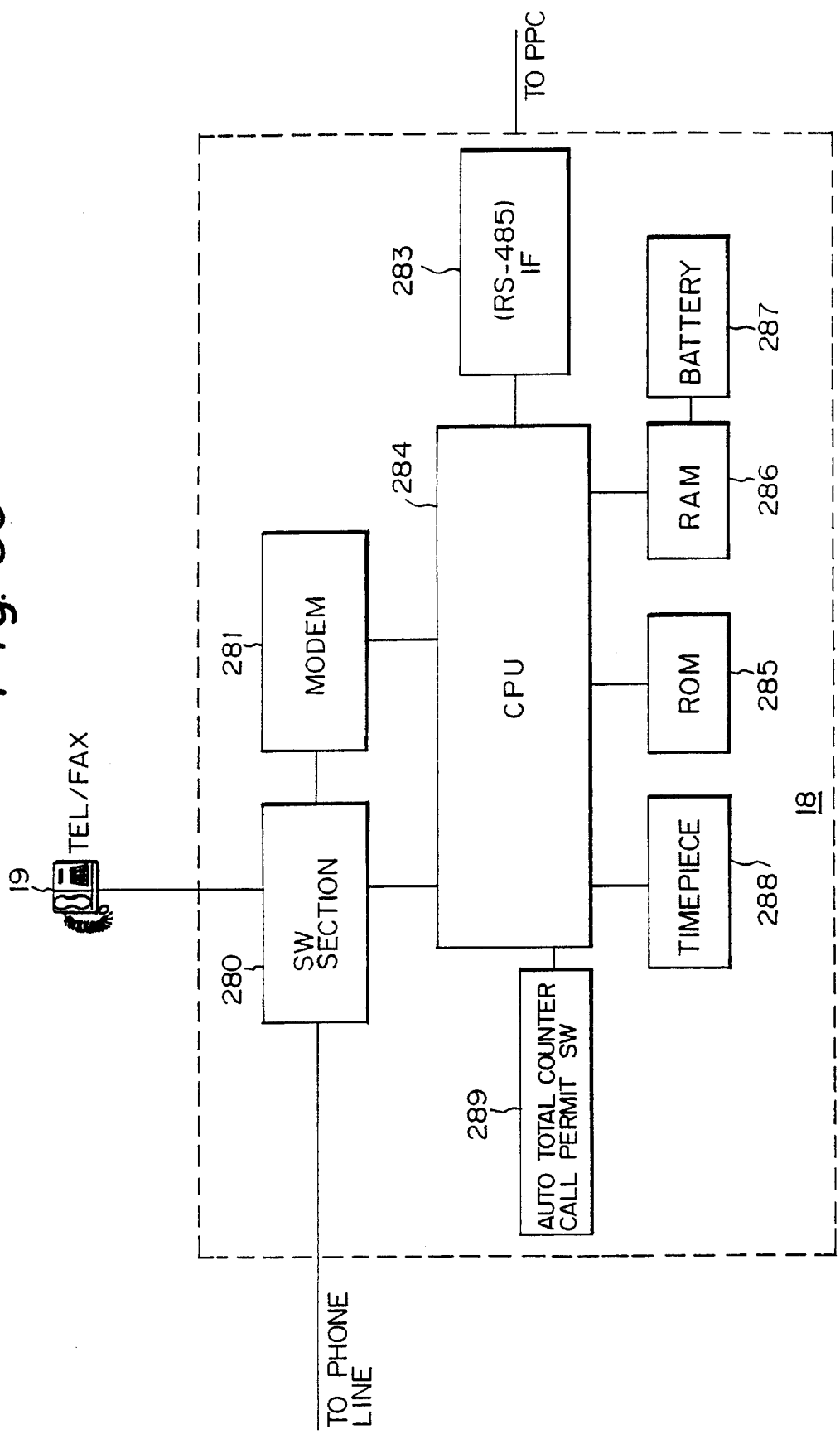
FIG. 59 is a block diagram schematically showing a specific construction of a communication control unit of FIG. 58.

FIG. 59 shows a specific construction of the CCU 18. The CCU 18 corresponds to the CCU 144 included in the control system of FIG. 1. When a communication from the switched telephone network is meant for the telephone 19 (or the facsimile apparatus 20), the CCU 18 connects the telephone network to the telephone 19 (or the facsimile apparatus 20). When the communication is from the control device 16, the CCU 18 connects the telephone network to a modem 281 through a switch section 280. The CCU 18 is communicable with the copier 1 via a communication interface (IF) 283 which is implemented as an RS-485 transceiver. Such control and processing are executed mainly by a CPU 284 according to control programs stored in a ROM 285. A RAM 286 stores interim results of processing and temporarily stores a communication text. Also, various parameters necessary for the operation of the CCU 18 are written to the RAM 286 from the control device 16. Usually, the CCU 18 is continuously powered throughout the day to be communicable with the control device 16 anytime. At the same time, the RAM 286 is backed up by a battery 287 in order to prevent the above-mentioned parameters from being lost due to the accidental shut-off of the power source or similar cause. A timepiece 288 and an automatic total counter call permit switch 289 whose function will be described later are also built in the CCU 18.

Figure 60:
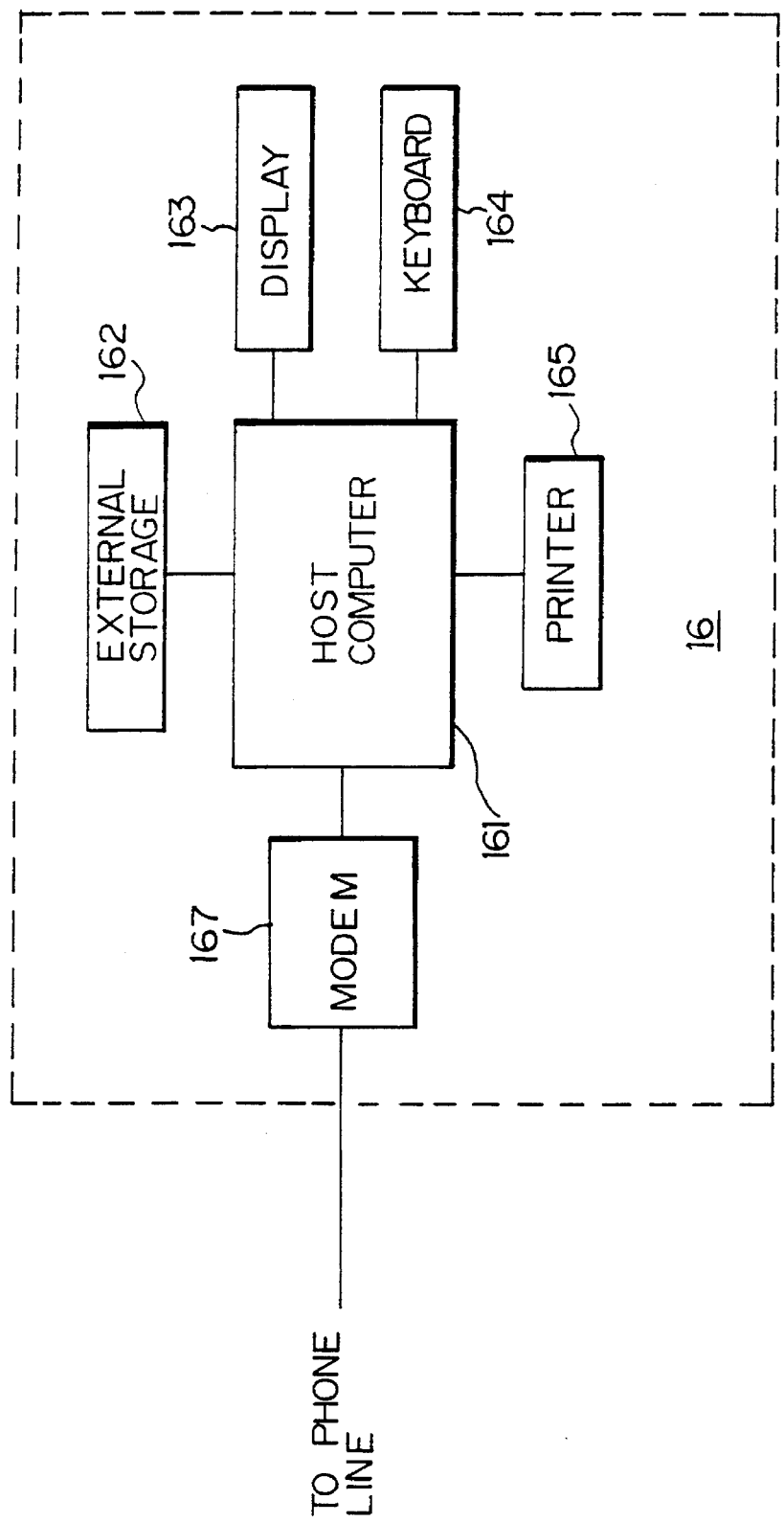
FIG. 60 is a block diagram schematically showing a control device of FIG. 58.

FIG. 60 shows a specific construction of the control device 16 included in the system of FIG. 58. As shown, the control device 16 is generally constructed in the same manner as the control device 141 shown in FIG. 14. Specifically, the control device 16 has a host computer 161, a magnetic disk or similar external storage 162 for storing supervisory data and other data (corresponding to the memory shown in FIG. 14), a display 163, a keyboard 164 playing the role of operating means, a printer 165 for outputting supervisory data, and a modem 167 connectable to the telephone network 17.

Figure 61:
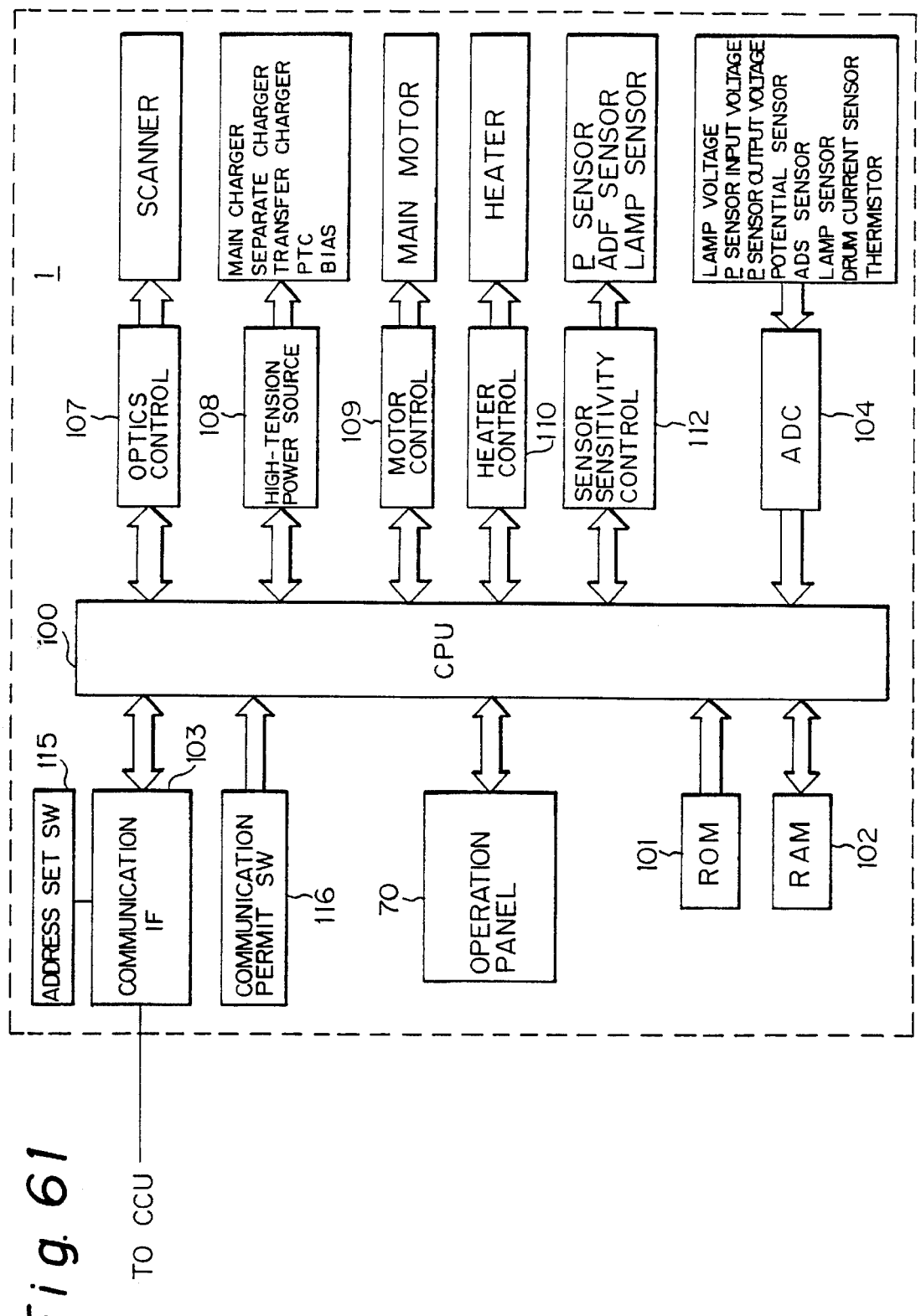
FIG. 61 is a block diagram schematically showing specific control circuitry built in the copier of FIG. 58.

FIG. 61 shows control circuitry incorporated in each copier 1 of FIG. 58. The mechanical arrangement of the copier 1 is essentially the same as the arrangement described with reference to FIG. 2 and other figures. Also, the control circuitry of FIG. 61 is generally similar to the circuitry of FIG. 12. Hence, the same blocks as the blocks of FIG. 12 are designated by like reference numerals and will not be described specifically. In the circuitry of FIG. 61, a communication IF unit 103 communicates with the CCU 18. An address set switch 115 allows an address particular to the copier 1 to be selected out of 1 to 5. A communication permit switch 116 is operable to selectively permit or inhibit the communication of the copier 1 with the CCU 18.

Figure 62A:
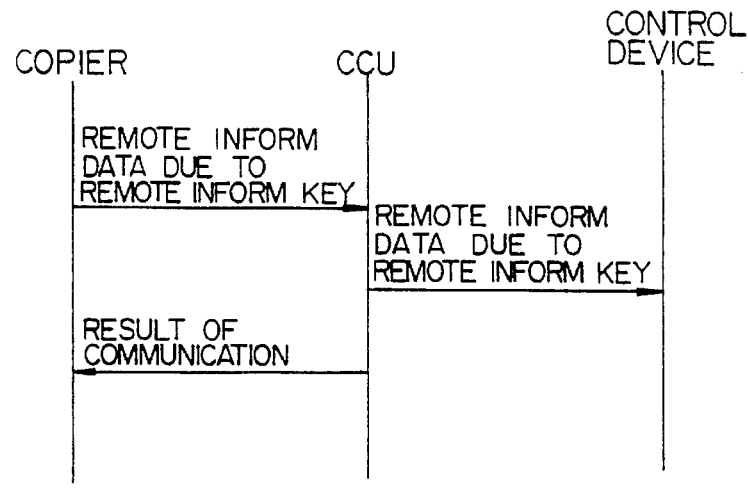
FIGS. 62A–62C each shows a specific communication sequence relating to remote information particular to the embodiment.

The operation of this embodiment will be described in detail with reference mainly to FIG. 62A and successive figures. To begin with, a remote informing function will be described with reference to FIGS. 62A–62C and FIG. 58. As shown, when the remote inform key 83, FIG. 10, provided on the operation panel 70 of the copier 1 is pressed, remote information data is sent from the copier 1 to the CCU 18. On receiving this data, the CCU 18 calls the control device 16 by use of a telephone number set therein beforehand and then sends the data to the control device 16. Usually, the control device 16 is located at a service station. Here, the CCU 18 is assumed to send, among a plurality of kinds of data sent from the copier 1, only data of the kind set in the CCU 18 beforehand to the control device 16. Data of this kind is set in the CCU 18 by the control device 18 via the telephone network 17.

As the CCU 18 fully sends the predetermined data to the control device 16, it sends the result of communication with the control device 16 to the copier 1 of interest. The copier 1, therefore, can see if the communication was successful or if it was unsuccessful due to some error. It is a common practice to provide a copier with a self-diagnosis function. With this function, a copier informs the operator or the serviceman of a dangerous condition or a disabled condition thereof, e.g., when the fixing temperature is abnormal or when the adjustment of a certain adjustable portion using an electronic volume fails. This information is brought to the operator or the serviceman as "ERROR" or "SERVICEMAN CALL".

Figure 62B:
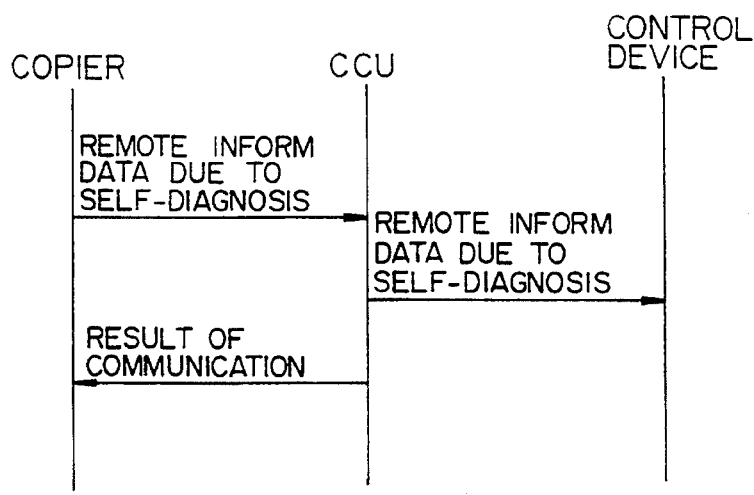

As shown in FIG. 62B, when an error is found by the self-diagnosis of the copier 1, the copier 1 also sends remote information data resulted from the diagnosis to the CCU 18. Then, the CCU 18 sends the data to the control device 16 and, on completing the communication, sends the result of communication to the copier 1.

Figure 62C:
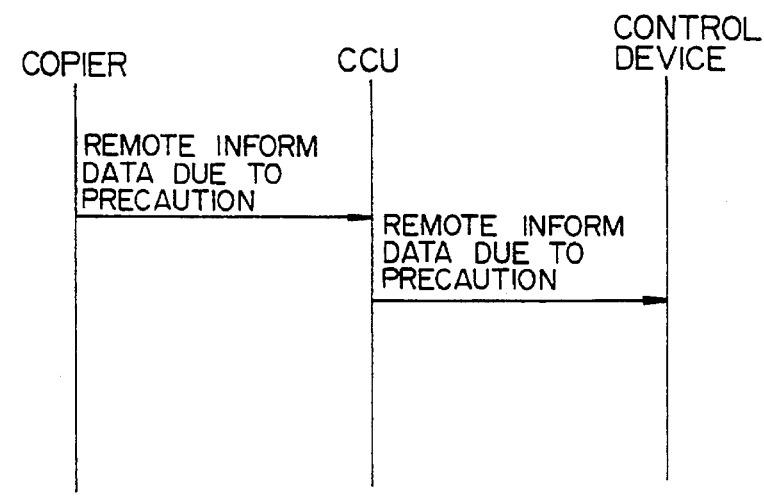

Further, assume that the copier 1 determines that maintenance is preferable, e.g., when the current condition is quite close to an error, if not an error, by self-diagnosis. Then, as shown in FIG. 62C, the copier 1 sends remote information data for precaution. While the copier 1, of course, cannot be used in the event of an error found by self-diagnosis, it is left usable in the event of a precaution and can produce a copy when a document is set and the start key is pressed despite the communication under way. At this instant, the communication may be interrupted if the copying operation increases the load on the controller of the copier 1 or if it is apt to disturb the data being sent. Since the remote information data for precaution is not urgent, it is preferable that the CCU 18 received the data does not send it to the control device 16 immediately, i.e., sends it at a time convenient for a communication. For example, this communication may be held in the time zone in which the telephone 19 and facsimile apparatus 20 connected to the CCU 18 are not frequently used or the time zone in which the traffic of the telephone network 17 is not heavy. Such a time is set in the CCU 18 by the control device 16, and the copier 1 can see the time by comparing it with the timepiece 288, FIG. 59. In the case of such a precaution, the CCU 18 does not send the result of communication to the copier 1.

Figure 63A:
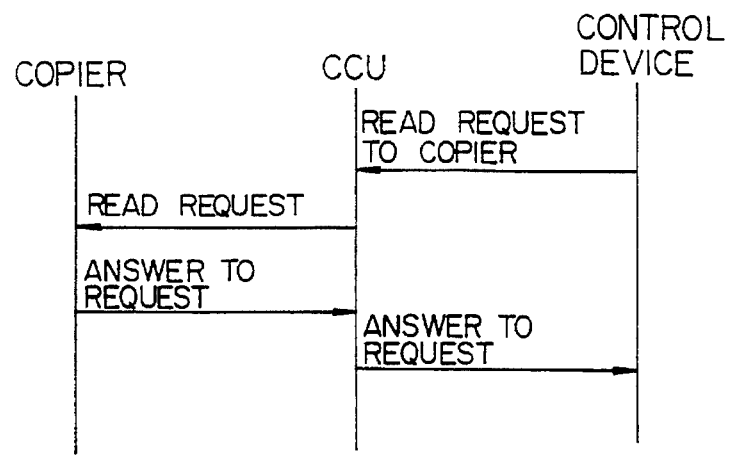
FIGS. 63A–63C each shows a specific communication sequence relating to the access of the control device to the copier.
Figure 63B:
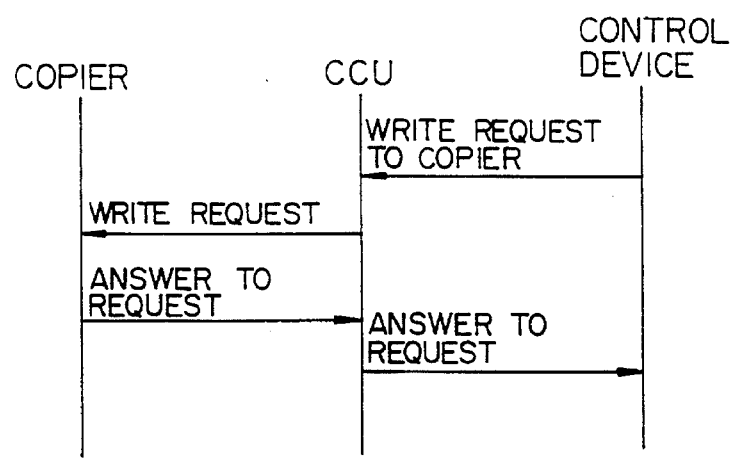
Figure 63C:
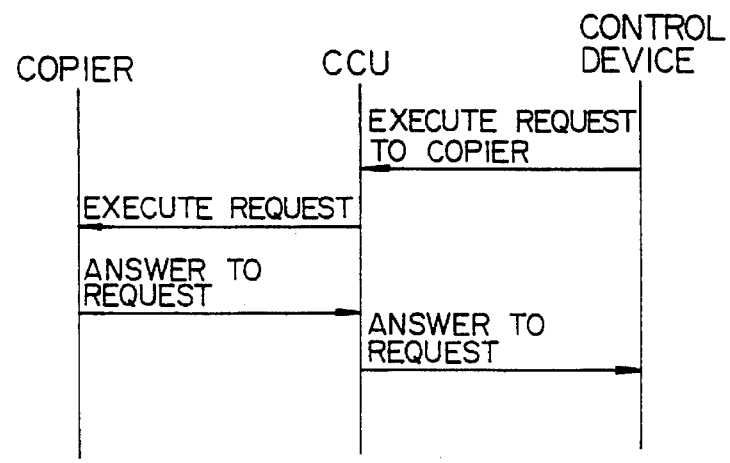

How the control device 16 accesses the copier 1 will be described with reference to FIGS. 63A–63C. Generally, the control device 16 accesses the copier 1 for three different purposes, i.e., for sending a read request (FIG. 63A), for sending a write request (FIG. 63B), and for sending an execute request (FIG. 63C). The read request is to read logging data, various set values and sensor outputs out of the copier 1. The write request is to send various values to set and other data to the copier 1 for rewriting existing data. The execute request is to cause the copier 1 to execute, among others, a testing procedure. In any one of the procedures shown in FIGS. 63A–63C, the control device 16 dials the CCU 18 to which the copier 1 of interest is connected and then sends the request. On receiving the request, the CCU 18 sends request data to the copier 1 for which the request is meant. In response, the copier 1 processes the content of the request and then sends a corresponding answer to the CCU 18. The CCU 18 sends the answer to the control device 16 and ends a single unit of processing.

Figure 64A:
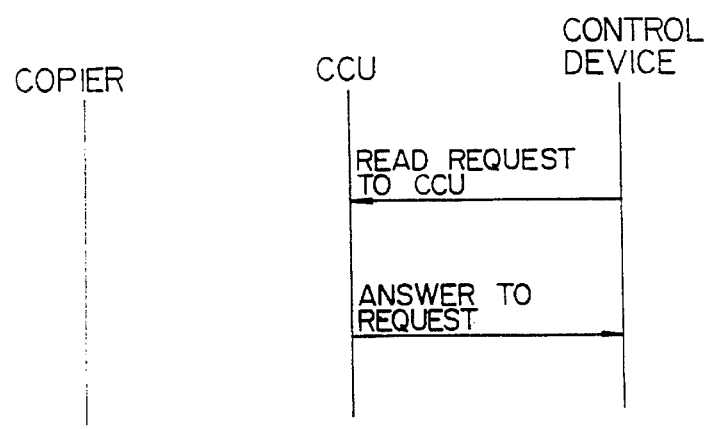
FIGS. 64A–64C each shows a specific communication sequence relating to the access of the control device to the communication control unit.
Figure 64B:
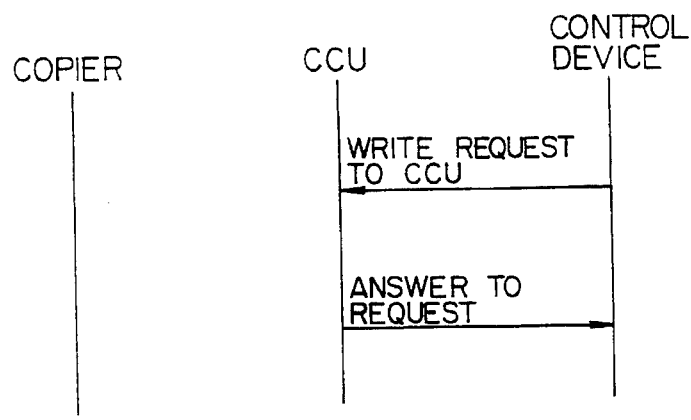
Figure 64C:
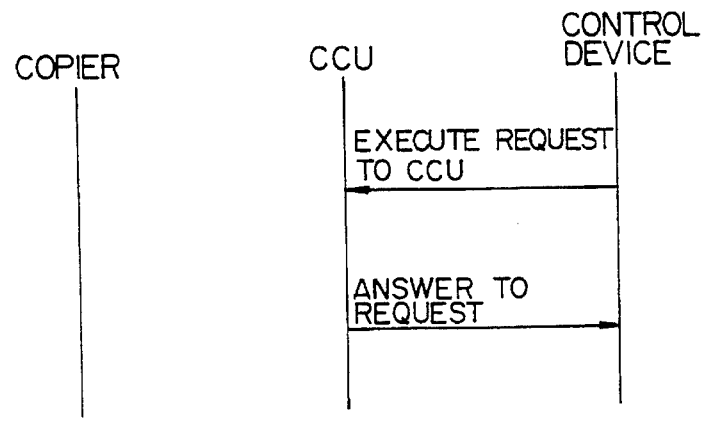

FIGS. 64A–64C show procedures for the control device 1 to access the CCU 18. Again to access the CCU 18, the control device 16 uses a read request (FIG. 64A), a write request (FIG. 64B) or an execute request (FIG. 64C). The read request is to read set parameters and statuses out of the CCU 18 and to read information associated with the copier 1 and which the CCU 18 may have read and stored therein beforehand. The write request is to set parameters of the CCD 18 by sending data from the control device 16. The execute request is to cause the CCU 18 to test itself, e.g., to check the functions of its own.

Figure 65:
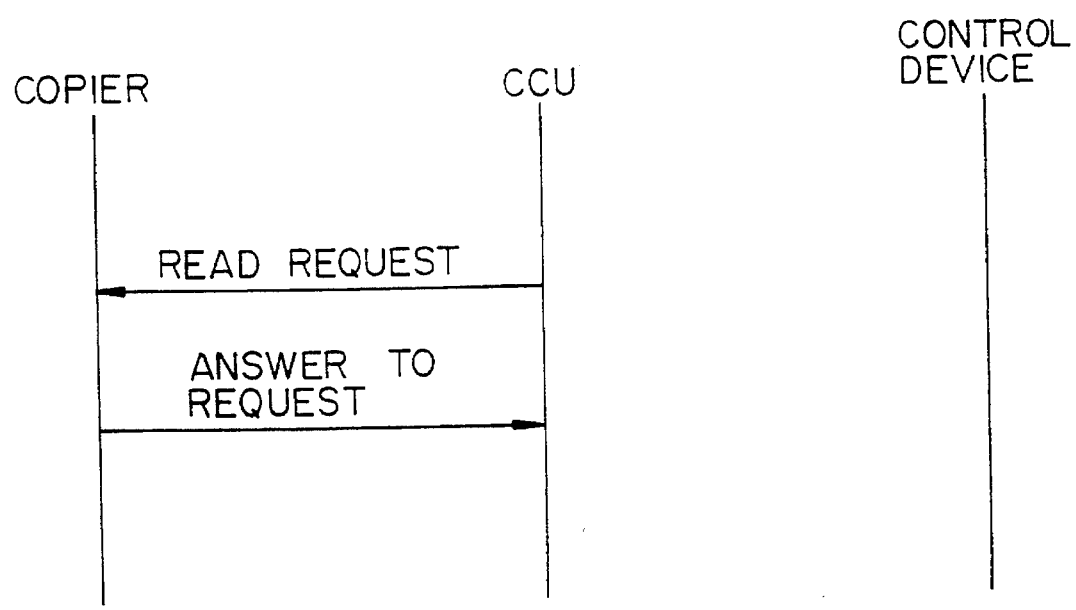
FIG. 65 shows a communication sequence in which the communication control unit accesses the copier without using the control device.

FIG. 65 shows a procedure in which the CCU 18 accesses the copier 1 without using the control device 16. As shown, the CCU 18 accesses the copier 1 to read information representative of the inside conditions of the copier 1 and store them in the CCU 18 so as to allow the control device 16 to read them afterwards. Generally, a copier is provided with, for example, a total copy counter for a maintenance purpose. The copier 1 periodically sends the content of the total copy counter to the CCU 18. Then, the control device 16 can see the total number of copies even when the copier 1 is unable to communicate, e.g., when the power source of the copier 1 is turned off. This can be done since the CCU 18 has a function of reading the inside information of the copier 1 and storing them in itself, as stated earlier. When, among the parameters set in the CCU 18, the time for collecting the value of the total copy counter is reached as indicated by the timepiece 288, FIG. 59, built in the CCU 18, the CCU 18 sequentially requests all the copiers 1 connected thereto to send total copy numbers and performs this every day. The CCU 18 stores the new total copy numbers from the copiers 1 in the RAM 2, FIG. 59, and updates them every day. When the copier expected to send the total copy number to the CCU 18 is unable to communicate due to, for example, the turn-off of the power source, the CCU 18 skips it and executes the processing with the next copier 12. After sending the request to all the copier 1, the CCU 18 again sends the request to the copier 1 which it skipped. Usually, the time for collecting the total counter values is set at the nighttime during which the power sources of the copiers 1 are expected to be turned off Then, as the power sources of the copiers 1 are turned on as the time elapses, the communication is held while the copiers are idling just after the turn-on of their power sources or when they are adjusted.

Two different approaches are available to transfer the total copy numbers from the RAM 286 of the CCU 18 to the control device 16. One is to cause the control device 16 to periodically access the CCU 18, e.g., on a monthly add-up day. The other is to cause the CCU 18 to automatically send the total copy numbers to the control device 16 on the date for automatically calling the total counter values and set in the CCU 18 beforehand. To select one of these methods, the automatic total counter call permit switch 289, FIG. 59, of the CCU 18 is operated. When the switch 289 is in an ON state, the CCU 18 calls the control device 16 by use of a telephone number indicated by the parameter set in the CCU 18 and then sends the counts. When the switch 289 is in an OFF state, the CCU 18 waits for the access from the control device 16. It is to be noted that data other than the total copy number may be periodically sent to the control device 16 in place of or in addition to the total copy number.

FIG. 66 lists parameters to be set in the CCU 18. As shown, the type code and serial number are registered for each copier 1 to which a particular address is assigned. The type code and serial number are sent to the control device 16 in the event of report from the copier 1 or used to determine the address of the copier 1 to select in the event of access from the control device 16. Also, the telephone n umber of the destination, the number of times and interval of redialling and the kinds of data to send to the control device 16 are set for each cause of remote information. Regarding remote information for precaution, the time for reporting the control device 16 is also set. A check sum is added to each block of the parameters so as to detect an occurrence that the parameters are accidentally changed or lost due to the malfunction of the CCU 18 or the consumption of the back-up battery 187. These parameters are written to the CCU 18 by the control device 16 via the telephone network 17. Alternatively, a portable device for setting the parameters may be directly connected to the CCU 18, or exclusive operating means may be provided on the CCU 18.

FIGS. 67A–67C each shows a specific format of data to be sent at the time of remote information. FIG. 67A shows the format of data to be sent from the copier 1 to the CCU 18. As shown, the field heading the format is indicative of the cause of remote information, i.e., the depression of the remote inform key, the error found by self-diagnosis, or the precaution. This field is followed by the inside conditions of the copier 1 including conditions of toner, oil, sheets and other expendables, outputs of various sensors, set values of adjustable sections, and connection of units.

FIG. 67B shows the format of data to be sent from the CCU 18 to the control device 16. As shown, a type number field and a serial number field are added to the head of data from the copier 1 to indicate the copier 1 which generated the data. Also, the time when the cause of information occurred is added to the tail of the data on the basis of the timepiece 288 of the CCU 18. Regarding the data field, the kind of data to send to the control device 16 depends on the parameters set in the CCU 18. In this case, it is assumed that parameters are set in the CCU 18 such that only the number of times that an error is found by self-diagnosis and the conditions of the copier 1 are sent to the control device 16.

FIG. 67C shows the format of data which the CCU 18 sends to the copier 1 on completing the report to the control device 16.

FIG. 68 shows a format of data with which the control device 16 accesses the copier 1 in the event of reading. As shown, the control device 16 sends a request code representative of reading and a code representative of an item to read to the CCU 18 after the type number and serial number of the copier 1 of interest. In response, the CCU 18 removes the type number field and serial number field from the received data and sends only the read request code and item code to the copier 1. Then, the copier 1 sends a read answer code, the received item code and then requested data to the CCU 18. Finally, the CCU 18 again adds the type number and serial number to the data from the copier 1 and then sends them to the control device 16.

Figure 69:
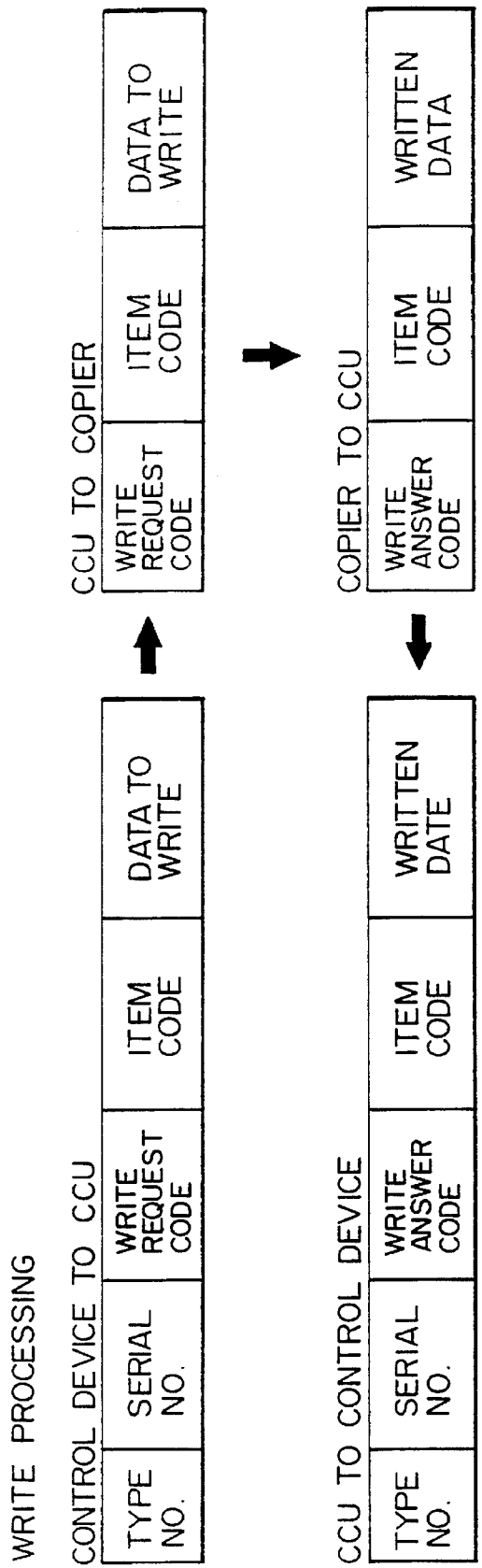
FIG. 69 shows a specific data format for write processing.

FIG. 69 shows a format of data for the control device 16 to access the copier 1 in the event of writing. In this case, the control device 16 adds data to write to the item code. On the other hand, the CCU 18 sends the data actually written to the copier 1 after the item code field. While the data received by the copier 1 and the data sent from the copier 1 are usually identical, they will differ from each other when, for example, the received data does not lie in a valid range and is, therefore, replaced with a boundary value.

FIG. 70 shows a format of data used in the event of execute processing. In this case, when the item code cannot designate an object to operate alone, the control device 16 sends a code representative of a supplementary content after the item code. On executing the requested operation, the copier 1 sends the result data to the control device 16.

FIGS. 71A–71C show respectively a format of data to be sent from the control device 16 to the CCU 18 in the event of reading, a format of data to be sent in the event of writing, and a format of data to be sent in the event of execution. These data formats are substantially identical with the data formats used to access the copier 1 except that the type number and serial number are replaced with a code designating the CCU 18.

Figures 72, 73:
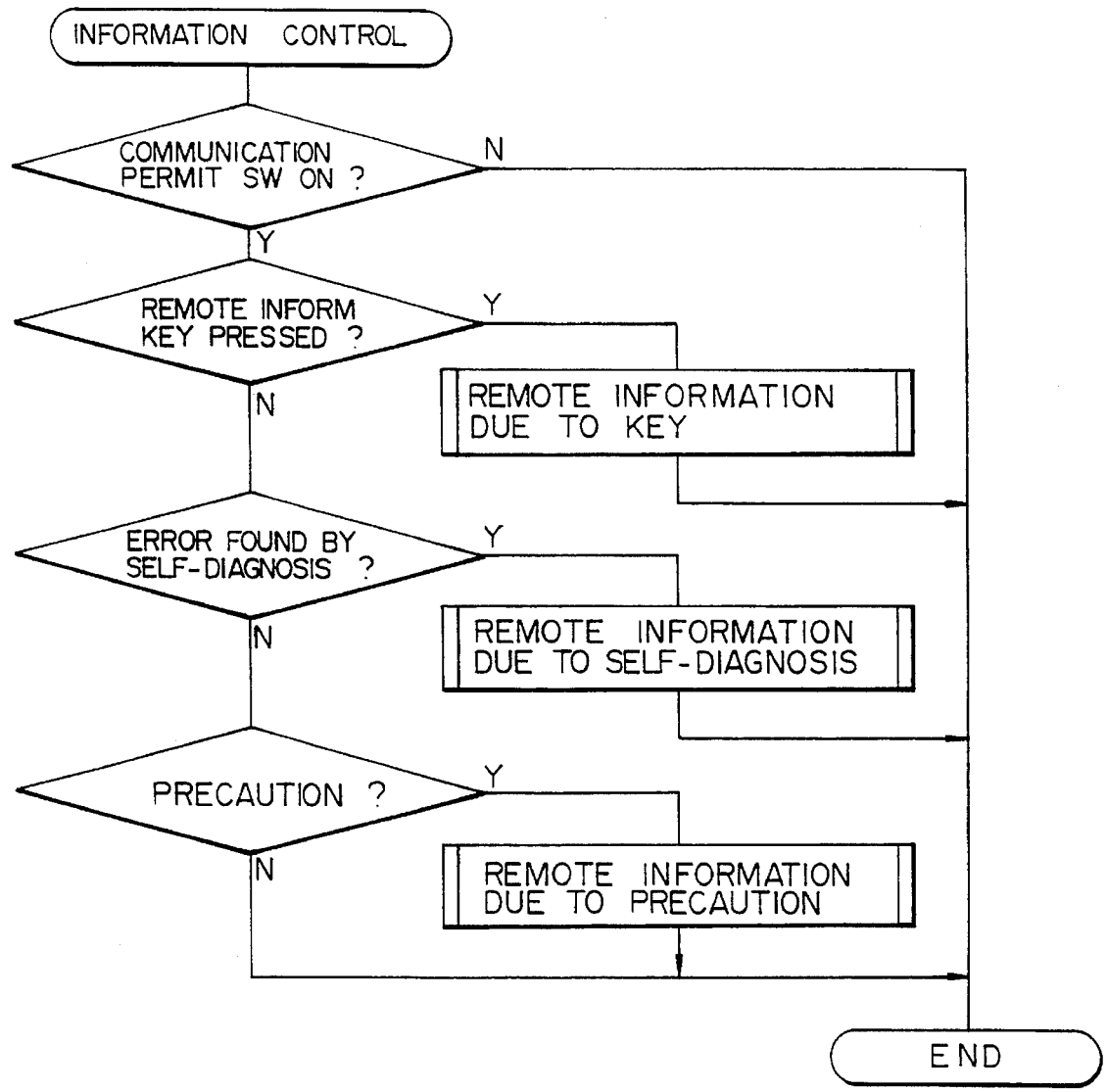
FIG. 72 shows a specific data format for the communication control unit to access the copier.
FIG. 73 is a flowchart demonstrating a main routine to be executed by the CPU of the copier for information control.

FIG. 72 shows a format of data with which the CCU 18 accesses the copier 1. The format is identical with the format used for the control device 16 to access the copier 1 as shown in FIGS. 68–70. The copier 1 does not have to distinguish the accesses from the control device 16.

FIG. 73 demonstrates a main routine to be executed by the CPU 100 of the copier 1, FIG. 61, for information control. As shown, assume that the communication permit switch 116 located at the outside of the operation panel 70 of the copier is in an ON state. Then, when the remote inform key 83 of the operation panel 70, FIG. 10, is pressed, when an error is found by self-diagnosis, or when a precaution is necessary, the CPU 100 executes corresponding remote information processing.

Figure 74:
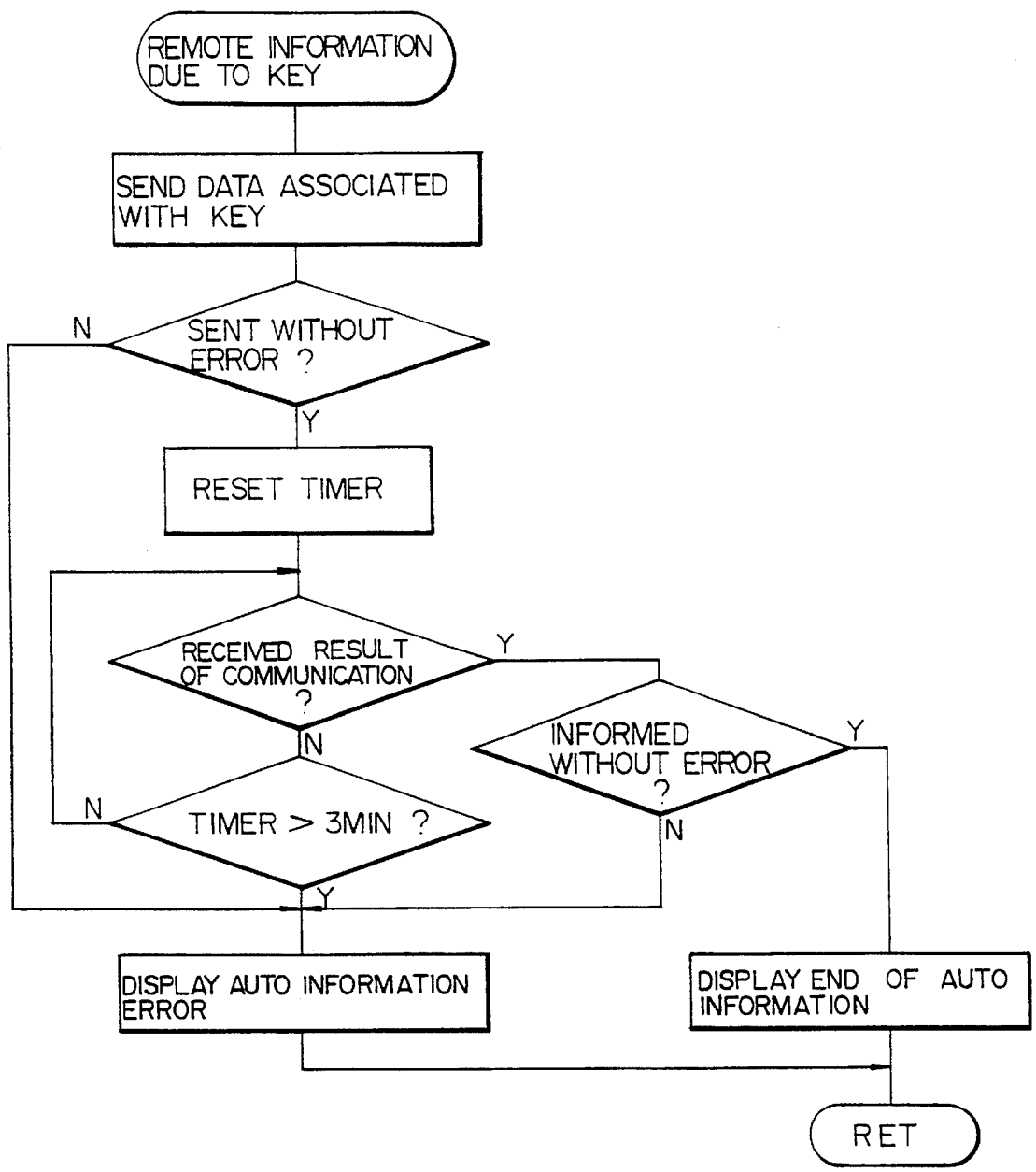
FIGS. 74–76 are flowchart each demonstrating a particular subroutine included in the main routine of FIG. 73.

FIG. 74 is representative of a subroutine included in the main routine of FIG. 73 and executed when the remote inform key 83 is pressed. As shown, when the key 83 is pressed, the CPU 100 sends remote information data to the CCU 18. When the information is defective, e.g., when the CCU 18 does not answer the remote information, the CPU 100 causes the remote communication error indicator D8, FIG. 11, to glow or flash to inform the operator of the error. When the data is successfully sent to the CCU 18, the CPU 100 resets an exclusive timer and then awaits the result of communication from the CCU 18. The timer is assumed to count 3 minutes. When the result of communication does not arrive at the copier 1 within 3 minutes, the CPU 100 again causes the indicator D8 to glow or flash to inform the operator of the error. When the result of communication arrives within 3 minutes, the CPU 100 checks it to see if the communication was successful and, if it was successful, displays the end of automatic communication, although not shown in the figure. If the communication failed, the CPU 100 again causes the indicator D8 to glow or flash and then returns to the main routine of FIG. 73.

Figure 75:
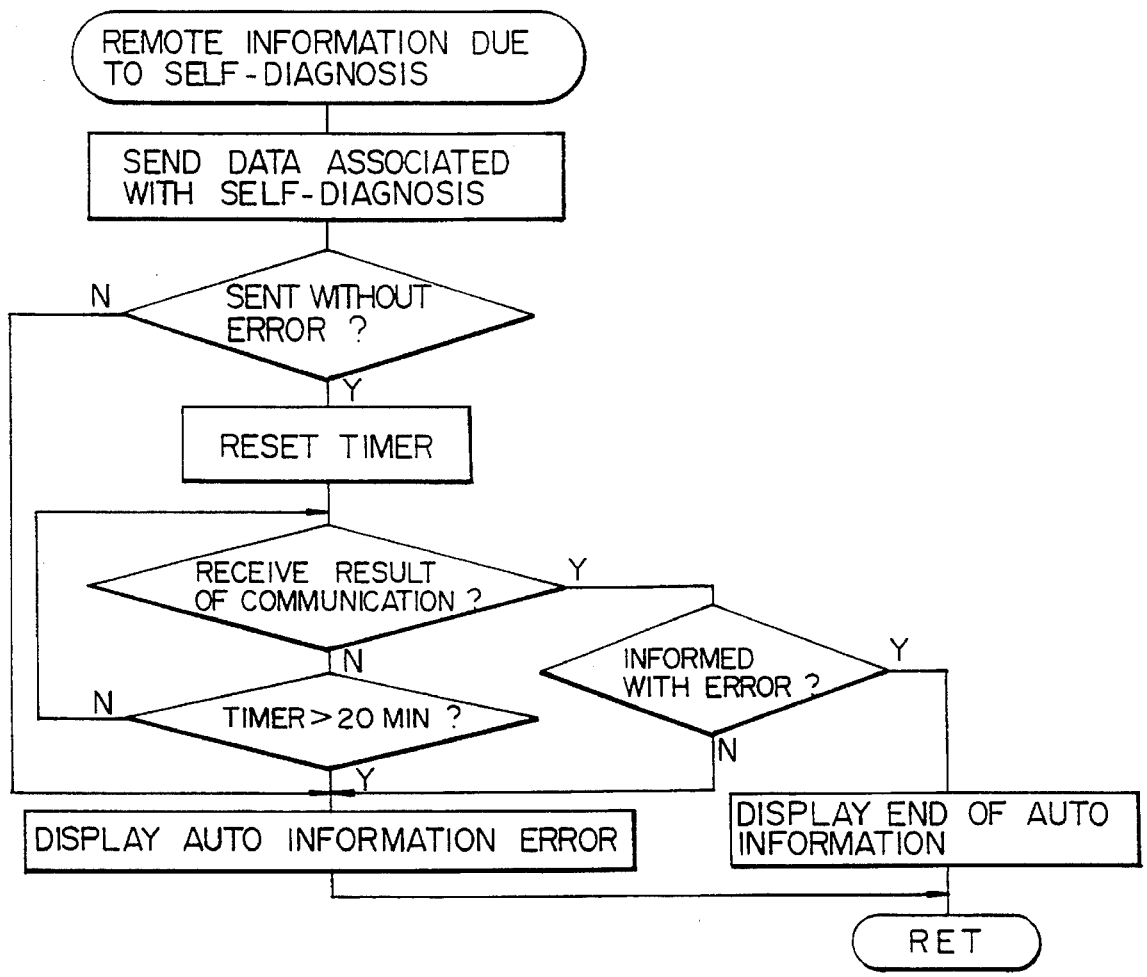

FIG. 75 demonstrates a subroutine also included in the main routine of FIG. 73 and relating to an error found by self-diagnosis. This subroutine is identical with the subroutine of FIG. 74 associated with the remote inform key 83 except that data representative of the error is sent to the CCU 18, and that the timer counts 20 minutes.

Figure 76:
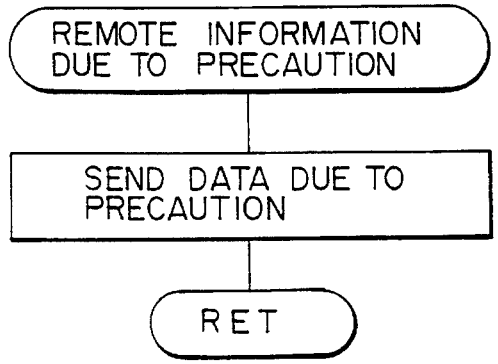

FIG. 76 shows a subroutine also included in the main routine of FIG. 73 and relating to the remote information for precaution. In this subroutine, remote information data for precaution is sent to the CCU 18.

Figure 77:
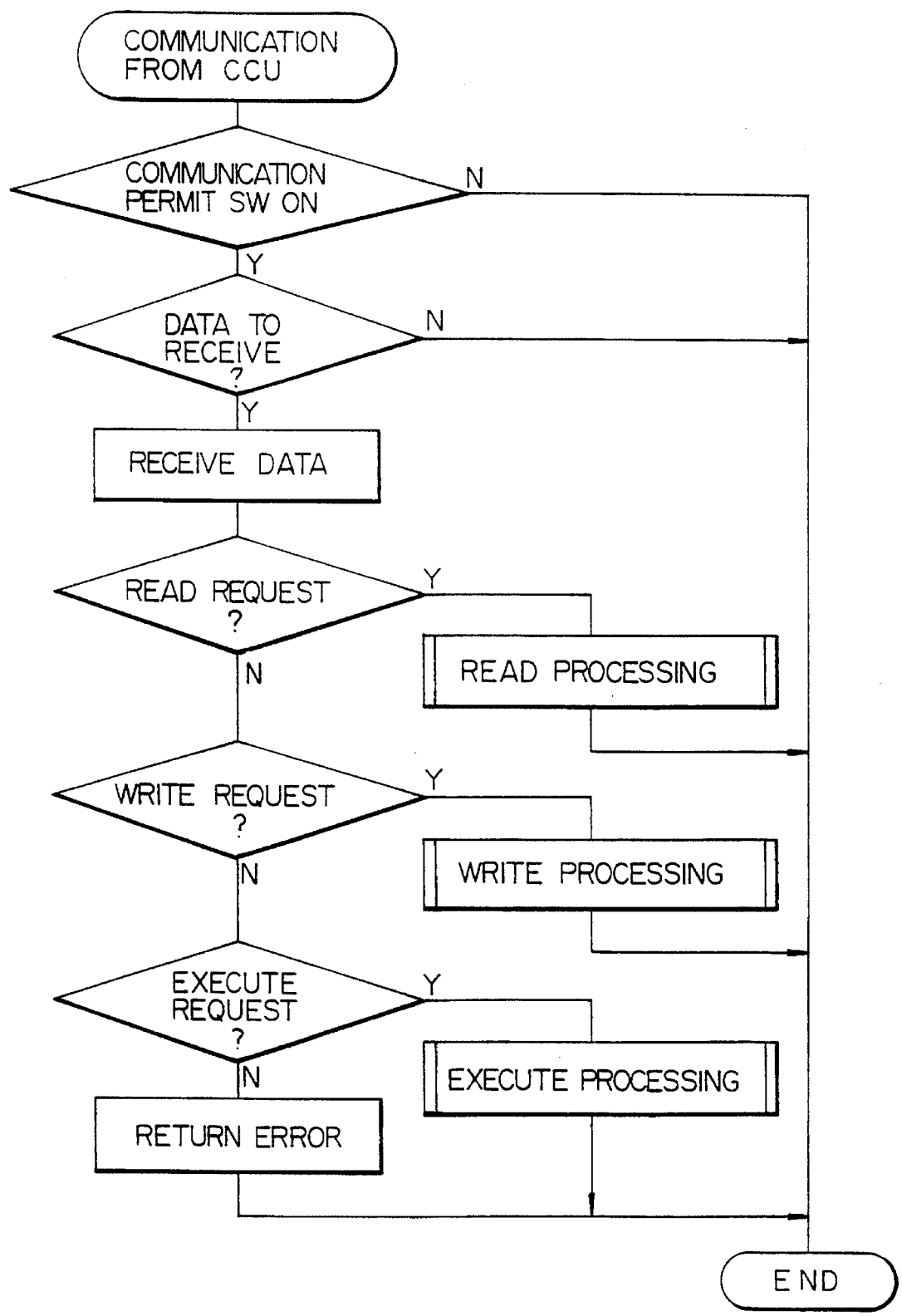
FIG. 77 is a flowchart representative of a main routine which the CPU of the copier executes in response to an access from the communication control unit.

FIG. 77 shows a main routine which the CPU 100 executes when the CCU 18 accesses the copier 1. Assume that data is received by the communication IF unit 103 when the communication permit switch 116, FIG. 61, is in an ON state. Then, the CPU 100 identifies a read request, a write request or an execute request by referencing the head field and then executes a corresponding procedure. When the CPU 100 cannot identify any one of the three different requests, it returns an error code and then ends the processing.

Figure 78:
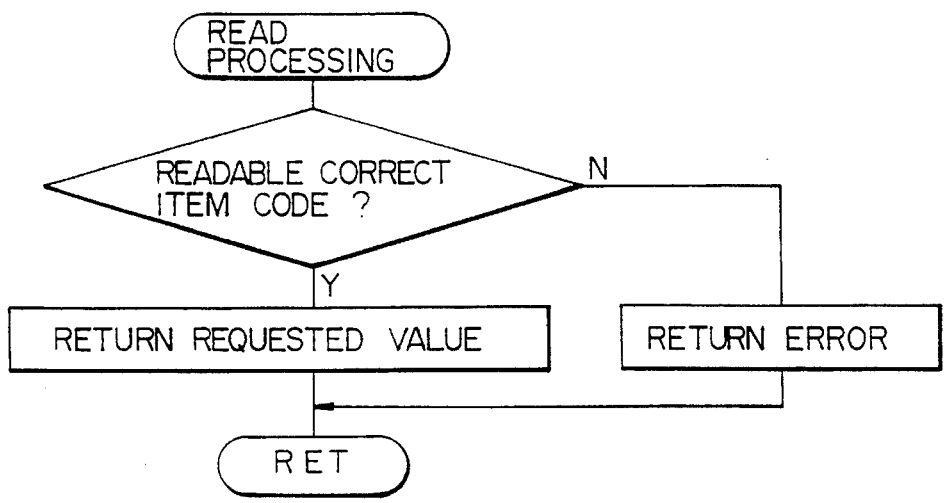

FIG. 78 shows the read processing of FIG. 77 in detail. As shown, if the item code received by the copier 1 is correct and readable, the CPU 100 returns requested data; if otherwise, it returns an error code.

Figure 79:
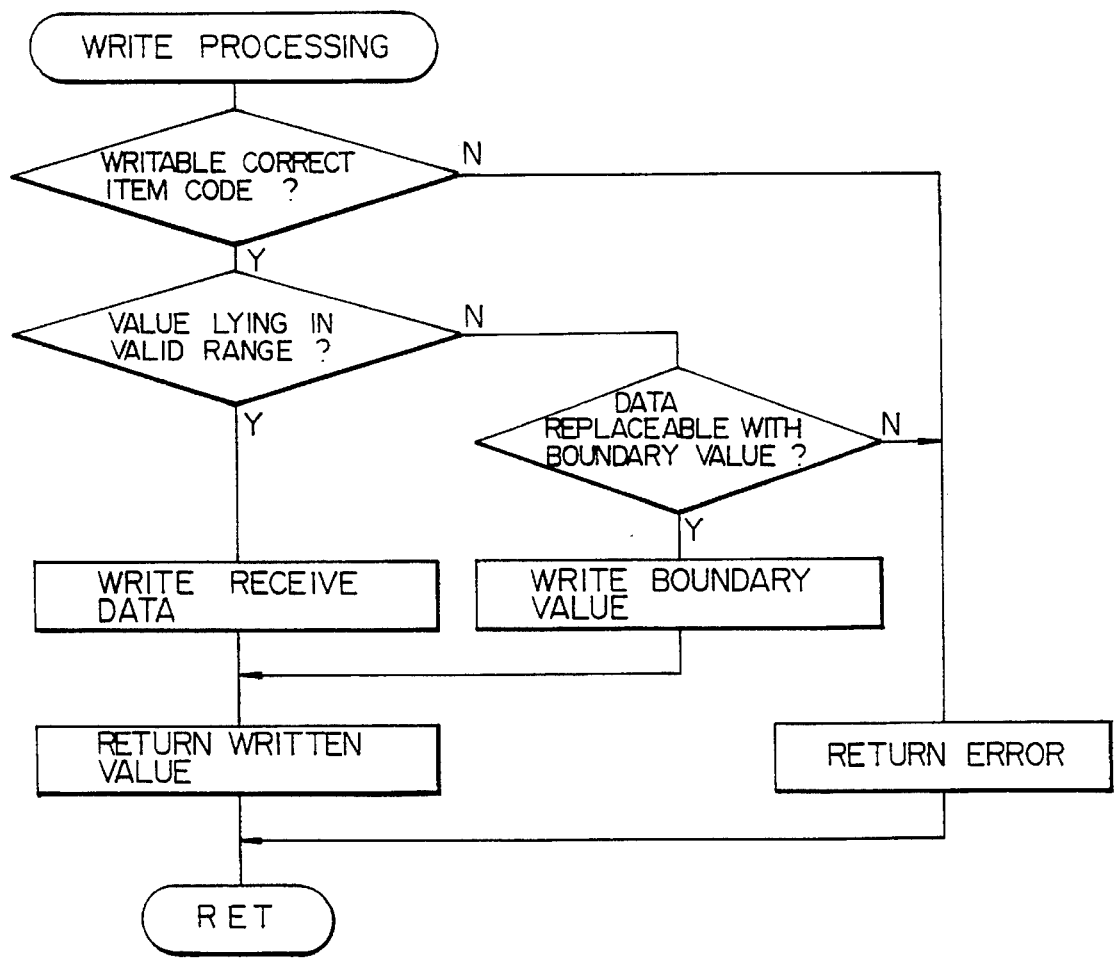

FIG. 79 shows the write processing of FIG. 77 in detail. As shown, if the received item code is not correct or readable, the CPU 100 returns an error code. If the received item code is correct, the CPU 100 checks the value to write and, if it lies in a valid range, directly writes the value of the received data. If the value does not lie in the valid range and if it can be replaced with a boundary value, the CPU 100 writes the boundary value; if otherwise, the CPU 100 sends an error code and then returns. Whether or not the value can be replaced with the boundary value is determined beforehand on an item code basis. Specifically, the fixing temperature and other values which would critically influence when rewritten despite that they lie in the valid range and the telephone number of the service station and other values whose sizes are meaningless are inhibited from being rewritten. On the other hand, the auto-reset time and other items having no influence on image quality are allowed to be replaced with the boundary value for convenience. For example, when it is desired to increase the auto-reset time as far as possible, the copier 1 will automatically select the maximum value only if the maximum allowable auto-reset time is entered.

Figure 80:
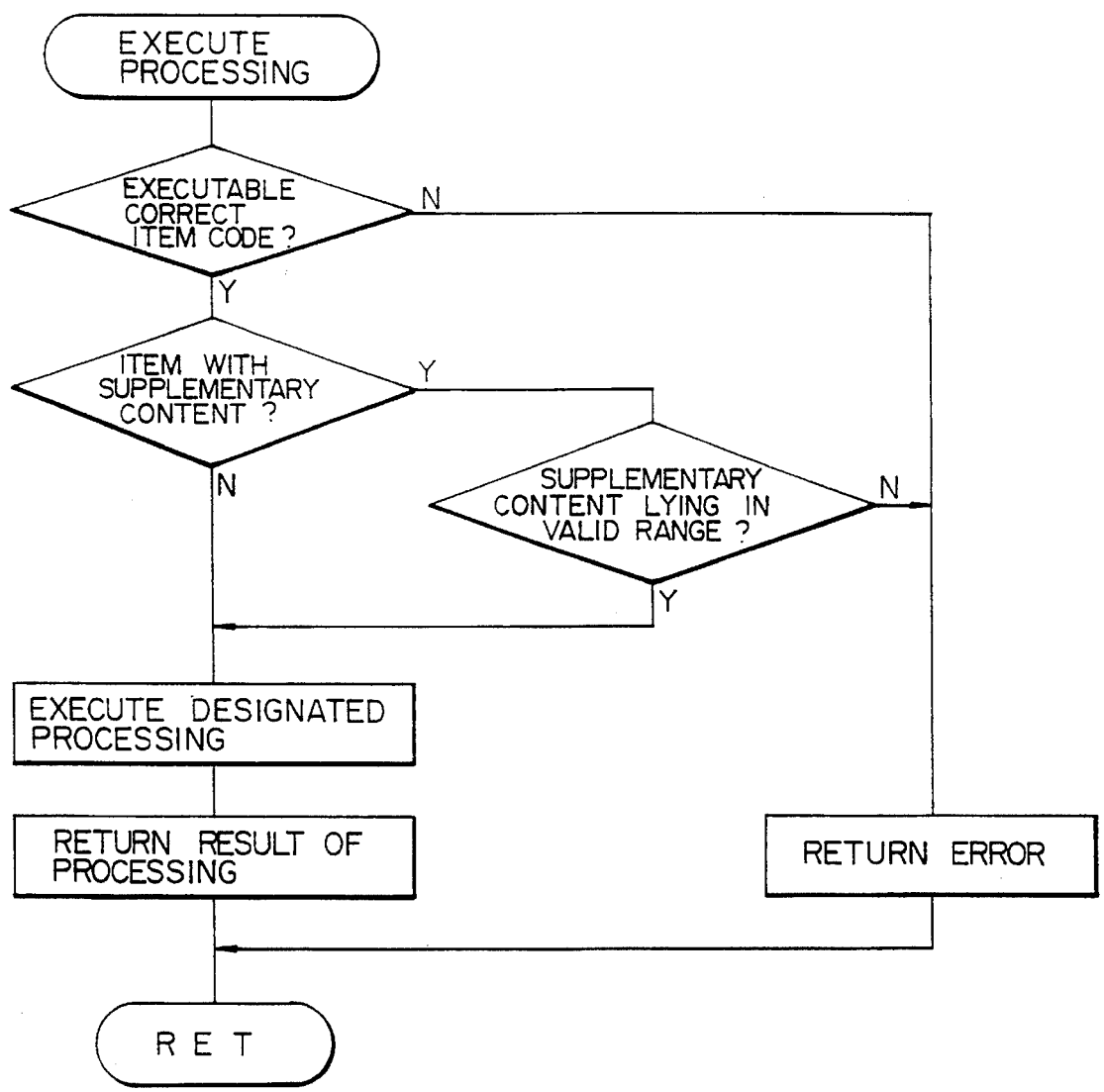

FIG. 80 shows the execute processing of FIG. 77 in detail. As shown, if the received item code is not correct or readable, the CPU 100 sends an error code. If the item is correct and readable, the CPU 100 determines whether or not the item needs a supplementary content and, if the former does not need the latter, executes the designated procedure and then returns the result of operation. If the item of interest needs a supplementary content, the CPU 100 executes a procedure based on the supplementary content. However, if the supplementary content does not lie in the valid range, the CPU 100 sends an error code and then returns.

Hereinafter will be described the communication procedure between the CCU 18 and the copier 1.

Figure 81:
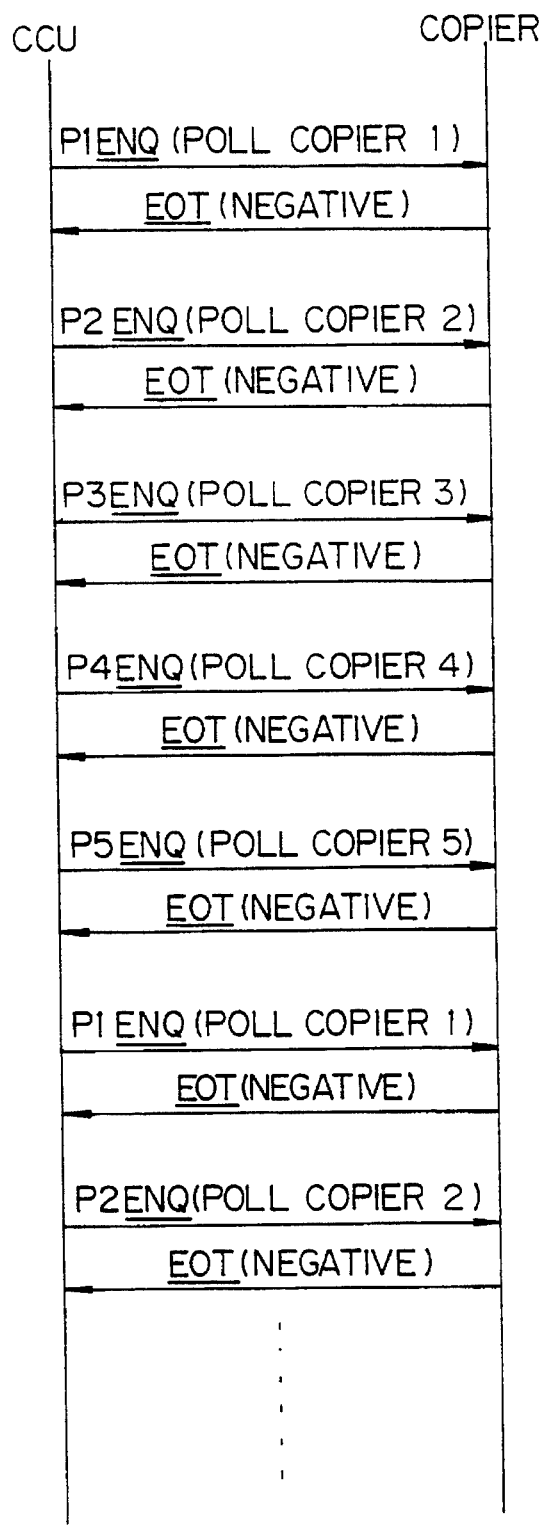
FIG. 81 shows a communication sequence to occur in an idle state when five copiers are connected to the communication control unit.

FIG. 81 demonstrates a communication sequence to occur in an idle state, on assumption that five copiers 1 are connected to the CCU 18. As shown, the CCU 18 executes a polling cycle for sequentially sending a polling sequence by use of the polling address of each copier 1. When polled by the polling address assigned thereto, the copier 1 sends a negative answer to the CCU 18 if a text to send is absent. The CCU 18 repeats this polling cycle under the usual condition which does not need any other communication processing.

Figure 82:
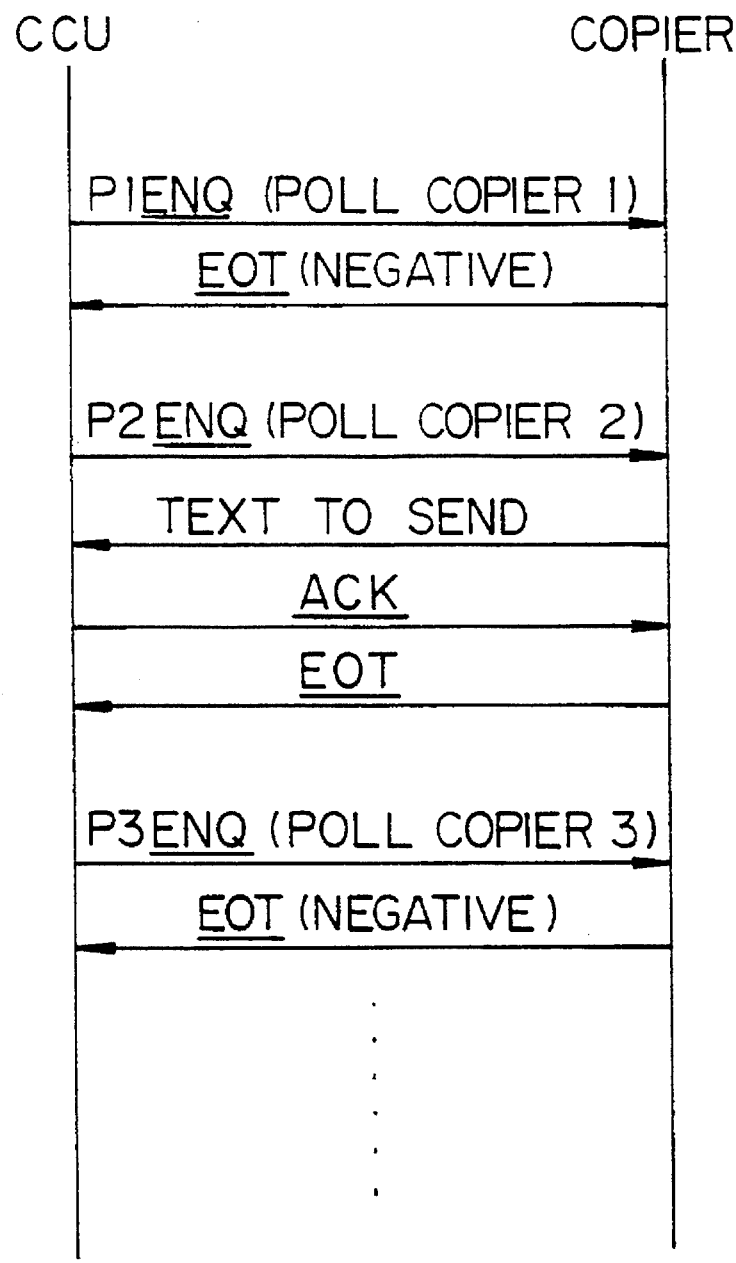
FIG. 82 shows a communication sequence to occur when a text to be transmitted by remote information is present at a copier designated by an address 2.
Figure 83:
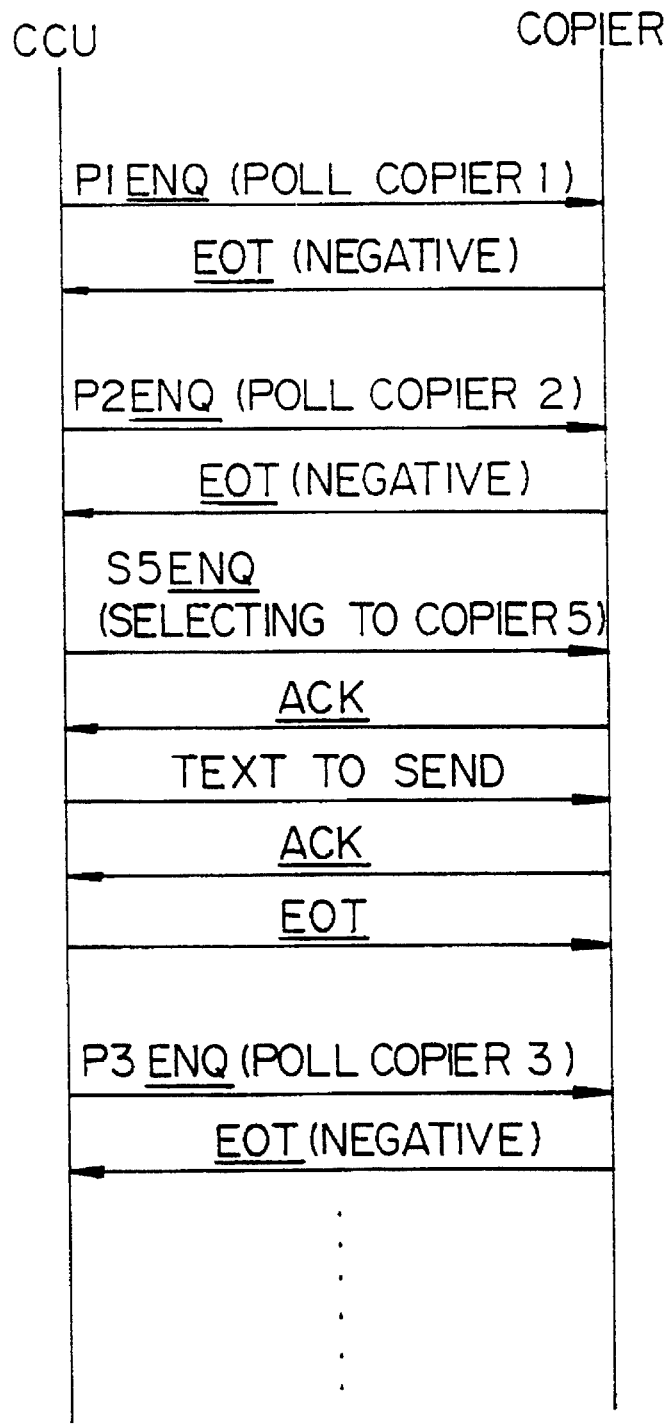
FIG. 83 shows a communication sequence for sending a test representative of the result of information from the communication control unit to a copier designated by an address 5.

FIG. 82 shows a communication sequence to occur when a text to send is present in the copier 1 designated by the address 2. As shown, after polled by the assigned address, the copier 1 sends the text to the RS-485 line. FIG. 83 shows a specific sequence in which the CCU 18 sends a text indicative of the result of communication to the copier 1 designated by the address 5. As shown, after completing the current polling, the CCU 18 sends a selecting sequence and then a text to the copier 1 of interest. Thereafter, the CCU 18 returns to the polling cycle.

Processing of this embodiment which is directly pertinent to the present invention will be described hereinafter.

Figure 84:
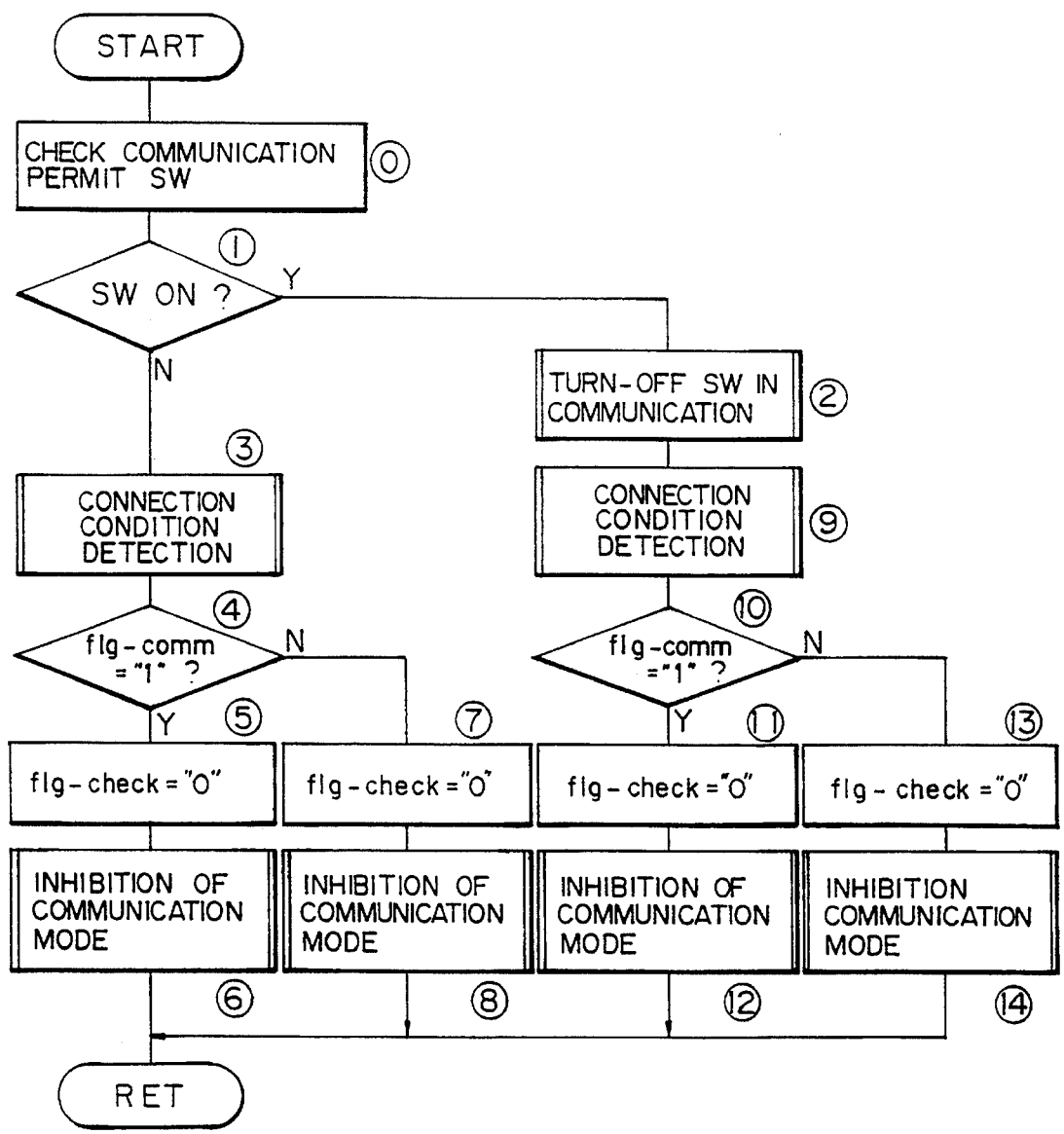
FIG. 84 is a flowchart representative of a communication mode determining procedure to be executed by the CPU of FIG. 61.
Figure 85:
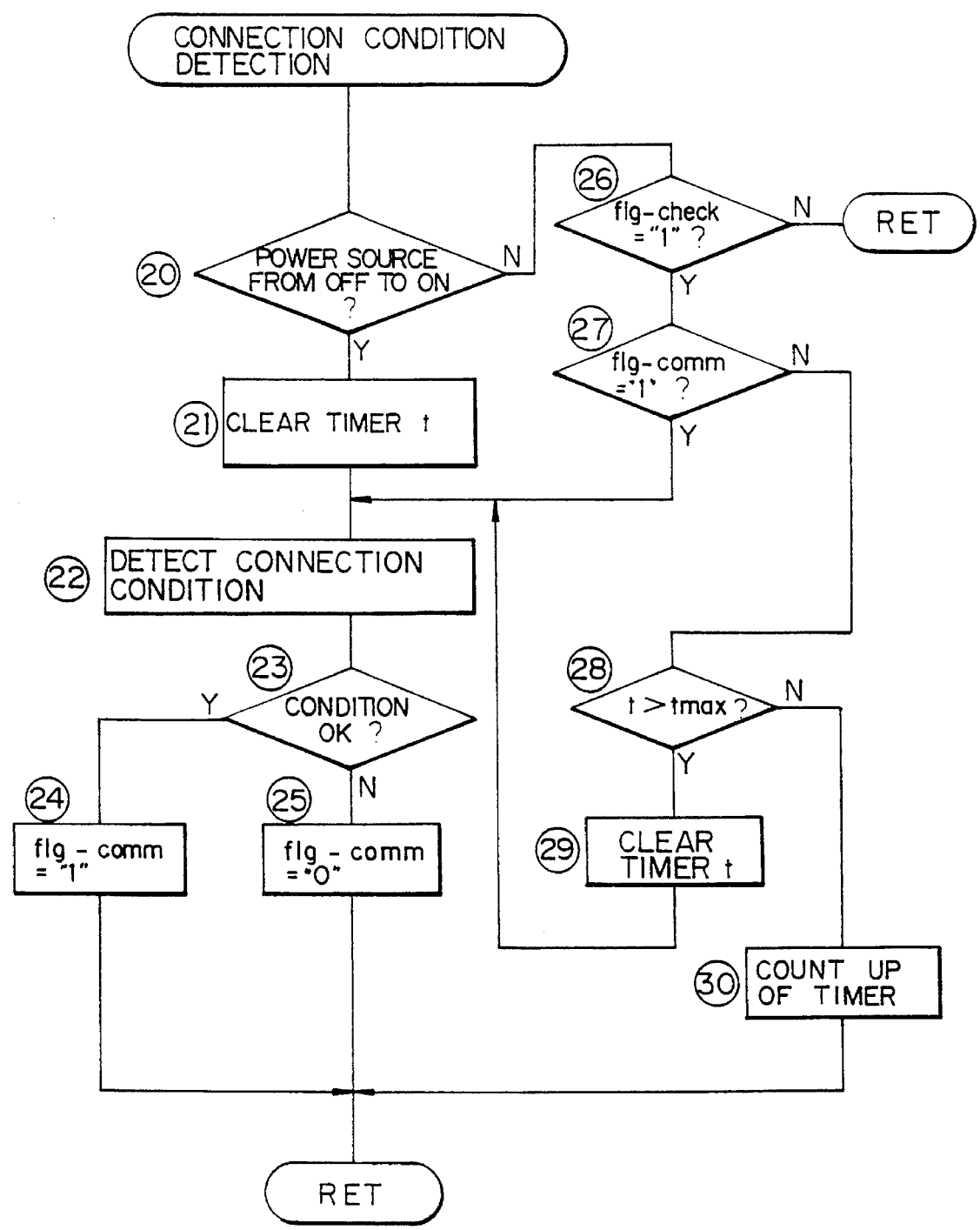
FIG. 85 is a flowchart representative of a connection detection procedure of FIG. 84.
Figure 86:
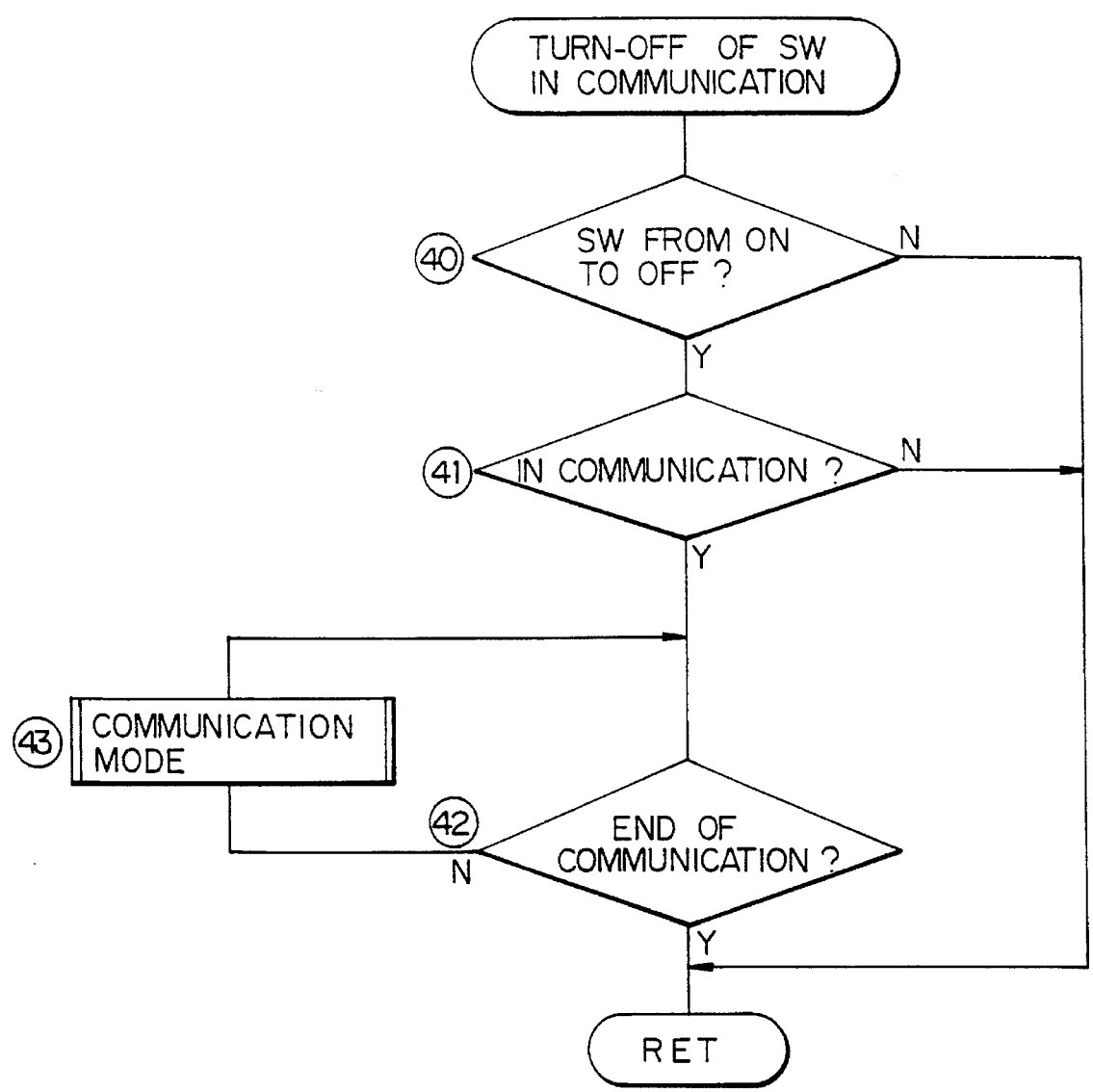
FIG. 86 is a flowchart representative of a switch OFF subroutine of FIG. 84.

FIG. 84 demonstrates a procedure in which the CPU 100 of the copier 1 selects an optimal communication mode on the basis of the connection condition (communicable or uncommunicable) and the ON/OFF state of the communication permit switch 116. FIG. 85 shows a subroutine included in FIG. 84 and associated with the connection condition while FIG. 86 shows a subroutine also included in FIG. 84 and relating to the state of the switch 116.

To begin with, a reference will be made to FIG. 85 for describing the subroutine for determining the connection condition of the copier 1 and CCU 18. It should be noted that the words "connection condition" refer not only to whether or not the line is connected but also to whether or not communication control has been set up and whether or not, even when the line is connected, an error has occurred in the CCU 18. Hence, connection (communicable or uncommunicable) detecting means is implemented by the CPU 100, the program stored in the ROM 101, and so forth. The detecting means determines whether or not the line is connected and, if it is connected, determines whether or not communication control is set up on the basis of the presence/absence of the polling signal from the CCU 18.

As shown in FIG. 85, the CPU 100 determines whether or not the power source has just been switched from an OFF state to an ON state (step 20). If the answer of this decision is positive, Y, the CPU 100 clears a timer t which defines an interval between successive activations of the connection detecting means to "0" (step 21). At the same time, the CPU 100 resets a check flag flg-check for validating or invalidating the connection detecting means to "0". Subsequently, the CPU activates the connection detecting means to determine whether or not the copier 1 is connected to (communicable with) the CCU 18 (step 22). On determining that the former is connected to the latter (Y, step 23), the CPU 100 sets a communication permit flag flg-comm to "1" (step 24); if otherwise (N, step 23), the CPU 100 resets the flag flg-comm to "0" (step 25).

When the power source is turned on as determined in the step 20, the connection detecting means is activated without exception in the steps 22–25. Why this is effected is that the CPU 100 can follow even a change in the connection condition when the power source of the copier 1 is in an OFF state, recognizing the latest connection information with accuracy.

On the other hand, when the power source is not switched from an OFF state to an ON state as determined in the step 20, the CPU 100 determines whether or not the check flag flg-check is set or "1" (step 26). The set/reset state of this flag will be described in relation to the flowchart of FIG. 84. If the flag flg-check is reset or "0", the CPU 100 returns immediately; if it is "1", meaning that the connection detecting means is valid, the CPU 100 executes a step 27 and successive steps. In the step 27, the CPU 100 determines whether or not the communication permit flag flg-comm is set in the step 24 or 25 is "1" to see if the communication between the copier 1 and the CCU 18 is allowed. If the flag flg-comm is "1", the CPU 100 again activates the connection detecting means (step 22) to determine whether or not the copier 1 and CCU 18 are connected. As a result, the condition detecting means is maintained constantly valid and can continuously monitor the connection condition of the copier 1 and CCU 18. The CPU 100, therefore, can see a change from a connected state to a disconnected state by real time detection and execute processing matching the condition immediately and accurately.

On the other hand, when the flag flg-comm is not "1" as determined in the step 27, the CPU 100 determines whether or not the timer t has reached a predetermined time tmax (step 28) even though it does not have to activate the connection detecting means. If the answer of the step S28 is positive, the CPU 100 clears the timer t to "0" and then advances to the step S22; if otherwise, the CPU 100 increments the timer t by 1 and then returns. Specifically, every time the CPU 100 starts on this routine, it increments the timer t by 1, clears the timer t when it reaches the predetermined time tmax to "0", and then activates the connection detecting means in the step S22 to see if the copier 1 and CCU 18 are connected.

As stated above, even when the copier 1 and CCU 18 are not connected, i.e., when communication is not allowed, the CPU 100 does not practically neglect the communication control mode, but it determines whether or not the copier 1 and CCU 18 are connected every predetermined period of time tmax. Hence, when the CCU 18 is recovered from a fault, for example, and connected to the copier 1, the recovery is detected immediately so as to validate the communication state.

Referring to FIG. 61, a procedure for the CPU 100 of the copier 1 to determine a communication mode will be described. To begin with, the communication permit switch 116 shown in the figure will be described. The switch 116 is provided on the copier 1 to selectively permit or inhibit the communication of the copier 1 with the CCU 18. The switch 116 may be implemented by a soft switch provided on a display, not shown, and responsive to a touch or a dip switch or similar hard switch.

Four different communication modes (1)–(4) which will be described are available with the illustrative embodiment, depending on the ON/OFF state of the switch 116 and the connection condition of the CCU 18.

(1) When the switch 116 is OFF and the copier 1 is communicable with the CCU 18 (flg-comm=1), the communication between the copier 1 and the CCU 18 is invalidated or validated and made busy. The connection detecting means is continuously invalidated (flg-check=0). In this condition, despite that the copier 1 and CCU 18 are connected (communicable), the communication can be selectively validated or invalidated by the switch 116. It follows that when, for example, a serviceman a received a serviceman call comes to the user's station for repair and performs a reproduction test of, for example, a serviceman call, a serviceman call signal or similar needless data is prevented from being sent.

(2) When the switch 116 is OFF and the copier 1 is not communicable with the CCU 18 (flg-comm=0), the communication between the copier 1 and the CCU 18 is inhibited to inhibit the communication mode processing. The connection detecting means is continuously invalidated (flg-check=0). In this condition, when the communication mode function itself is not necessary, e.g., when equipment with a communicating function is not installed, the CPU 100 is free from an extra load which would otherwise be posed by the communication mode processing and lower the efficiency.

(3) When the switch 116 is ON and the copier 1 is communicable with the CCU 18 (flg-comm=1), the communication between the copier 1 and the CCU 18 is validated to execute the communication mode processing. The connection detecting means is maintained valid at all times (flg-check=1). As a result, a change in the connection condition (whether or not a communication can be held) of the copier 1 and CCU 18, particularly a change from the connected (communicable) state to the disconnected (uncommunicable) state can be found by real-time detection.

(4) When the switch 116 is ON and the copier 1 is not communicable with the CCU 18 (flg-comm=0), the communication between the copier 1 and the CCU 18 is inhibited to inhibit the communication mode processing. The connection detecting means is maintained valid all times (flg-check=1). As a result, a change in the connection condition of the copier 1 and the CCU 18, particularly a change from the disconnected state after the turn-on of the power source to the connected state (communicable state derived from the connection of the line, turn-on of the power source, recovery from a fault, etc.), can be found by real-time detection. In addition, since the communication between the copier 1 and the CCU 18 is inhibited, the communication mode is invalidated to prevent the mode program for communication installed in the copier 1 from being executed alone. This is successful in reducing the load on the CPU 100 and promoting the efficient operation of the system.

Without the above implementations, there would be brought about the following problems. The copier 1 has a remote informing function using the remote inform key and a remote informing function relating to an error found by self-diagnosis. After receiving remote information, the CCU 18 sends the result of communication thereof with the control device 16 to the copier 1 of interest. This allows the copier 1 to see whether the communication was successful or whether it was unsuccessful due to some error. However, if the communication mode processing is maintained valid at all times, there will be indicated that the end of communication is abnormal in the uncommunicable state. Moreover, since the item of remote diagnosis information can be displayed at all times, it may appear on the screen in an unexpected mode not supported by the operator, confusing the operator.

In the illustrative embodiment, the communication mode processing is selectively allowed or inhibited depending on the connection condition (communicable or uncommunicable) of the copier 1 and CCU 18 and the ON/OFF state of the switch, as stated above. Therefore, the program processing executing the communication processing is isolated from the control of the copier 1, reducing the load on the CPU 100. This not only enhances efficient control but also invalidate the item of remote diagnosis information. As a result, information is prevented from appearing on the screen in a mode not supported by the operator, promoting easy operation.

In FIG. 84, a step 2 corresponds to a case wherein while the copier 1 and CCU 18 are in communication, the communication permit switch 116 is changed from a permit state to an inhibit state. Should only the switch 116 be operated to execute or inhibit the communication mode processing without awaiting the end of communication, it would invalidate the communication and result in a communication error. Specifically, when the switch 116 is ON as determined in a step 1 of FIG. 84, the step 2, i.e., a switch OFF subroutine is executed. Then, as shown in FIG. 86, whether or not the switch 116 has changed from an OFF state to an ON state (edge trigger) is determined (step 40). If the answer of decision is positive, Y, meaning that the switch 116 has been switched on, whether or not the copier 1 and CCU 18 are in communication is determined (step 41). If they are in communication, the communication mode processing should not be inhibited and, therefore, it is continued until the end of communication (e.g. a signal EOF) has been detected (step 43). Thereafter, the program ends the communication mode processing and then returns.

In summary, it will be seen that the present invention provides a control system for an image forming apparatus having various unprecedented advantages, as enumerated below.

(1) When the image forming apparatus is in an inoperative or waiting state, data relating to image formation can be automatically down-loaded from a control device to the apparatus. This reduces the load on a serviceman and eliminates troubles ascribable to erroneous operations.

(2) The down-loading procedure is prevented from being interrupted.

(3) Data relating to image formation and matching a particular type of image forming apparatus can be automatically down-loaded from the control device to the apparatus.

(4) Data can be down-loaded in or a flag can be read out of any one of independent areas each being used for a particular purpose. For example, a program may be written in a nonvolatile RAM to implement automatic version-up. Also, a diagnosis program may be written in a DRAM for effecting automatic diagnosis.

(5) The control device can automatically down-load data even when timepiece means in the form of a weekly timer is not set.

(6) The period of time during which down-loading is not allowed is reduced.

(7) Down-loading can be effected at an adequate timing when the image forming apparatus is in an ON state.

(8) The control device can down-load data to the image forming apparatus by a single access.

(9) Data can be surely down-loaded when the image forming apparatus is ready to rewrite data.

(10) The control device is prevented from down-loading data to the image forming apparatus while the apparatus is automatically adjusting image forming conditions thereof.

(11) Also, the control device is prevented from down-loading data to the image forming apparatus while the apparatus is likely to perform the next image forming operation.

(12) Minimum necessary data can be loaded depending on the condition of the image forming apparatus.

(13) When a person stands by the image forming apparatus and is quite likely to use it, the control device is prevented from down-loading data to the apparatus.

(14) In the event of up-loading data relating to image formation from the image forming apparatus to the control device, the load on the serviceman is reduced while erroneous operations are eliminated.

(15) In the event of up-loading data from the image forming apparatus to the control device, data relating to image formation can be changed.

(16) The control device store data while identifying each image forming apparatus.

(17) When a memory is cleared, data relating to image formation can be automatically down-loaded from the control device to the image forming apparatus to reduce the load on the serviceman.

(18) In the event of down-loading data from the control device to the image forming apparatus, data relating to image formation can be changed.

(19) There is eliminated an occurrence that an adjustment interrupted halfway due to a communication is started all over again. As a result, the waiting time is reduced when a person i s to use the image formation apparatus. Since the automatic adjustment is not interrupted, data representative of adjusted image forming conditions are prevented from being destroyed and, therefore, image quality can be maintained with ease. In addition, since the occupancy rate of a CPU due to interruptions is lowered, the control system is simple.

(20) A person intending to use the image forming apparatus can start on the operation immediately without waiting the end of a communication.

(21) Even when a communication is under way, the image forming apparatus can be used immediately due to the interruption of the communication.

(22) Since data representative of adjusted image forming conditions are not destroyed, safety data communication is enhanced to insure image quality.

(23) The operator of the image forming apparatus can see that the apparatus is in communication although it is normal.

(24) Image forming modes can be surely registered at the image forming apparatus, and the waiting time is reduced.

(25) When a person desires to register image forming modes while a communication is in under way, the person does not have to await the end of the communication.

(26) The system can be efficiently operated depending on whether or not the image forming apparatus and a communication control unit are communicable.

(27) Even when the communicable/uncommunicable state of the image forming apparatus and communication control unit changes while the power source of the apparatus is in an OFF state, adequate and latest data relating to such a state is recognized.

(28) The CPU is free from extra loads ascribable to the increase in the number of functions of the control system and the increase in processing speed for image formation.

(29) When the image forming apparatus and communication control unit change from a communicable state to an uncommunicable state, the change is found by real-time detection. Hence, procedure matching the communicable/uncommunicable state can be executed adequately and rapidly.

(30) When the communication control unit recovers from, for example, a fault and sets up a communicable state, the recovery is detected immediately so as to validate a communication condition.

(31) Assume that the image forming apparatus and communication control unit are not communicable, or that they are not connected by a communication line. Then, a communication permit switch is operated to invalidate a communication mode. This prevents a mode program for communication installed in the image forming apparatus from being executed alone, thereby reducing the load on the CPU.

(32) When the communication mode function itself is not necessary, e.g., when equipment with a communicating function is absent, the CPU of the image forming apparatus is prevented from executing the communication mode. This would otherwise increase the load on the CPU and, therefore, degrade efficiency.

(33) A change in the communicable/uncommunicable state of the image forming apparatus and communication control unit, particularly a change from the communicable state to the uncommunicable state, is found by real-time detection.

(34) Assume that a serviceman received a serviceman call comes to the user's station for repair and performs a reproduction test of, for example, a serviceman call. Then, needless data (e.g. a serviceman call signal) is prevented from being sent by accident.

(35) The image forming apparatus and communication control unit can end a communication in a normal condition even when the communication permit switch is operated while the communication is under way.

Various modifications will become possible for those skilled in the art after receiving the teachings of the present disclosure without departing from the scope thereof.

What is claimed is:

1. In a control system for controlling at least one image forming apparatus connected to a control device by a communication line;

said at least one image forming apparatus comprising first communicating means for communicating with said control device, storing means for storing data relating to image formation, and timepiece means for setting an operative state or an inoperative state of at least part Of said at least one image forming apparatus in terms of time;

said control device comprising second communicating means for communicating with said at least one image forming apparatus, and rewriting means for reading a state of said timepiece means and rewriting data stored in said storing means when said at least part of said at least one image forming apparatus is in the inoperative state, wherein even when said at least part of said at least one image forming apparatus is in the inoperative state, said rewriting means does not rewrite the data when it is determined that said at least part of said at least one image forming apparatus will be brought to an operative state within a predetermined period of time by referencing said timepiece means.

2. A system as claimed in claim 1, wherein said storing means of said at least one image forming apparatus comprises a plurality of storing means, said rewriting means selectively rewriting data stored in any of said plurality of storing means.

3. In a control system for controlling at least one image forming apparatus connected to a control device by a communication line;

said at least one image forming apparatus comprising first communicating means for communicating with said control device, storing means for storing data relating to image formation, and timepiece means for setting an operative state or an inoperative state of at least mart of said at least one image forming apparatus in terms of time;

said control device comprising second communicating means for communicating with said at least one image forming apparatus, and rewriting means for reading a state of said timepiece means and rewriting data stored in said storing means when said at least part of said at least one image forming apparatus is in the inoperative state, wherein when said timepiece means reaches an operation time while said rewriting means is rewriting the data, said at least part of said at least one image forming apparatus is held in the operative state until the rewriting ends.

4. A system as claimed in claim 3, wherein said storing means of said at least one image forming apparatus comprises a plurality of storing means, said rewriting means selectively rewriting data stored in any one of said plurality of storing means.

5. In a control system for controlling at least one image forming apparatus connected to a control device by a communication line;

said at least one image forming apparatus comprising first communicating means for communicating with said control device, storing means for storing data relating to image formation, and waiting means for setting a waiting state when said at least one image forming apparatus is not in operation;

said control device comprising second communicating means for communicating with said at least one image forming apparatus, and rewriting means for rewriting the data stored in said storing means if said at least one image forming apparatus is in the waiting state.

6. A system as claimed in claim 5, wherein said rewriting means does not rewrite the data when determined that said at least one image forming apparatus will be brought from the waiting state to an operative state within a predetermined period of time.

7. A system as claimed in claim 5, wherein when said waiting means reaches an operation time while said rewriting means is rewriting the data, said at least one image forming apparatus is not brought to an operative state until the rewriting ends.

8. An apparatus as claimed in claim 5, wherein said second communicating means of said control device is capable of communicating with a plurality of image forming apparatuses, said rewriting means rewriting the data by identifying each of said plurality of image forming apparatuses on the basis of a condition particular to one of the plurality image forming apparatuses.

9. A system as claimed in claim 5, wherein said storing means of said at least one image forming apparatus comprises a plurality of storing means, said rewriting means selectively rewriting data stored in any of said plurality of storing means.

10. A system as claimed in claim 5, wherein said at least one image forming apparatus further comprises timepiece means for setting an operative state or an inoperative state of at least part of said at least one image forming apparatus in terms of time, said rewriting means rewriting the data when said timepiece means is indicative of said inoperative state and when said waiting means has set the waiting state even if said timepiece means is indicative of said operative state.

11. A system as claimed in claim 10, wherein said rewriting means rewrites the data in matching relation to a content of rewriting data.

12. A system as claimed in claim 5, wherein said control device further comprises deciding means for determining whether or not said at least one image forming apparatus is in a powered state, said rewriting means, rewriting, when said deciding means determines that said at least one image forming apparatus is in said powered state, the data after said waiting means has set the waiting state.

13. A system as claimed in claim 12, further comprising a communication control unit interposed between said at least one image forming apparatus and said control device for temporarily storing data relating to image formation when said at least one image forming apparatus is not in the powered state.

14. A system as claimed in claim 13, wherein when said at least one image forming apparatus is not in the powered state, said communication control unit sends the temporarily stored data relating to image formation after the waiting state has been set up.

15. A system according to claim 5, wherein said at least one image forming apparatus is unable to operate when a jam is detected.

16. A system according to claim 5, wherein said at least one image forming apparatus is unable to operate when an error is detected.

17. In a control system for controlling at least one image forming apparatus connected to a control device by a communication line;
said at least one image forming apparatus comprising communication means for communicating with said control device, first storing means for storing data relating to image formation, deciding means for determining a state of said at least one image forming apparatus and control means for controlling said first storing means on the basis of a result of a decision made by said deciding means;
said control device comprising second communicating means for communicating with said at least one image forming apparatus, second storing means for storing data relating to image formation, and transmitting means for sending the data stored in said second storing means to said at least one image forming apparatus via said second communicating means; and wherein when data cannot be written in said first storing means, the transmission of data from the control device toward the at least one image forming apparatus is effected, with the writing of the data being controlled at the at least one image forming apparatus.

18. A system as claimed in claim 17, wherein said deciding means determines whether or not said at least one image forming apparatus is in an inoperative state and, when said at least one image forming apparatus is in said inoperative state, said control means write the data out of said second storing means in said first storing means.

19. A system as claimed in claim 18, wherein said at least one image forming apparatus further comprises timepiece means for setting an operative state or an inoperative state of at least part of said at least one image forming apparatus in terms of time, said deciding means determines whether or not said at least one image forming apparatus is in said inoperative state by reading a condition of said timepiece means.

20. A system as claimed in claim 17, wherein said deciding means determines whether or not an automatic adjustment of image forming condition is under way in said at least one image forming apparatus and, if an automatic adjustment is under way, said data read out of said second storing means is inhibited from being written in said first storing means.

21. A system as claimed in claim 17, wherein said deciding means determines whether or not a predetermined period of time has elapsed after an image forming operation of said at least one image forming apparatus and, if said predetermined period of time has not elapsed, said data read out of said second storing means is inhibited from being written in said first storing means.

22. A system as claimed in claim 17 wherein said at least one image forming apparatus further comprises image forming mode setting means, and wherein said data read out of said second storing means is inhibited from being written in said first storing means on detecting an operation of said imaging forming mode setting means.

23. A system as claimed in claim 17, wherein said control device selects, among the data stored in said second storing means and relating to image formation, data to be sent to said at least one image forming apparatus via said second communicating means on the basis of a result of decision made by said deciding means.

24. A control system for controlling at least one image forming apparatus connected to a control device by a communication line, said control system comprising:
a first communicator provided in said at least one image forming apparatus for communicating with said control device;
a first memory for storing data relating to image forming, data being transmitted and received via said first communicator between said first memory and said control device;
a second communicator provided in said control device for communicating with said at least one image forming apparatus;
a second memory for storing data relating to image formation, data being transmitted and received via said second communicator between said second memory and said at least one image forming apparatus;
a determiner for determining a state of said at least one image forming apparatus; and
control means for controlling reading and writing operation of said data of said first memory in response to said data read out of said second memory in accordance with said state of said at least one image forming apparatus determined by said determiner, and wherein when data cannot be written in said first memory, the transmission of data from the control device toward the at least one image forming apparatus is effected, with the writing of the data being controlled at the at least one image forming apparatus.

25. A control System for controlling at least one image forming apparatus connected to a control device by a communication line, said control system comprising:
a first communicator provided in said at least one image forming apparatus for communicating with said control device;
a first memory for storing data relating to image forming, data being transmitted and received via said first communicator between said first memory and said control device;

a second communicator provided in said control device for communicating with said at least one image forming apparatus;

a second memory for storing data relating to image formation, data being transmitted and received via said second communicator between said second memory and said at least one image forming apparatus;

a determiner for determining a state of said at least one image forming apparatus; and control means for controlling reading and writing operation of said data of said first memory in response to said data read out of said second memory in accordance with said state of said at least one image forming apparatus determined by said determiner, said system further comprising a communication permit switch for allowing said at least one image forming apparatus to communicate with said control means.

26. A system as claimed in any one of claim 24 or 25, wherein said determiner determines whether or not said at least one image forming apparatus is in an inoperative state and, when said at least one image forming apparatus is in said inoperative state, said control means writes said data read out of said second memory in said first memory.

27. A system as claimed in any one of claim 24 or 25, further comprising timepiece means provided in said at least one image forming apparatus for setting an operative state or an inoperative state of at least part of said at least one image forming apparatus in terms of time, wherein said determiner determines whether or not said at least one image forming apparatus is in said inoperative state by reading a condition of said timepiece means.

28. A system as claimed in any one of claim 24 or 25, wherein said determiner determines whether or not an automatic adjustment of image forming conditions is under way in said at least one image forming apparatus and, if an automatic adjustment is under way, said data read out of said second memory is inhibited from being written in said first memory.

29. A system as claimed in any one of claim 24 or 25, wherein said determiner determines whether or not a predetermined period of time has elapsed after an image forming operation of said at least one image forming apparatus and, if said predetermined period of time has not elapsed, said data read out of said second memory is inhibited from being written in said first memory.

30. A system as claimed in any one of claim 24 or 25, further comprising image forming mode setting means provided in said at least one image forming apparatus, wherein said data read out of said second memory is inhibited from being written in said first memory on detecting an operation of said image forming mode setting means.

31. A system as claimed in any one of claim 24 or 25, further comprising an object sensor for sensing an object present at a side where said at least one image forming apparatus is to be manipulated and an inhibitor for inhibiting said second memory form operating when said object sensor senses an object.

32. A system as claimed in any one of claim 24 or 25, wherein said control means reads the data out of said first memory to determine whether or not said at least one image forming apparatus has just been delivered to a user's station and causing, when said at least one image forming apparatus has just been delivered, said second memory to store said data read out of said first memory.

33. In a control system for controlling at least one image forming apparatus connected to a control device by a communication line, said control device comprising:

first storing means for storing data relating to image formation;

transferring means for transferring the data stored in said first storing means; and first communicating means for receiving the data from said transferring means and sending said data to said at least one image forming apparatus;

said at least one image forming apparatus comprising:

second storing means for storing the data relating to image formation;

second communicating means for receiving the data sent from said control device;

control means for transferring the data received by said second communicating means to said second storing means, and controlling writing of said data in said second storing means; and outputting means for outputting a state signal representing a state of said at least one image forming apparatus;

said control means controlling writing of the data in said second storing means in accordance with said state signal output from said outputting means, and wherein when data cannot be written in said second storing means, the transmission of data from the control device toward the at least one image forming apparatus is effected, with the writing of the data being controlled at the at least one image forming apparatus.

34. In a control system for controlling at least one image forming apparatus connected to a control device by a communication line, said control device comprising:

first storing means for storing data relating to image formation;

transferring means for transferring the data stored in said first storing means; and first communicating means for receiving the data from said transferring means and sending said data to said at least one image forming apparatus;

said at least one image forming apparatus comprising:

second storing means for storing the data relating to image formation;

second communicating means for receiving the data sent from said control device;

control means for transferring the data received by said second communicating means to said second storing means, and controlling writing of said data in said second storing means; and outputting means for outputting a state signal representing a state of said at least one image forming apparatus;

said control means controlling writing of the data in said second storing means in accordance with said state signal output from said outputting means, wherein said first storing means stores a plurality of kinds of data relating to image formation, said control means controlling writing of said data in said second storing means on the basis of said state signal and said data.

35. A system as claimed in claim 34, wherein said control means selectively inhibits or allows writing of the data in said second storing means.

36. A system as claimed in claim 34, wherein said outputting means outputs said state signal by reading a flag matching the state of said at least one image forming apparatus stored in said second storing means.

37. A system as claimed in claim 34, wherein said first storing means stores a plurality of kinds of data relating to image formation, said control means determining a kind of the data to be written to said second storing means in accordance with said state signal.

38. A method of controlling at least one image forming apparatus connected to a control device by a communication line, comprising the steps of:

reading data relating to image formation out of first storing means;

transferring the data read out of said first storing means to communicating means;

receiving the data from said communicating means and sending said data to said at least one image forming apparatus via said communication line;

receiving the data by second communicating means;

transferring the data from said second communicating means to second storing means; and controlling writing of the data in said second storing means in accordance with a state signal representing a state of said at least one image forming apparatus and output from outputting means, and wherein when data cannot be written in said second storing means, the transmission of data from the control device toward the at least one image forming apparatus is effected, with the writing of the data being controlled at the at least one image forming apparatus.

39. A method of controlling at least one image forming apparatus connected to a control device by a communication line, comprising the steps of:

reading data relating to image formation out of first storing means;

transferring the data read out of said first storing means to communicating means;

receiving the data from said communicating means and sending said data to said at least one image forming apparatus via said communication line;

receiving the data by second communicating means;

transferring the data from said second communicating means to second storing means; and controlling writing of the data in said second storing means in accordance with a state signal representing a state of said at least one image forming apparatus and output from outputting means, wherein said first storing means stores a plurality of kinds of data relating to image formation, said method further comprising the step of controlling writing of the data in said second storing means on the basis of said state signal and said data.

40. A method as claimed in claim 39, further comprising the step of selectively inhibiting or allowing writing of data in said second storing means.

41. A control system for controlling at least one image forming apparatus connected to a control device by a communication line, said system comprising:

first communicating means included in said at least one image forming apparatus and for communicating with said control device;

first storing means included in said at least one image forming apparatus and for storing data relating to image formation of said at least one image forming apparatus;

setting means for setting, when said at least one image forming apparatus is not in operation, said at least one apparatus to a predetermined state;

second communicating means included in said control device and for communicating with said at least one image forming apparatus;

second storing means included in said control device and for storing data relating to image formation; and writing means for writing, when said at least one image forming apparatus is in said predetermined state, the data stored in said second storing means in said first storing means.

42. A control system for controlling at least one image forming apparatus connected to a control device by a communication line, said system comprising:

first communicating means included in said at least one image forming apparatus and for communicating with said control device;

first storing means included in said at least one image forming apparatus and for storing data relating to image formation of said at least one image forming apparatus;

setting means for setting, when said at least one image forming apparatus is not in operation, said at least one apparatus to a predetermined state;

second communicating means included in said control device and for communicating with said at least one image forming apparatus;

second storing means included in said control device and for storing data relating to image formation; and writing means for writing, when said at least one image forming apparatus is in said predetermined state, the data stored in said second storing means in said first storing means, wherein said inoperable state is a jam detection state.

43. A control system for controlling at least one image forming apparatus connected to a control device by a communication line, said system comprising:

first communicating means included in said at least one image forming apparatus and for communicating with said control device;

first storing means included in said at least one image forming apparatus and for storing data relating to image formation of said at least one image forming apparatus;

setting means for setting, when said at least one image forming apparatus is not in operation, said at least one apparatus to a predetermined state;

second communicating means included in said control device and for communicating with said at least one image forming apparatus;

second storing means included in said control device and for storing data relating to image formation; and writing means for writing, when said at least one image forming apparatus is in said predetermined state, the data stored in said second storing means in said first storing means, wherein said inoperable state is a fault detection state.

44. A method of controlling at least one image forming apparatus connected to a control device by a communication line, comprising the steps of:

reading data relating to image formation out of first storing means;

transferring the data read out of said first storing means to communicating means;

receiving the data from said communicating means and sending said data to said at least one image forming apparatus via said communication line;

receiving the data from said communication line by second communicating means;

transferring the data from said second communicating means to second storing means; and executing writing of the data in said second storing means when said at least one image forming apparatus is in an inoperable state.

45. A control system for controlling at least one image forming apparatus connected to a control device by a communication line, said system comprising:

first communicating means included in said at least one image forming apparatus and for communicating with said control device;

first storing means included in said at least one image forming apparatus and for storing data relating to image formation of said at least one image forming apparatus;

setting means for setting, when said at least one image forming apparatus is not in operation, said at least one apparatus to a predetermined state;

second communicating means included in said control device and for communicating with said at least one image forming apparatus;

second storing means included in said control device and for storing data relating to image formation; and writing means for writing, when said at least one image forming apparatus is in said predetermined state, the data stored in said second storing means in said first storing means, wherein said inoperable state is a jam detection state.

46. A control system for controlling at least one image forming apparatus connected to a control device by a communication line, said system comprising:

first communicating means included in said at least one image forming apparatus and for communicating with said control device;

first storing means included in said at least one image forming apparatus and for storing data relating to image formation of said at least one image forming apparatus;

setting means for setting, when said at least one image forming apparatus is not in operation said at least one apparatus to a predetermined state;

second communicating means included in said control device and for communicating with said at least one image forming apparatus;

second storing means included in said control device and for storing data relating to image formations; and writing means for writing, when said at least one image forming apparatus is in said predetermined state, the data stored in said second storing means in said first storing means, wherein said inoperable state is a fault detection state.

47. In a control system for controlling at least one image forming apparatus connected to a control device by a communication line, said control device comprising:

first storing means for storing data relating to image formation;

transferring means for transferring the data stored in said first storing means; and first communicating means for receiving the data from said transferring means and sending said data to said at least one image forming apparatus;

said at least one image forming apparatus comprising:

second storing means for storing the data relating to image formation;

second communicating means for receiving the data sent from said control device;

control means for transferring the data received by said second communicating means to said second storing means, and controlling writing of said data in said second storing means; and outputting means for outputting a state signal representing a state of said at least one image forming apparatus;

said control means controlling writing of the data in said second storing means in accordance with said state signal output from said outputting means, wherein said first storing means stores a plurality of kinds of data relating to image formation, said control means determining a kind of the data to be written to said second storing means in accordance with said state signal.

48. In a control system for controlling at least one image forming apparatus connected to a control device by a communication line;

said at least one image forming apparatus comprising first communicating means for communicating with said control device, storing means for storing data relating to image formation, and means for determining a status of said at least one image image forming apparatus and providing a status output;

said control device comprising second communicating means for communicating with said at least one image forming apparatus, and mode selecting means for selectively enabling at least one of a plurality of modes as a function of said status output of said at least one image forming apparatus.

* * * * *